(12) United States Patent
Wang et al.

(10) Patent No.: US 12,740,252 B2
(45) Date of Patent: Sep. 15, 2026

(54) DISPLAY SUBSTRATE AND DISPLAY APPARATUS INCLUDING MULTI-PORTION FUNCTIONAL MATERIAL LAYERS

(71) Applicant: BOE Technology Group Co., Ltd., Beijing (CN)

(72) Inventors: Chaolu Wang, Beijing (CN); Yongfeng Zhang, Beijing (CN); Renquan Gu, Beijing (CN); Feng Guan, Beijing (CN); Meng Zhao, Beijing (CN); Yang Lv, Beijing (CN); Jianhua Du, Beijing (CN); Hao Wu, Beijing (CN); Rui Yan, Beijing (CN); Wenqing Xue, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 395 days.

(21) Appl. No.: 18/546,119

(22) PCT Filed: Nov. 29, 2022

(86) PCT No.: PCT/CN2022/135106

§ 371 (c)(1),
(2) Date: Aug. 11, 2023

(87) PCT Pub. No.: WO2024/113177

PCT Pub. Date: Jun. 6, 2024

(65) Prior Publication Data

US 2025/0017046 A1 Jan. 9, 2025

(51) Int. Cl.
*H10K 59/12* (2023.01)
*H10K 50/17* (2023.01)
(Continued)

(52) U.S. Cl.
CPC ......... *H10K 59/122* (2023.02); *H10K 50/171* (2023.02); *H10K 59/1201* (2023.02);
(Continued)

(58) Field of Classification Search
CPC ................ H10K 59/122; H10K 59/35; H10K 59/80515; H10K 59/873; H10K 59/8051;
(Continued)

(56) References Cited

U.S. PATENT DOCUMENTS 9,012,897 B2 * 4/2015 Harada .................. H10K 50/17 257/40
2011/0074272 A1 * 3/2011 Sakamoto ........... H10K 59/876 313/113

(Continued)

FOREIGN PATENT DOCUMENTS

CN 103730346 A 4/2014
CN 106229418 A * 12/2016 ........... H10K 50/115

(Continued)

OTHER PUBLICATIONS

International Search Report & Written Opinion mailed Jun. 23, 2023, regarding PCT/CN2022/135106.

*Primary Examiner* — Ida M Soward
(74) *Attorney, Agent, or Firm* — Intellectual Valley Law, P.C.

(57) ABSTRACT

A display substrate is provided. The display substrate includes a plurality of functional material layers extending at least partially across multiple subpixels. The plurality of functional material layers include a first portion in an inter-subpixel region, and a second portion in subpixel regions. The first portion includes a doped impurity. The first portion and the second portion include at least one functional material in common. A weight percentage of the doped impurity in the first portion is higher than a weight (Continued)

percentage of the doped impurity in the second portion. The first portion spaces apart adjacent subpixels. The second portion includes a light emitting layer of a respective subpixel.

17 Claims, 35 Drawing Sheets

(51) Int. Cl.
*H10K 59/122* (2023.01)
*H10K 59/35* (2023.01)
*H10K 59/80* (2023.01)

(52) U.S. Cl.
CPC ....... *H10K 59/35* (2023.02); *H10K 59/80515* (2023.02); *H10K 59/873* (2023.02)

(58) Field of Classification Search
CPC ... H10K 50/171; H10K 50/155; H10K 50/165
See application file for complete search history.

(56) References Cited

U.S. PATENT DOCUMENTS

2012/0146062 A1* 6/2012 Oda .................... H10K 59/35 257/E33.044
2012/0187394 A1* 7/2012 Hatano ................ H01G 9/2068 257/E31.127
2014/0312339 A1* 10/2014 Fujita .................... H10K 59/35 257/40
2014/0335639 A1* 11/2014 Takashige ............. H10K 71/15 438/46
2016/0013317 A1 1/2016 Zhao et al.
2018/0061896 A1* 3/2018 Cheng ................. H10K 59/122
2019/0372048 A1 12/2019 Cheng et al.
2019/0386088 A1* 12/2019 Xu ...................... H10K 77/111
2022/0013724 A1* 1/2022 Tseng .................. H10K 71/135
2022/0077264 A1 3/2022 Xue et al.
2022/0267668 A1* 8/2022 Ishisone ................ C09K 11/06
2022/0293702 A1 9/2022 Du et al.

FOREIGN PATENT DOCUMENTS

CN 109585662 A 4/2019
CN 211428170 A 9/2020
CN 114242853 A 3/2022
CN 114429979 A 5/2022
JP 2021111494 A 8/2021

* cited by examiner

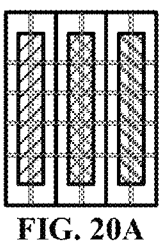
FIG. 20A
SR
FIG. 20B
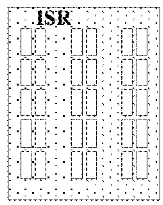
FIG. 20C
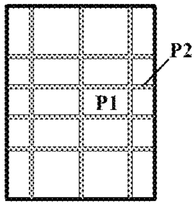
FIG. 20D
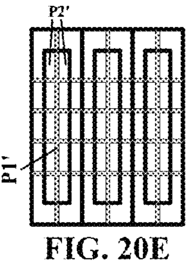
FIG. 20E IAML
TS
FIG. 21A
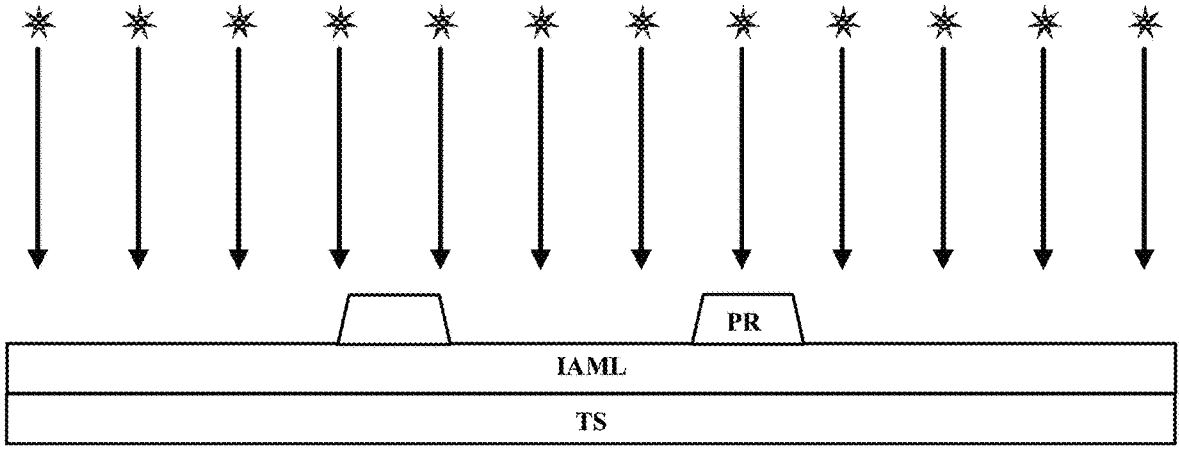
FIG. 21B
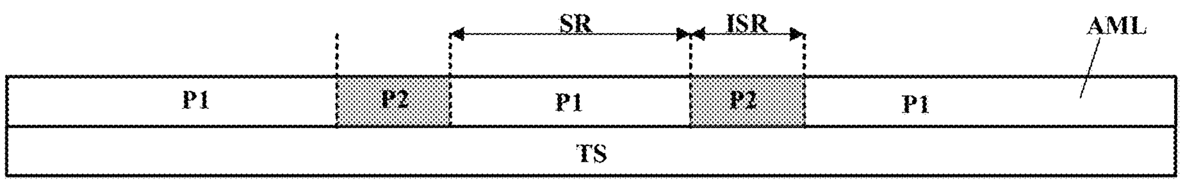
FIG. 21C

DISPLAY SUBSTRATE AND DISPLAY APPARATUS INCLUDING MULTI-PORTION FUNCTIONAL MATERIAL LAYERS

CROSS-REFERENCE TO RELATED APPLICATION

This application is a national stage application under 35 U.S.C. § 371 of International Application No. PCT/CN2022/135106, filed Nov. 29, 2022, the contents of which are incorporated by reference in the entirety.

TECHNICAL FIELD

The present invention relates to display technology, more particularly, to a display substrate, a display apparatus, and a method of fabricating a display substrate.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides a display substrate, comprising a plurality of functional material layers extending at least partially across multiple subpixels; wherein the plurality of functional material layers comprise a first portion in an inter-subpixel region, and a second portion in subpixel regions; the first portion comprises a doped impurity; the first portion and the second portion comprise at least one functional material in common; a weight percentage of the doped impurity in the first portion is higher than a weight percentage of the doped impurity in the second portion; the first portion spaces apart adjacent subpixels; and the second portion comprises a light emitting layer of a respective subpixel.

Optionally, a weight ratio of the doped impurity to the at least one functional material in common in the first portion is higher than a weight ratio of the doped impurity to the at least one functional material in common in the second portion.

Optionally, a weight ratio of the doped impurity to the at least one functional material in common in the second portion in at least one of a hole transport layer, a hole injection layer, an electron transport layer, or an electron injection layer is substantially zero.

Optionally, the display substrate further comprises an anode material layer extending at least partially across multiple subpixels; the anode material layer comprises a first anode portion at least partially in the subpixel regions and a second anode portion at least partially in the inter-subpixel region; the first anode portion comprises a doped anode impurity; the first anode portion and the second anode portion comprise at least one material in common; a weight percentage of the doped anode impurity in the first anode portion is higher than a weight percentage of the doped anode impurity in the second portion; a weight ratio of the doped anode impurity to the at least one material in common in the first anode portion is higher than a weight ratio of the doped anode impurity to the at least one material in common in the second anode portion; the second anode portion spaces apart adjacent subpixels; and the first anode portion comprises an anode of the respective subpixel.

Optionally, the weight ratio of the doped anode impurity to the at least one material in common in the second anode portion is substantially zero.

Optionally, the first anode portion and the second anode portion comprise at least a semiconductor material in common; the first anode portion has a higher conductivity than a conductivity of the second anode portion; and a difference between a highest occupied molecular orbital level of the second anode portion and a highest occupied molecular orbital level of a functional material layer in direct contact with the second anode portion is greater than a difference between a highest occupied molecular orbital level of the first anode portion and a highest occupied molecular orbital level of the functional material layer in direct contact with the first anode portion.

Optionally, the first anode portion and the second anode portion comprise at least a metal oxide material in common.

Optionally, an orthographic projection of the second anode portion on a base substrate at least partially overlaps with an orthographic projection of the first portion on the base substrate; and an orthographic projection of the first anode portion on the base substrate at least partially overlaps with an orthographic projection of the second portion on the base substrate.

Optionally, the doped impurity or the doped anode impurity comprises at least one of boron, fluorine, argon, phosphorus, hydrogen, helium, neon, nitrogen, arsenic, antimony, aluminum, magnesium, or silicon.

Optionally, the display substrate further comprises a pixel definition layer; wherein the pixel definition layer comprises a plurality of inter-pixel functional material layers doped with impurities; and the plurality of inter-pixel functional material layers in the pixel definition layer are incapable of emitting light.

Optionally, the plurality of functional material layers comprises a stacked structure comprising a light emitting layer, a hole transport layer, a hole injection layer, an electron transport layer, and an electron injection layer; and each of the light emitting layer, the hole transport layer, the hole injection layer, the electron transport layer, and the electron injection layer comprises a portion having the doped impurity.

Optionally, the display substrate comprises a plurality of first functional material layers extending at least partially across multiple subpixels of a first color, a plurality of second functional material layers extending at least partially across multiple subpixels of a second color, and a plurality of third functional material layers extending at least partially across multiple subpixels of a third color; wherein the plurality of first functional material layers comprises a first stacked structure comprising a light emitting layer of a first color, a hole transport layer, a hole injection layer, an electron transport layer, and an electron injection layer; each of the light emitting layer of the first color, the hole transport layer, the hole injection layer, the electron transport layer, and the electron injection layer comprises a portion having the doped impurity; the plurality of second functional material layers comprises a second stacked structure comprising a light emitting layer of a second color, a hole transport layer, a hole injection layer, an electron transport layer, and an electron injection layer; each of the light emitting layer of the second color, the hole transport layer, the hole injection layer, the electron transport layer, and the electron injection layer comprises a portion having the doped impurity; the plurality of second functional material layers comprises a third stacked structure comprising a light emitting layer of a third color, a hole transport layer, a hole injection layer, an electron transport layer, and an electron injection layer; and each of the light emitting layer of the third color, the hole transport layer, the hole injection layer, the electron transport layer, and the electron injection layer comprises a portion having the doped impurity.

Optionally, the display substrate is a light emitting display substrate; the plurality of functional material layers comprises a stacked structure comprising a first light emitting layer and a second light emitting layer of a same color; and each of the first light emitting layer and the second light emitting layer comprises a portion having the doped impurity.

Optionally, the display substrate is a white light emitting display substrate; the plurality of functional material layers comprises a stacked structure comprising a light emitting layer of a first color, a light emitting layer of a second color, and a light emitting layer of a third color; and each of the light emitting layer of the first color, the light emitting layer of a second color, and the light emitting layer of the third color comprises a portion having the doped impurity.

Optionally, the display substrate further comprises a second anode material layer on a side of the anode material layer away from the plurality of functional material layers; wherein the second anode material layer comprise at least a metallic material.

Optionally, the display substrate further comprises an etch stop layer on a side of the second anode material layer away from the anode material layer.

Optionally, the display substrate further comprises an encapsulating layer on a side of the plurality of functional material layers away from a base substrate, encapsulating the plurality of functional material layers; and a light transmissive inorganic protection layer on a side of the encapsulating layer away from the base substrate; wherein the light transmissive inorganic protection layer comprises a plurality of light transmissive inorganic protection blocks; and a respective light transmissive inorganic protection block of the plurality of light transmissive inorganic protection blocks is in a respective subpixel region.

In another aspect, the present disclosure provides a display apparatus, comprising the display substrate described herein, and one or more integrated circuits connected to the display substrate.

In another aspect, the present disclosure provides a method of fabricating a display substrate, comprising forming a plurality of initial functional material layers extending at least partially across multiple subpixels; and performing a first impurity doping on the plurality of initial functional material layers to form a plurality of functional material layers comprising a first portion in an inter-subpixel region, and a second portion in subpixel regions; wherein the first portion comprises a doped impurity; the first portion and the second portion comprise at least one functional material in common; a weight percentage of the doped impurity in the first portion is higher than a weight percentage of the doped impurity in the second portion; a weight ratio of the doped impurity to the at least one functional material in common in the first portion is higher than a weight ratio of the doped impurity to the at least one functional material in common in the second portion; the first portion spaces apart adjacent subpixels; and the second portion comprises a light emitting layer of a respective subpixel.

Optionally, the method further comprises forming an initial anode material layer extending at least partially across multiple subpixels; and performing a second impurity doping on the initial anode material layer to form an anode material layer comprising a first anode portion at least partially in the subpixel regions and a second anode portion at least partially in the inter-subpixel region; wherein the first anode portion comprises a doped anode impurity; the first anode portion and the second anode portion comprise at least one material in common; a weight percentage of the doped anode impurity in the first anode portion is higher than a weight percentage of the doped anode impurity in the second portion; a weight ratio of the doped anode impurity to the at least one material in common in the first anode portion is higher than a weight ratio of the doped anode impurity to the at least one material in common in the second anode portion; the second anode portion spaces apart adjacent subpixels; and the first anode portion comprises an anode of the respective subpixel.

Optionally, prior to performing the first impurity doping, the method further comprises forming an encapsulating layer on a side of the plurality of initial functional material layers away from a base substrate, encapsulating the plurality of initial functional material layers; and forming a light transmissive inorganic protection layer on a side of the encapsulating layer away from the base substrate; wherein forming the light transmissive inorganic protection layer comprises forming a plurality of light transmissive inorganic protection blocks; a respective light transmissive inorganic protection block of the plurality of light transmissive inorganic protection blocks is in a respective subpixel region; and the first impurity doping is performed using the plurality of light transmissive inorganic protection blocks as a mask plate.

In another aspect, the present disclosure provides a display substrate, comprising an anode material layer extending at least partially across multiple subpixels; the anode material layer comprises a first anode portion at least partially in subpixel regions and a second anode portion at least partially in an inter-subpixel region; the first anode portion comprises a doped anode impurity; the first anode portion and the second anode portion comprise at least one material in common; a weight percentage of the doped anode impurity in the first anode portion is higher than a weight percentage of the doped anode impurity in the second portion; a weight ratio of the doped anode impurity to the at least one material in common in the first anode portion is higher than a weight ratio of the doped anode impurity to the at least one material in common in the second anode portion; the second anode portion spaces apart adjacent subpixels; and the first anode portion comprises an anode of the respective subpixel.

Optionally, the weight ratio of the doped anode impurity to the at least one material in common in the second anode portion is substantially zero.

Optionally, the first anode portion and the second anode portion comprise at least a semiconductor material in common; the first anode portion has a higher conductivity than a conductivity of the second anode portion; and a difference between a highest occupied molecular orbital level of the second anode portion and a highest occupied molecular orbital level of a functional material layer in direct contact with the second anode portion is greater than a difference between a highest occupied molecular orbital level of the first anode portion and a highest occupied molecular orbital level of the functional material layer in direct contact with the first anode portion.

Optionally, the first anode portion and the second anode portion comprise at least a metal oxide material in common.

Optionally, the doped impurity or the doped anode impurity comprises at least one of boron, fluorine, argon, phosphorus, hydrogen, helium, neon, nitrogen, arsenic, antimony, aluminum, magnesium, or silicon.

Optionally, the display substrate further comprises a plurality of functional material layers extending at least partially across multiple subpixels; wherein the plurality of functional material layers comprise a first portion in the inter-subpixel region, and a second portion in the subpixel regions; the first portion comprises a doped impurity; the first portion and the second portion comprise at least one functional material in common; a weight percentage of the doped impurity in the first portion is higher than a weight percentage of the doped impurity in the second portion; the first portion spaces apart adjacent subpixels; and the second portion comprises a light emitting layer of a respective subpixel.

Optionally, a weight ratio of the doped impurity to the at least one functional material in common in the first portion is higher than a weight ratio of the doped impurity to the at least one functional material in common in the second portion.

Optionally, the weight ratio of the doped impurity to the at least one functional material in common in the second portion in at least one of a hole transport layer, a hole injection layer, an electron transport layer, or an electron injection layer is substantially zero.

Optionally, an orthographic projection of the second anode portion on a base substrate at least partially overlaps with an orthographic projection of the first portion on the base substrate; and an orthographic projection of the first anode portion on the base substrate at least partially overlaps with an orthographic projection of the second portion on the base substrate.

Optionally, the display substrate further comprises a pixel definition layer; wherein the pixel definition layer comprises a plurality of inter-pixel functional material layers doped with impurities; and the plurality of inter-pixel functional material layers in the pixel definition layer are incapable of emitting light.

Optionally, the plurality of functional material layers comprises a stacked structure comprising a light emitting layer, a hole transport layer, a hole injection layer, an electron transport layer, and an electron injection layer; and each of the light emitting layer, the hole transport layer, the hole injection layer, the electron transport layer, and the electron injection layer comprises a portion having the doped impurity.

Optionally, the display substrate comprises a plurality of first functional material layers extending at least partially across multiple subpixels of a first color, a plurality of second functional material layers extending at least partially across multiple subpixels of a second color, and a plurality of third functional material layers extending at least partially across multiple subpixels of a third color; wherein the plurality of first functional material layers comprises a first stacked structure comprising a light emitting layer of a first color, a hole transport layer, a hole injection layer, an electron transport layer, and an electron injection layer; each of the light emitting layer of the first color, the hole transport layer, the hole injection layer, the electron transport layer, and the electron injection layer comprises a portion having the doped impurity; the plurality of second functional material layers comprises a second stacked structure comprising a light emitting layer of a second color, a hole transport layer, a hole injection layer, an electron transport layer, and an electron injection layer; each of the light emitting layer of the second color, the hole transport layer, the hole injection layer, the electron transport layer, and the electron injection layer comprises a portion having the doped impurity; the plurality of second functional material layers comprises a third stacked structure comprising a light emitting layer of a third color, a hole transport layer, a hole injection layer, an electron transport layer, and an electron injection layer; and each of the light emitting layer of the third color, the hole transport layer, the hole injection layer, the electron transport layer, and the electron injection layer comprises a portion having the doped impurity.

Optionally, the display substrate is a light emitting display substrate; the plurality of functional material layers comprises a stacked structure comprising a first light emitting layer and a second light emitting layer of a same color; and each of the first light emitting layer and the second light emitting layer comprises a portion having the doped impurity.

Optionally, the display substrate is a white light emitting display substrate; the plurality of functional material layers comprises a stacked structure comprising a light emitting layer of a first color, a light emitting layer of a second color, and a light emitting layer of a third color; and each of the light emitting layer of the first color, the light emitting layer of a second color, and the light emitting layer of the third color comprises a portion having the doped impurity.

Optionally, the display substrate further comprises a second anode material layer on a side of the anode material layer closer to a transistor substrate; wherein the second anode material layer comprise at least a metallic material.

Optionally, the display substrate further comprises an etch stop layer on a side of the second anode material layer away from the anode material layer.

Optionally, the display substrate further comprises an encapsulating layer on a side of a plurality of functional material layers away from a base substrate, encapsulating the plurality of functional material layers; and a light transmissive inorganic protection layer on a side of the encapsulating layer away from the base substrate; wherein the light transmissive inorganic protection layer comprises a plurality of light transmissive inorganic protection blocks; and a respective light transmissive inorganic protection block of the plurality of light transmissive inorganic protection blocks is in a respective subpixel region.

In another aspect, the present disclosure provides a display apparatus, comprising the display substrate described herein, and one or more integrated circuits connected to the display substrate.

In another aspect, the present disclosure provides a method of fabricating a display substrate, comprising forming an initial anode material layer extending at least partially across multiple subpixels; and performing a second impurity doping on the initial anode material layer to form an anode material layer comprising a first anode portion at least partially in subpixel regions and a second anode portion at least partially in an inter-subpixel region; wherein the first anode portion comprises a doped anode impurity; the first anode portion and the second anode portion comprise at least one material in common; a weight percentage of the doped anode impurity in the first anode portion is higher than a weight percentage of the doped anode impurity in the second portion; a weight ratio of the doped anode impurity to the at least one material in common in the first anode portion is higher than a weight ratio of the doped anode impurity to the at least one material in common in the second anode portion; the second anode portion spaces apart adjacent subpixels; and the first anode portion comprises an anode of a respective subpixel.

Optionally, the method further comprises forming a plurality of initial functional material layers extending at least partially across multiple subpixels; and performing a first impurity doping on the plurality of initial functional material layers to form a plurality of functional material layers comprising a first portion in the inter-subpixel region, and a second portion in the subpixel regions; wherein the first portion comprises a doped impurity; the first portion and the second portion comprise at least one functional material in common; a weight percentage of the doped impurity in the first portion is higher than a weight percentage of the doped impurity in the second portion; a weight ratio of the doped impurity to the at least one functional material in common in the first portion is higher than a weight ratio of the doped impurity to the at least one functional material in common in the second portion; the first portion spaces apart adjacent subpixels; and the second portion comprises a light emitting layer of the respective subpixel.

Optionally, the method further comprises forming an encapsulating layer on a side of a plurality of initial functional material layers away from a base substrate, encapsulating the plurality of initial functional material layers; and forming a light transmissive inorganic protection layer on a side of the encapsulating layer away from the base substrate; wherein forming the light transmissive inorganic protection layer comprises forming a plurality of light transmissive inorganic protection blocks; a respective light transmissive inorganic protection block of the plurality of light transmissive inorganic protection blocks is in a respective subpixel region; and the first impurity doping is performed using the plurality of light transmissive inorganic protection blocks as a mask plate.

BRIEF DESCRIPTION OF THE FIGURES

The following drawings are merely examples for illustrative purposes according to various disclosed embodiments and are not intended to limit the scope of the present invention.

FIG. 20A illustrates the structure of a respective unit in a display substrate in some embodiments according to the present disclosure.

FIG. 20B illustrates subpixel regions in the respective unit depicted in FIG. 20A.

FIG. 20C illustrates an inter-subpixel region in the respective unit depicted in FIG. 20A.

FIG. 20D illustrates an anode material layer in the respective unit depicted in FIG. 20A.

FIG. 20E illustrates a functional material layer in the respective unit depicted in FIG. 20A.

FIG. 21A to FIG. 21G illustrate a process of doping an anode material layer in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
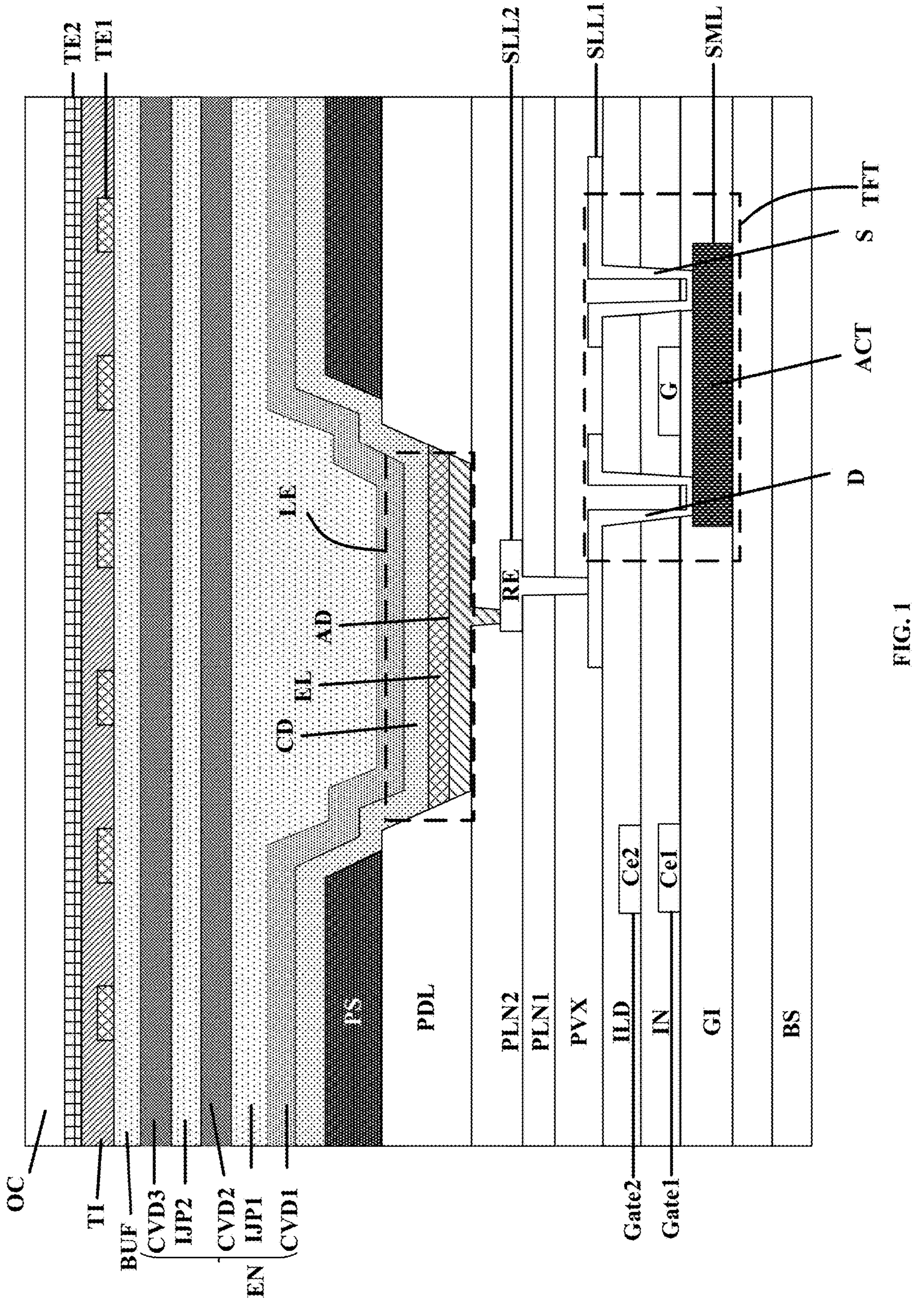
FIG. 1 illustrates a detailed structure in a display area in a related display apparatus in some embodiments according to the present disclosure.

FIG. 1 illustrates a detailed structure in a display area in a display apparatus in some embodiments according to the present disclosure. Referring to FIG. 1, the display apparatus in the display area in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first gate metal layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second gate metal layer) on a side of the insulating layer IN away from the gate insulating layer GI; an inter-layer dielectric layer ILD on a side of the second capacitor electrode Ce2 away from the gate insulating layer GI; a source electrode S and a drain electrode D (parts of a first SD metal layer) on a side of the inter-layer dielectric layer ILD away from the gate insulating layer GI; a passivation layer PVX on a side of the source electrode S and the drain electrode D away from the inter-layer dielectric layer ILD; a first planarization layer PLN1 on a side of the passivation layer PVX away from the inter-layer dielectric layer ILD; a relay electrode RE (part of a second SD metal layer) on side of the first planarization layer PLN1 away from the passivation layer PVX; a second planarization layer PLN2 on a side of the relay electrode RE (part of a second SD metal layer) away from the first planarization layer PLN1; a pixel definition layer PDL defining a subpixel aperture and on a side of the second planarization layer PLN2 away from the base substrate BS; and a light emitting element LE in the subpixel aperture. The light emitting element LE includes an anode AD on a side of the second planarization layer PLN2 away from the first planarization layer PLN1; a light emitting layer EL on a side of the anode AD away from the second planarization layer PLN2; and a cathode layer CD on a side of the light emitting layer EL away from the anode AD. The display apparatus in the display area further includes an encapsulating layer EN encapsulating the light emitting element LE, and on a side of the cathode layer CD away from the base substrate BS.

The encapsulating layer EN in some embodiments includes a first inorganic encapsulating sub-layer CVD1 on a side of the cathode layer CD away from the base substrate BS, a first organic encapsulating sub-layer IJP1 on a side of the first inorganic encapsulating sub-layer CVD1 away from the base substrate BS, a second inorganic encapsulating sub-layer CVD2 on a side of the first organic encapsulating sub-layer IJP1 away from the base substrate BS, a second organic encapsulating sub-layer IJP2 on a side of the second inorganic encapsulating sub-layer CVD2 away from the base substrate BS, and a third inorganic encapsulating sub-layer CVD3 on a side of the second organic encapsulating sub-layer IJP2 away from the base substrate BS. In alternative embodiments, the encapsulating layer EN does not include the second organic encapsulating sub-layer IJP2 and the third inorganic encapsulating sub-layer CVD3.

The display apparatus in the display area further includes a buffer layer BUF on a side of the encapsulating layer EN away from the base substrate BS; a first touch electrode layer TE1 on a side of the buffer layer BUF away from the encapsulating layer EN; a touch insulating layer TI on a side of the first touch electrode layer TE1 away from the buffer layer BUF; a second touch electrode layer TE2 on a side of the touch insulating layer TI away from the buffer layer BUF; and an overcoat layer OC on a side of the second touch electrode layer TE2 away from the touch insulating layer TI.

Referring to FIG. 1, the display apparatus includes a semiconductor material layer SML, a first gate metal layer Gate1, a second gate metal layer Gate2, a first signal line layer SLL1, and a second signal line layer SLL2. The display apparatus further includes an insulating layer IN between the first gate metal layer Gate1 and the second gate metal layer Gate2; an inter-layer dielectric layer ILD between the second conductive layer Gate2 and the first signal line layer SLL1; and at least a passivation layer PVX or a planarization layer PLN between the first signal line layer SLL1 and the second signal line layer SLL2.

One of the limiting factors in producing display panels of high resolution (e.g., pixel-per-inch) is that the resolution of the mask for patterning the layers of the display panels. In particular, fabrication of organic light emitting diode display panels uses open mask and fine metal mask. The open mask is used primarily for forming common layers of the organic light emitting diode display panels such as an electron transport layer or an electron injection layer, as well as a cathode layer. Fine metal masks are used for depositing functional material layers such as a light emitting layer. The resolution of the fine metal mask (e.g., the size of the apertures in the fine metal mask) determines the resolution of the display panel. The smaller the apertures in the fine metal mask, the higher the resolution of the display panel. However, the resolution of the fine metal mask is limited by the fabrication process. Currently, the resolution of the fine metal mask has reached a bottleneck.

Another factor severely limiting the resolution of the related display panel is the intrinsic crosstalk between adjacent subpixels in the related display panel. As the resolution of the display panel increases, the space between adjacent subpixels in the related display panel decreases. For example, in some related display panels, a hole transport layer or a hole injection layer is a common layer extending throughout a plurality of subpixels in the related display panel. As the space between adjacent subpixels decreases, cross-talk between adjacent subpixels in the related display panel increases due to the lateral conductivity of these layers in the related display panel.

Figure 2:
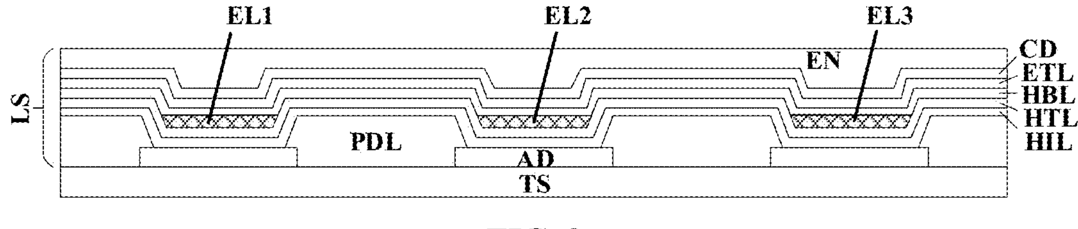
FIG. 2 illustrates the structure of a pixel in a related display panel.

FIG. 2 illustrates the structure of a pixel in a related display panel. Referring to FIG. 2, the display panel in some embodiments includes a transistor substrate TS having a plurality of pixel driving circuits for driving light emission of a plurality of light emitting elements; and a light emitting substrate LS comprising a plurality of light emitting elements. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode.

FIG. 2 shows a pixel of the related display panel. The pixel includes at least three subpixels (e.g., a red subpixel, a green subpixel, and a blue subpixel). The light emitting substrate LS includes an anode AD and a pixel definition layer PDL defining a plurality of subpixel apertures on the transistor substrate TS, a hole injection layer HIL on a side of the anode AD away from the transistor substrate TS, a hole transport layer HTL on a side of the hole injection layer HIL away from the transistor substrate TS, a plurality of light emitting layers (including a first light emitting layer EL1, a second light emitting layer EL2, and a third light emitting layer EL3) on a side of the hole transport layer HTL away from the transistor substrate TS and in the plurality of subpixel apertures, a hole barrier layer HBL on a side of the plurality of light emitting layers away from the transistor substrate TS, an electron transport layer ETL on a side of the hole barrier layer HBL away from the transistor substrate TS, a cathode CD on a side of the electron transport layer ETL away from the transistor substrate TS, and an encapsulating layer EN on a side of the cathode CD away from the transistor substrate TS.

As shown in FIG. 2, a hole transport layer HTL and a hole injection layer HIL are two common layers extending throughout a plurality of subpixels in the related display panel. In one example, the hole transport layer HTL or the hole injection layer HIL has a mobility greater than $1\times10^{-3}$ $cm^2/Vs$. The relatively large lateral conductivity in these layers leads to possible crosstalk between adjacent subpixels, particularly as the space between adjacent subpixels decreases.

Accordingly, the present disclosure provides, inter alia, a display substrate, a display apparatus, and a method of fabricating a display substrate that substantially obviate one or more of the problems due to limitations and disadvantages of the related art. In one aspect, the present disclosure provides a display substrate. In some embodiments, the display substrate includes a plurality of functional material layers extending at least partially across multiple subpixels. Optionally, the plurality of functional material layers comprise a first portion in an inter-subpixel region, and a second portion in subpixel regions. Optionally, the first portion comprises a doped impurity. Optionally, the first portion and the second portion comprise at least one functional material in common. Optionally, a weight percentage of the doped impurity in the first portion is higher than a weight percentage of the doped impurity in the second portion. Optionally, the first portion spaces apart adjacent subpixels. Optionally, the second portion comprises a light emitting layer of a respective subpixel. Optionally, a weight ratio of the doped impurity to the at least one functional material in common in the first portion is higher than a weight ratio of the doped impurity to the at least one functional material in common in the second portion.

The inventors of the present disclosure discover that, surprisingly and unexpectedly, a high resolution display panel can be achieved by the unique structure and fabrication method according to the present disclosure. The inventors of the present disclosure discover that the resolution of the display panel may be increased by doping an impurity into a first portion of at least one layer of a display substrate (e.g., a light emitting substrate). The display substrate according to the present disclosure includes a subpixel region and an inter-subpixel region. The at least one layer includes a first portion doped with an impurity and a second portion that is not subject to a doping of the impurity. The at least one layer extends at least partially across multiple subpixels in the display substrate.

In one example, the first portion is at least partially in the inter-subpixel region and the second portion is at least partially in the subpixel region.

In another example, the first portion is at least partially in the subpixel region and the second portion is at least partially in the inter-subpixel region.

Figure 3:
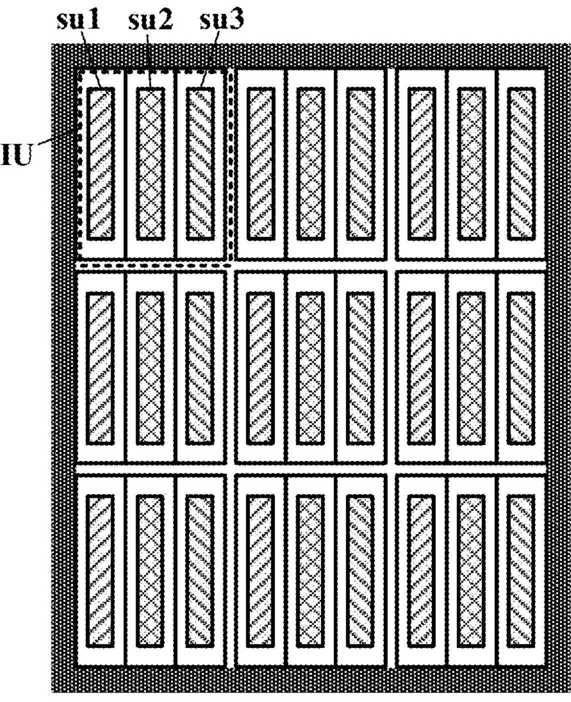
FIG. 3 illustrates an intermediate substrate in a process of fabricating a display substrate according to the present disclosure.
Figure 4:
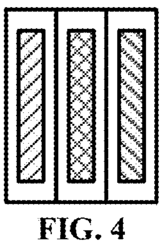
FIG. 4 illustrate the structure of a respective initial unit in some embodiments according to the present disclosure.

FIG. 3 illustrates an intermediate substrate in a process of fabricating a display substrate according to the present disclosure. FIG. 4 illustrate the structure of a respective initial unit in some embodiments according to the present disclosure. Referring to FIG. 3, the intermediate substrate in some embodiments includes a plurality of initial units IU. A respective initial unit of the plurality of initial units IU includes one or more sub-units, e.g., a first sub-unit su1, a second sub-unit su2, and a third sub-unit su3. In a respective sub-unit of the one more sub-units, the intermediate substrate includes a respective functional material layer (e.g., a respective light emitting layer). In one example, in the respective initial unit of the plurality of initial units IU, at least one layer of the intermediate substrate extends at least partially in the one or more sub-units. For example, at least one layer of the intermediate substrate extends at least partially in the first sub-unit su1, the second sub-unit su2, and the third sub-unit su3. Various alternative implementations may be practiced in the present disclosure.

Figure 5A:
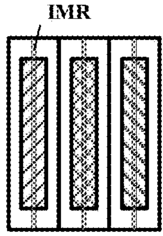
FIG. 5A illustrates the structure of a respective unit in a display substrate in some embodiments according to the present disclosure.
Figure 5B:
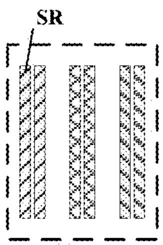
FIG. 5B illustrates subpixel regions in the respective unit depicted in FIG. 5A.
Figure 5C:
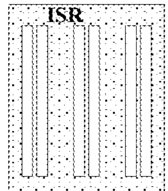
FIG. 5C illustrates an inter-subpixel region in the respective unit depicted in FIG. 5A.

FIG. 5A illustrates the structure of a respective unit in a display substrate in some embodiments according to the present disclosure. FIG. 5B illustrates subpixel regions in the respective unit depicted in FIG. 5A. FIG. 5C illustrates an inter-subpixel region in the respective unit depicted in FIG. 5A. The respective unit depicted in FIG. 5A to FIG. 5C corresponds to a respective initial unit depicted in FIG. 3 and FIG. 4. Referring to FIG. 5A to FIG. 5C, the display substrate in some embodiments includes subpixel regions SR and an inter-subpixel region ISR. As shown in FIG. 5A to FIG. 5C, at least a respective subpixel region of the subpixel regions SR is substantially surrounded by the inter-subpixel region ISR. As used herein, a subpixel region refers to a light emission region of a subpixel. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel. As used herein the term "substantially surrounded" refers to at least 50% (e.g., at least 60%, at least 70%, at least 80%, at least 90%, at least 95%, at least 99%, and 100%) surrounded.

Referring to FIG. 5A to FIG. 5C, the inter-subpixel region ISR in some embodiments includes an impurity region IMR. In the example depicted in FIG. 5A to FIG. 5C, the impurity region IMR is a portion of the inter-subpixel region ISR. Various alternative implementations may be practiced in the present disclosure. In an alternative example, the impurity region IMR may be substantially the same as the inter-subpixel region ISR.

In some embodiments, the display substrate includes at least one layer. The at least one layer includes a first portion doped with an impurity and a second portion that is not subject to a doping of the impurity. The first portion is in the impurity region IMR and the second portion is at least partially in a respective subpixel region SR.

Comparing the respective initial unit depicted in FIG. 4 and the respective unit depicted in FIG. 5A, by having the impurity region IMR, the resolution of the display substrate at least doubles. The impurity region IMR divides a respective sub-unit into two subpixel regions, the two subpixel regions arranged along a row direction.

Figure 6A:
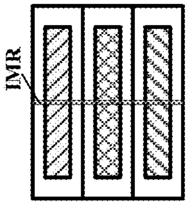
FIG. 6A illustrates the structure of a respective unit in a display substrate in some embodiments according to the present disclosure.
Figure 6B:
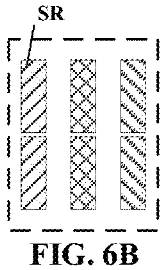
FIG. 6B illustrates subpixel regions in the respective unit depicted in FIG. 6A.
Figure 6C:
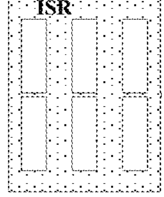
FIG. 6C illustrates an inter-subpixel region in the respective unit depicted in FIG. 6A.

FIG. 6A illustrates the structure of a respective unit in a display substrate in some embodiments according to the present disclosure. FIG. 6B illustrates subpixel regions in the respective unit depicted in FIG. 6A. FIG. 6C illustrates an inter-subpixel region in the respective unit depicted in FIG. 6A. The impurity region IMR depicted in FIG. 6A to FIG. 6C differs from the impurity region IMR depicted in FIG. 5A to FIG. 5C in that the impurity region IMR depicted in FIG. 6A to FIG. 6C extends along a row direction whereas the impurity region IMR depicted in FIG. 5A to FIG. 5C extends along a column direction.

Comparing the respective initial unit depicted in FIG. 4 and the respective unit depicted in FIG. 6A, by having the impurity region IMR, the resolution of the display substrate at least doubles. The impurity region IMR divides a respective sub-unit into two subpixel regions, the two subpixel regions arranged along a column direction.

Figure 7A:
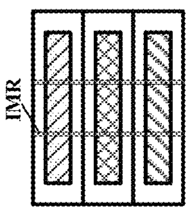
FIG. 7A illustrates the structure of a respective unit in a display substrate in some embodiments according to the present disclosure.
Figure 7B:
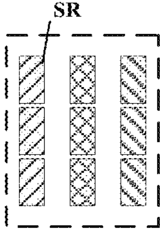
FIG. 7B illustrates subpixel regions in the respective unit depicted in FIG. 7A.
Figure 7C:
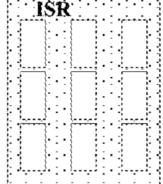
FIG. 7C illustrates an inter-subpixel region in the respective unit depicted in FIG. 7A.

FIG. 7A illustrates the structure of a respective unit in a display substrate in some embodiments according to the present disclosure. FIG. 7B illustrates subpixel regions in the respective unit depicted in FIG. 7A. FIG. 7C illustrates an inter-subpixel region in the respective unit depicted in FIG. 7A. The display substrate depicted in FIG. 7A to FIG. 7C includes two rows of impurity regions, dividing a respective sub-unit into three subpixel regions, the three subpixel regions arranged along a column direction.

Comparing the respective initial unit depicted in FIG. 4 and the respective unit depicted in FIG. 7A, by having the impurity region IMR, the resolution of the display substrate at least triples. The impurity region IMR divides a respective sub-unit into three subpixel regions, the three subpixel regions arranged along a column direction.

Figure 8A:
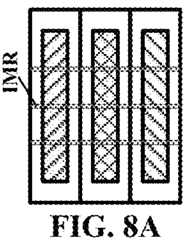
FIG. 8A illustrates the structure of a respective unit in a display substrate in some embodiments according to the present disclosure.
Figure 8B:
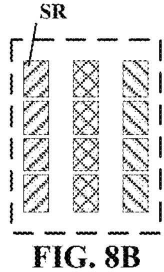
FIG. 8B illustrates subpixel regions in the respective unit depicted in FIG. 8A.
Figure 8C:
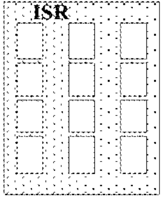
FIG. 8C illustrates an inter-subpixel region in the respective unit depicted in FIG. 8A.

FIG. 8A illustrates the structure of a respective unit in a display substrate in some embodiments according to the present disclosure. FIG. 8B illustrates subpixel regions in the respective unit depicted in FIG. 8A. FIG. 8C illustrates an inter-subpixel region in the respective unit depicted in FIG. 8A. The display substrate depicted in FIG. 8A to FIG. 8C includes three rows of impurity regions, dividing a respective sub-unit into four subpixel regions, the four subpixel regions arranged along a column direction.

Comparing the respective initial unit depicted in FIG. 4 and the respective unit depicted in FIG. 8A, by having the impurity region IMR, the resolution of the display substrate at least quadruples. The impurity region IMR divides a respective sub-unit into four subpixel regions, the four subpixel regions arranged along a column direction.

Figure 9A:
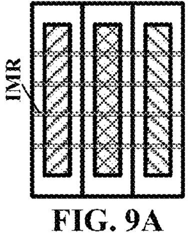
FIG. 9A illustrates the structure of a respective unit in a display substrate in some embodiments according to the present disclosure.
Figure 9B:
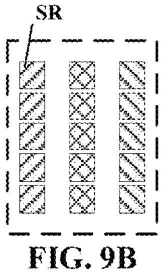
FIG. 9B illustrates subpixel regions in the respective unit depicted in FIG. 9A.
Figure 9C:
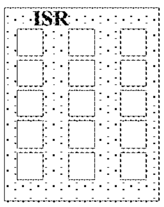
FIG. 9C illustrates an inter-subpixel region in the respective unit depicted in FIG. 9A.

FIG. 9A illustrates the structure of a respective unit in a display substrate in some embodiments according to the present disclosure. FIG. 9B illustrates subpixel regions in the respective unit depicted in FIG. 9A. FIG. 9C illustrates an inter-subpixel region in the respective unit depicted in FIG. 9A. The display substrate depicted in FIG. 9A to FIG. 9C includes four rows of impurity regions, dividing a respective sub-unit into five subpixel regions, the five subpixel regions arranged along a column direction.

Comparing the respective initial unit depicted in FIG. 4 and the respective unit depicted in FIG. 9A, by having the impurity region IMR, the resolution of the display substrate at least quintuples. The impurity region IMR divides a respective sub-unit into five subpixel regions, the five subpixel regions arranged along a column direction.

Figure 10A:
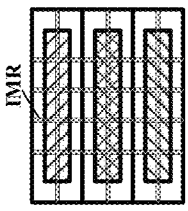
FIG. 10A illustrates the structure of a respective unit in a display substrate in some embodiments according to the present disclosure.
Figure 10B:
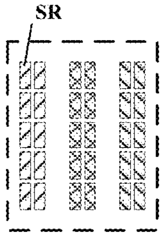
FIG. 10B illustrates subpixel regions in the respective unit depicted in FIG. 10A.
Figure 10C:
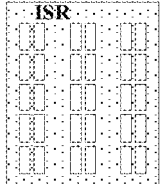
FIG. 10C illustrates an inter-subpixel region in the respective unit depicted in FIG. 10A.

FIG. 10A illustrates the structure of a respective unit in a display substrate in some embodiments according to the present disclosure. FIG. 10B illustrates subpixel regions in the respective unit depicted in FIG. 10A. FIG. 10C illustrates an inter-subpixel region in the respective unit depicted in FIG. 10A. The display substrate depicted in FIG. 9A to FIG. 9C includes one column of impurity region and four rows of impurity regions, dividing a respective sub-unit into ten subpixel regions, the ten subpixel regions arranged in an array having five rows and two columns.

Comparing the respective initial unit depicted in FIG. 4 and the respective unit depicted in FIG. 10A, by having the impurity region IMR, the resolution of the display substrate increases to at least ten times of the initial resolution. The impurity region IMR divides a respective sub-unit into ten subpixel regions, the ten subpixel regions arranged in an array having five rows and two columns.

The impurity region IMR may be formed by various appropriate methods. In some embodiments, the impurity region IMR is formed by doping an impurity using ion implantation. Examples of impurities include, but are not limited to, boron, fluorine, argon, phosphorus, hydrogen, helium, neon, nitrogen, arsenic, antimony, aluminum, magnesium, and silicon.

Figure 11A:
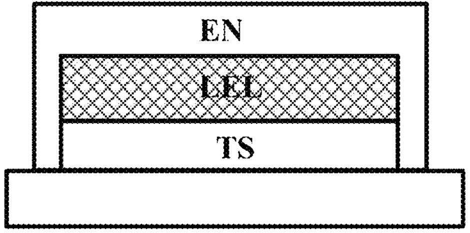
FIG. 11A to FIG. 11E depict a doping process in some embodiments according to the present disclosure.

FIG. 11A to FIG. 11E depict a doping process in some embodiments according to the present disclosure. Referring to FIG. 11A, an intermediate substrate is provided. The intermediate substrate includes a transistor substrate TS, one or more light emitting element layers LEL on the transistor substrate TS, and an encapsulating layer EN encapsulating the one or more light emitting element layers LEL. The one or more light emitting element layers LEL may include one or more of a light emitting material layer, an organic functional layer, and an anode material layer.

Figure 11B:
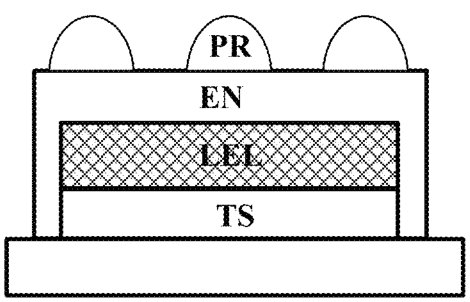

Referring to FIG. 11B, a protection layer PR is formed on the encapsulating layer EN. In one example, the protection layer PR includes a photoresist material. In regions covered by the protection layer PR, the intermediate substrate is not subject to the doping from ion implantation. In regions not covered by the protection layer PR, the intermediate substrate is subject to the doping from ion implantation.

Figure 11C:
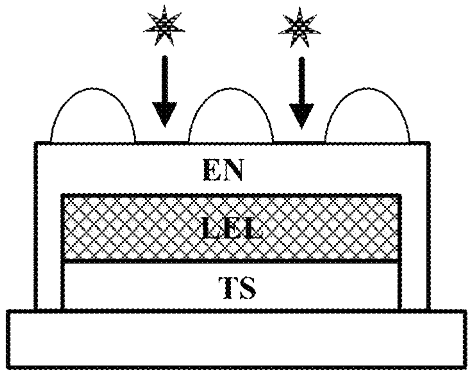

Referring to FIG. 11C, doping of an impurity, e.g., by ion implantation, is performed. As discussed above, in regions not covered by the protection layer PR, the intermediate substrate is subject to the doping from ion implantation.

Figure 11D:
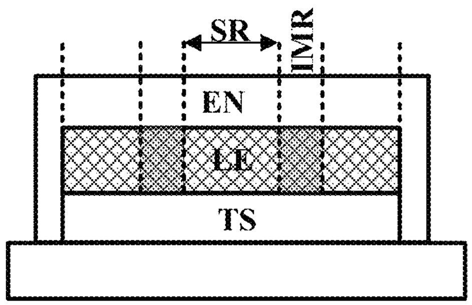

Referring to FIG. 11D, subsequent to the doping, an impurity region IMR and subpixel regions SR are formed in the display substate. The impurity region IMR spaces apart two adjacent subpixel regions. A plurality of light emitting elements LE are thereby formed.

Figure 11E:
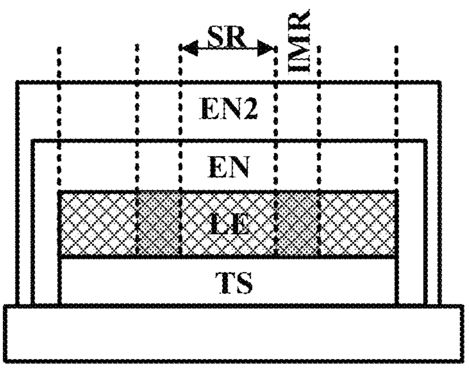

Referring to FIG. 11E, a second encapsulating layer EN2 is formed on a side of the encapsulating layer EN away from the transistor substrate TS, encapsulating the plurality of light emitting elements LE.

Figure 12:
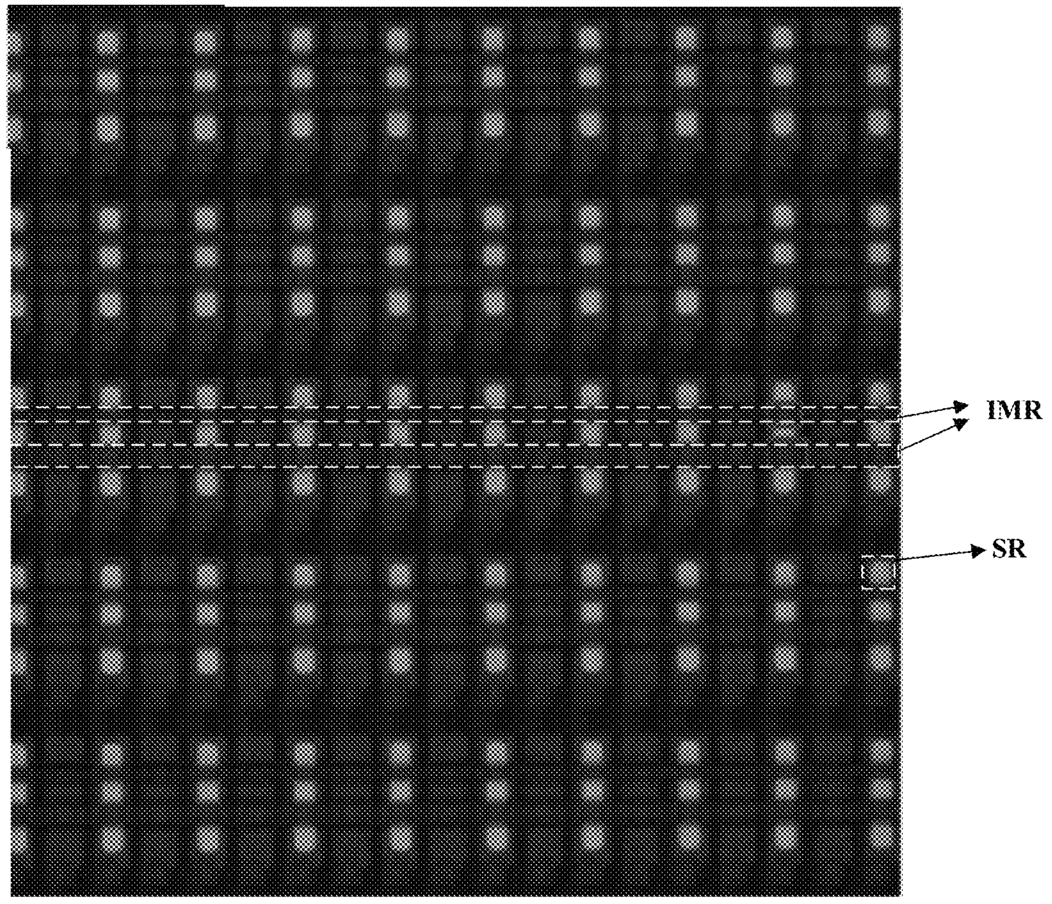
FIG. 12 shows a display substrate in an image display mode.

FIG. 12 shows a display substrate in an image display mode. Referring to FIG. 12, the display substrate includes subpixel regions SR and an inter-subpixel region. The inter-subpixel region includes an impurity region IMR. When the display substrate is configured to display an image, the subpixel regions SR are configured to emit light, whereas the impurity region IMR does not emit light.

As discussed above, the display substrate includes at least one layer, which includes a first portion doped with an impurity and a second portion that is not subject to a doping of the impurity. The first portion is in the impurity region IMR and the second portion is at least partially in a respective subpixel region SR. In some embodiments, the first portion and the second portion include at least one material in common. In some embodiments, a weight percentage of the impurity in the first portion is higher than a weight percentage of the impurity in the second portion. Optionally, the impurity is absent in the second portion. In some embodiments, a weight ratio of the impurity to the at least one material in common in the first portion is higher than a weight ratio of the impurity to the at least one material in common in the second portion. Optionally, the weight ratio of the impurity to the at least one material in common in the second portion is substantially zero (e.g., less than 0.001%, less than 0.0009%, less than 0.0008%, less than 0.0007%, less than 0.0006%, than 0.0005%, less than 0.0004%, less than 0.0003%, less than 0.0002%, or less than 0.0001%).

In some embodiments, the at least one layer includes a functional material layer. In some embodiments, the first portion and the second portion of the functional material layer includes a functional material in common. Examples of functional material layers include any of a light emitting material layer, a hole transport material layer, a hole injection material layer, an electron transport material layer, an electron injection material layer, a charge generation layer, a hole barrier material layer, and an electron barrier material layer. Examples of the functional materials in common include any of a light emitting material, a hole transport material, a hole injection material, an electron transport material, an electron injection material, a charge generation material, a hole barrier material, and an electron barrier material.

Examples of impurities include, but are not limited to, boron, fluorine, argon, phosphorus, hydrogen, helium, neon, nitrogen, arsenic, antimony, aluminum, magnesium, and silicon, or any combination thereof. Additional examples of impurities include gallium, indium, carbon, tin, silicon, germanium, krypton, xenon, chlorine, titanium, chromium, nickel, zinc, gallium, germanium, yttrium, zirconium, niobium, molybdenum, lanthanum, cerium, neodymium, hafnium, tantalum, and tungsten.

The inventors of the present disclosure discover that ion implantation treatment is not necessarily limited to the functional material layers. Surprisingly and unexpectedly, the inventors of the present disclosure discover that ion implantation treatment can be applied to an anode material layer to achieve an ultra-high resolution display substrate.

Figure 13:
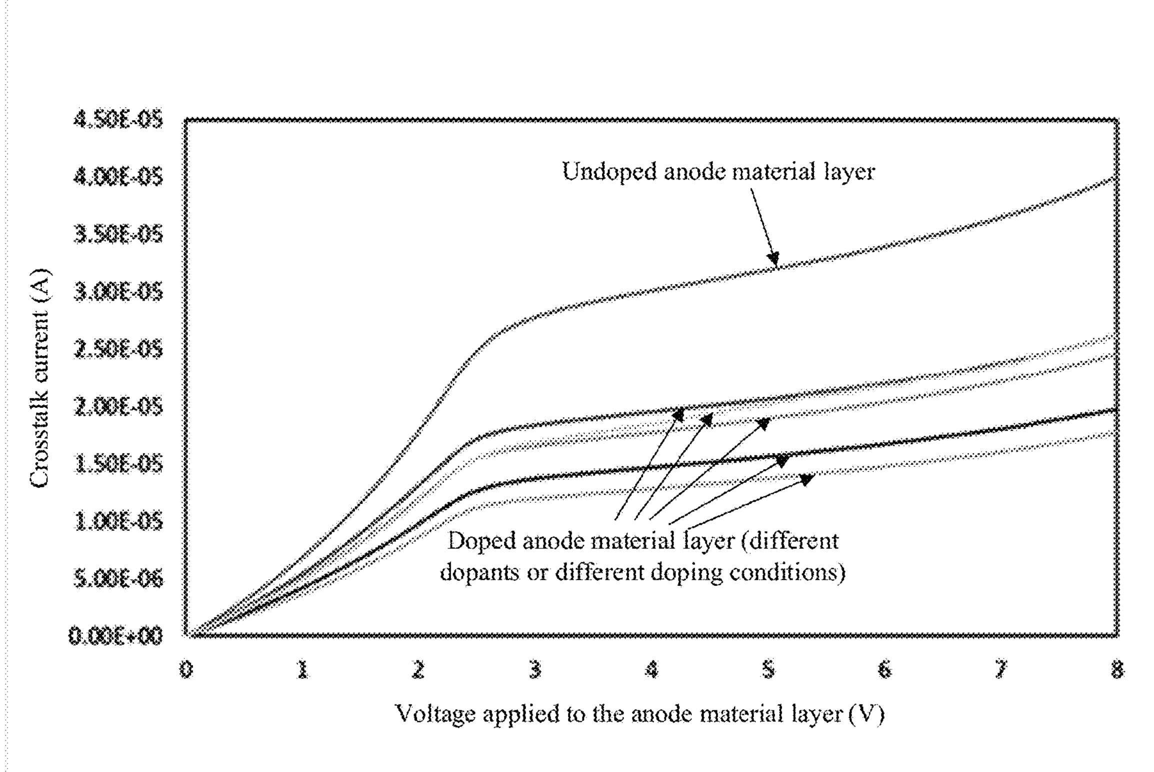
FIG. 13 illustrates the correlation between crosstalk current between adjacent subpixels and doping on the anode material layer.

FIG. 13 illustrates the correlation between crosstalk current between adjacent subpixels and doping on the anode material layer. Referring to FIG. 13, when the anode material layer is undoped, the crosstalk current between adjacent subpixels is relatively high. When the anode material layer is doped in a portion between the adjacent subpixels, the crosstalk current between adjacent subpixels significantly decreases. The decrease in the crosstalk current between adjacent subpixels is particularly prominent when the voltage applied to the anode material layer is relatively large.

In some embodiments, the anode material layer extends at least partially across a plurality of subpixels. For example, the anode material layer extends at least partially across multiple subpixels in a pixel. FIG. 14A to FIG. 14G illustrate a process of doping an anode material layer in some embodiments according to the present disclosure.

Figure 14A:
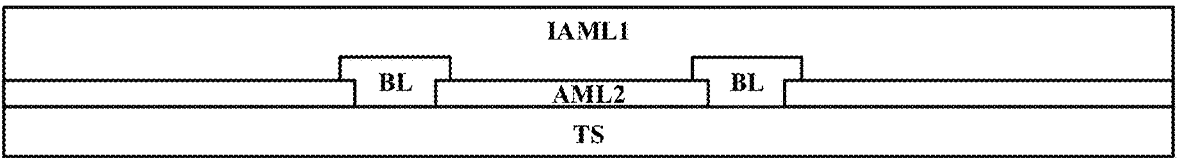
FIG. 14A to FIG. 14G illustrate a process of doping an anode material layer in some embodiments according to the present disclosure.

Referring to FIG. 14A, a second anode material layer AML2 is formed on a transistor substrate TS, a bank layer BL is formed on a side of the second anode material layer AML2, and a first initial anode material layer IAML1 is formed on a side of the second anode material layer AML2 and the bank layer BL away from the transistor substrate TS. The bank layer BL spaces apart a plurality of second anodes in the second anode material layer AML2 from each other.

Figure 14B:
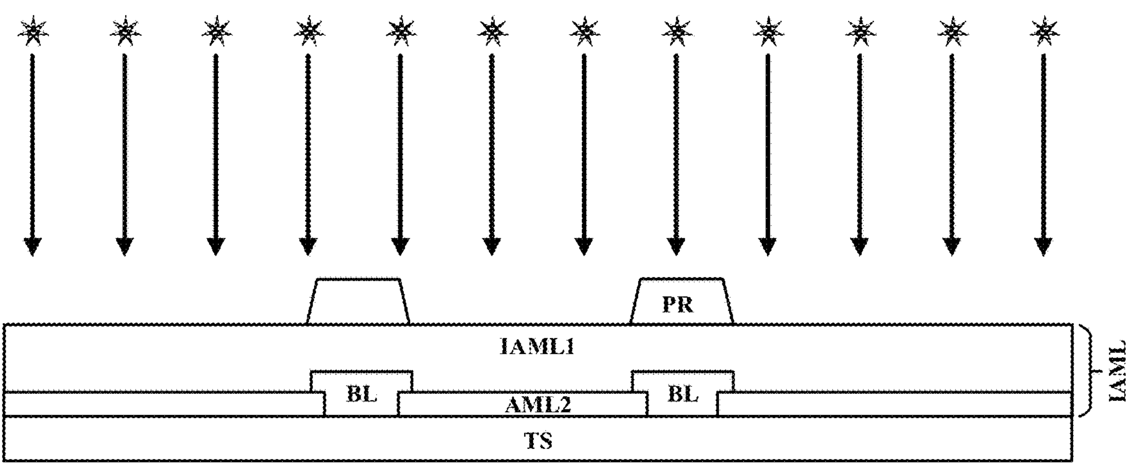

Referring to FIG. 14B, a protection layer PR is formed on a side of the first initial anode material layer IAML1 away from the second anode material layer AML2. The substrate is subject to impurity doping, e.g., by ion implantation. In regions not covered by the protection layer PR, the first initial anode material layer IAML1 is subject to the doping from ion implantation. In a region covered by the protection layer PR, the first initial anode material layer IAML1 is not subject to the doping from ion implantation.

Figure 14C:
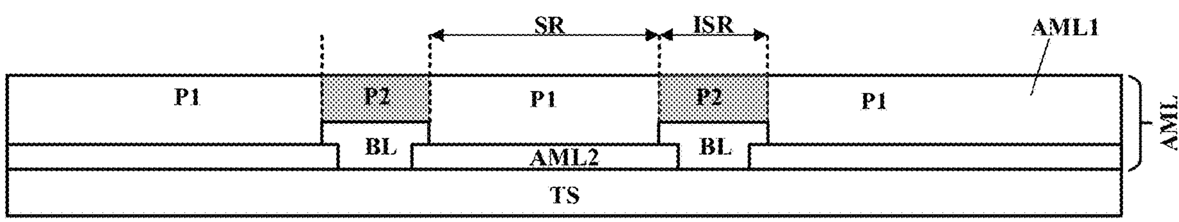

Referring to FIG. 14C, subsequent to the doping, an inter-subpixel region ISR and subpixel regions SR are formed. The inter-subpixel region ISR spaces apart two adjacent subpixel regions. The subpixel regions SR correspond to regions in which the first initial anode material layer IAML1 is subject to the doping from ion implantation. The inter-subpixel region ISR corresponds to the region in which the first initial anode material layer IAML1 is not subject to the doping from ion implantation. As shown in FIG. 14C, a first anode material layer AML1 is formed subsequent to the doping process. The first anode material layer AML1 includes a first portion P1 and a second portion P2. The first portion P1 of the first anode material layer AML1 is subject to the impurity doping, the second portion P2 of the first anode material layer AML1 is not subject to the impurity doping.

Accordingly, in some embodiments, the display substrate includes at least one layer. In some embodiments, the at least one layer includes an anode material layer. The anode material layer extends at least partially across multiple subpixels in the display substrate. In some embodiments, the at least one layer includes a first portion doped with an impurity and a second portion that is not subject to a doping of the impurity. The first portion is in the impurity region IMR and at least partially in a respective subpixel region SR, and the second portion is at least partially in the inter-subpixel region ISR. In some embodiments, the first portion and the second portion include at least one material in common. In some embodiments, a weight percentage of the impurity in the first portion is higher than a weight percentage of the impurity in the second portion. Optionally, the impurity is absent in the second portion. In some embodiments, a weight ratio of the impurity to the at least one material in common in the first portion is higher than a weight ratio of the impurity to the at least one material in common in the second portion. Optionally, the weight ratio of the impurity to the at least one material in common in the second portion is substantially zero (e.g., less than 0.001%, less than 0.0009%, less than 0.0008%, less than 0.0007%, less than 0.0006%, than 0.0005%, less than 0.0004%, less than 0.0003%, less than 0.0002%, or less than 0.0001%).

In some embodiments, the first portion and the second portion of the anode material layer include a semiconductor material in common. Optionally, the semiconductor material in common is a metal oxide material in common or a metal oxynitride material in common. Examples of metal oxide materials include, but are not limited to, indium gallium zinc oxide, indium zinc oxide, indium tin oxide, zinc oxide, gallium oxide, indium oxide, HfInZnO (HIZO), amorphous InGaZnO (amorphous IGZO), InZnO, amorphous InZnO, ZnO:F, In2O3:Sn, In2O3:Mo, Cd2SnO4, ZnO:Al, TiO2:Nb, Cd—Sn—O, or any combination thereof. Examples of appropriate metal oxynitride materials include, but are not limited to, zinc oxynitride, indium oxynitride, gallium oxynitride, tin oxynitride, cadmium oxynitride, aluminum oxynitride, germanium oxynitride, titanium oxynitride, silicon oxynitride, or any combination thereof. In one example, the material in common is indium gallium zinc oxide. In another example, the material in common is indium zinc oxide. In another example, the material in common is indium tin oxide.

Examples of impurities include, but are not limited to, boron, fluorine, argon, phosphorus, hydrogen, helium, neon, nitrogen, arsenic, antimony, aluminum, magnesium, and silicon, or any combination thereof. Additional examples of impurities include gallium, indium, carbon, tin, silicon, germanium, krypton, xenon, chlorine, titanium, chromium, nickel, zinc, gallium, germanium, yttrium, zirconium, niobium, molybdenum, lanthanum, cerium, neodymium, hafnium, tantalum, and tungsten.

In some embodiments, the first portion of the anode material layer has a higher conductivity than a conductivity of the second portion of the anode material layer.

In some embodiments, the first portion of the anode material layer has a higher work function than a work function of the second portion of the anode material layer. In some embodiments, the display substrate further includes a functional material layer on a side of the anode material layer away from a base substrate. The functional material layer is in direct contact with the first portion and with the second portion. For example, in one example, the display substrate further includes a hole injection material layer on a side of the anode material layer away from a base substrate. The hole injection material layer is in direct contact with the first portion and with the second portion.

In some embodiments, a difference between a highest occupied molecular orbital level of the second portion of the anode material layer and a highest occupied molecular orbital level of the functional material layer in direct contact with the second portion is greater than a difference between a highest occupied molecular orbital level of the first portion of the anode material layer and a highest occupied molecular orbital level of the functional material layer in direct contact with the first portion. The first portion of the anode material layer has a better energy level matching with the functional material layer in direct contact with the first portion than an energy level matching between the second portion of the anode material layer and the functional material layer in direct contact with the second portion. Because the first portion of the anode material layer has an energy level matching with the functional material layer, carriers (e.g., holes) can transport from the first portion to the functional material layer. Because the second portion of the anode material layer does not have an energy level matching with the functional material layer, carriers (e.g., holes) cannot transport from the second portion to the functional material layer. Accordingly, the region having the second portion of the anode material layer does not emit light, even though a light emitting material may be present in that region. As discussed above in FIG. 13 and associated texts, the second portion of the anode material layer also effectively reduces crosstalk current between adjacent subpixels (e.g., in regions corresponding to first portions of the anode material layer).

In some embodiments, the second anode material layer AML2 includes multiple sub-layers. In one example, the second anode material layer AML2 includes a first sub-layer comprising indium tin oxide, a second sub-layer comprising silver on the first sub-layer, and a third sub-layer comprising indium tin oxide on a side of the second sub-layer away from the first sub-layer. The third sub-layer is in direct contact with the first anode material layer AML1.

Figure 15A:
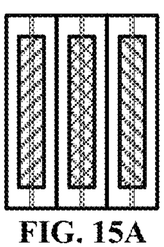
FIG. 15A illustrates the structure of a respective unit in a display substrate in some embodiments according to the present disclosure.
Figure 15B:
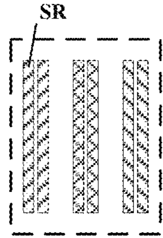
FIG. 15B illustrates subpixel regions in the respective unit depicted in FIG. 15A.
Figure 15C:
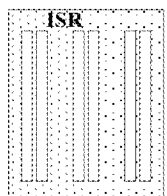
FIG. 15C illustrates an inter-subpixel region in the respective unit depicted in FIG. 15A.
Figure 15D:
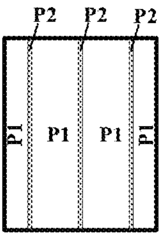
FIG. 15D illustrates an anode material layer in the respective unit depicted in FIG. 15A.
Figure 15E:
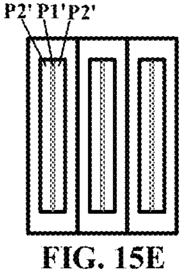
FIG. 15E illustrates a functional material layer in the respective unit depicted in FIG. 15A.

FIG. 15A illustrates the structure of a respective unit in a display substrate in some embodiments according to the present disclosure. FIG. 15B illustrates subpixel regions in the respective unit depicted in FIG. 15A. FIG. 15C illustrates an inter-subpixel region in the respective unit depicted in FIG. 15A. FIG. 15D illustrates an anode material layer in the respective unit depicted in FIG. 15A. FIG. 15E illustrates a functional material layer in the respective unit depicted in FIG. 15A. The respective unit depicted in FIG. 15A to FIG. 15C corresponds to a respective initial unit depicted in FIG. 3 and FIG. 4. Referring to FIG. 15A to FIG. 15C, the display substrate in some embodiments includes subpixel regions SR and an inter-subpixel region ISR. As shown in FIG. 15A to FIG. 15C, at least a respective subpixel region of the subpixel regions SR is substantially surrounded by the inter-subpixel region ISR.

In some embodiments, the display substrate includes an anode material layer. A first portion P1 of the anode material layer is subject to the impurity doping, a second portion P2 of the anode material layer is not subject to the impurity doping, as discussed above.

In some embodiments, the display substrate further includes a functional material layer (e.g., a light emitting layer). A first portion P1' of the functional material layer is subject to the impurity doping, a second portion P2' of the functional material layer is not subject to the impurity doping.

In some embodiments, a doping concentration of the first portion P1' of the functional material layer is higher than a doping concentration of the first portion P1 of the anode material layer. Optionally, the doping concentration of the first portion P1' of the functional material layer is at least 2 times (e.g., 3 times, 4 times, 5 times, 6 times, 7 times, 8 times, 9 times, 10 times, 20 times, 30 times, 40 times, 50 times, 60 times, 70 times, 80 times, 90 times, 100 times, or more) of the doping concentration of the first portion P1 of the anode material layer.

In one example, the doped impurity in the first portion P1' of the functional material layer is the same as the doped impurity in the first portion P1 of the anode material layer.

In another example, the doped impurity in the first portion P1' of the functional material layer is different from the doped impurity in the first portion P1 of the anode material layer.

In some embodiments, the doped impurity is an inorganic impurity (for example, the doped impurity is not an organic material). In one example, the doped impurity is an ion. In another example, the doped impurity includes an inert gas ion. In another example, the doped impurity includes a non-metal ion. In another example, the doped impurity includes an ion of a group IA element (e.g., H). In another example, the doped impurity includes an ion of a group IIIA element (e.g., B). In another example, the doped impurity includes an ion of a group VA element (e.g., P). In another example, the doped impurity includes an ion of a group VIIA element (e.g., F). In another example, the doped impurity includes an ion of a group VIIIA element (e.g., Ar).

In some embodiments, an orthographic projection of the second portion P2 of the anode material layer on a base substrate at least partially overlaps with an orthographic projection of the first portion P1' of the functional material layer on the base substrate. In some embodiments, an orthographic projection of the first portion P1 of the anode material layer on a base substrate at least partially overlaps with an orthographic projection of the second portion P2' of the functional material layer on the base substrate.

In some embodiments, the second portion P2 of the anode material layer and the first portion P1' of the functional material layer are in the inter-subpixel region ISR. In some embodiments, the first portion P1 of the anode material layer is at least partially in the subpixel regions SR, and the second portion P2' of the functional material layer is at least partially in the subpixel regions SR.

Figure 16A:
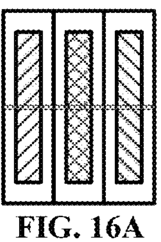
FIG. 16A illustrates the structure of a respective unit in a display substrate in some embodiments according to the present disclosure.
Figure 16B:
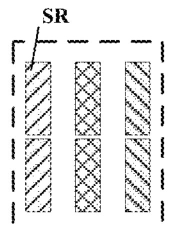
FIG. 16B illustrates subpixel regions in the respective unit depicted in FIG. 16A.
Figure 16C:
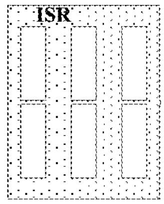
FIG. 16C illustrates an inter-subpixel region in the respective unit depicted in FIG. 16A.
Figure 16D:
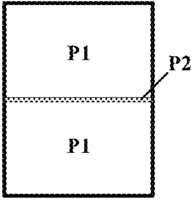
FIG. 16D illustrates an anode material layer in the respective unit depicted in FIG. 16A.
Figure 16E:
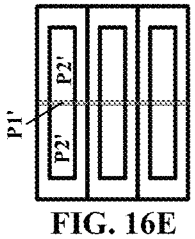
FIG. 16E illustrates a functional material layer in the respective unit depicted in FIG. 16A.

FIG. 16A illustrates the structure of a respective unit in a display substrate in some embodiments according to the present disclosure. FIG. 16B illustrates subpixel regions in the respective unit depicted in FIG. 16A. FIG. 16C illustrates an inter-subpixel region in the respective unit depicted in FIG. 16A. FIG. 16D illustrates an anode material layer in the respective unit depicted in FIG. 16A. FIG. 16E illustrates a functional material layer in the respective unit depicted in FIG. 16A. The embodiment depicted in FIG. 16A to FIG. 16E differs from the embodiment depicted in FIG. 15A to FIG. 15E in that the second portion P2 of the anode material layer in FIG. 16A to FIG. 16E extends along a row direction whereas the second portion P2 of the anode material layer in FIG. 15A to FIG. 15E extends along a column direction. The first portion P1' of the functional material layer in FIG. 16A to FIG. 16E extends along a row direction whereas the first portion P1' of the functional material layer in FIG. 15A to FIG. 15E extends along a column direction.

Figure 17A:
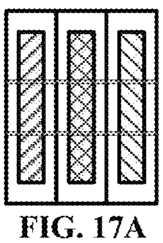
FIG. 17A illustrates the structure of a respective unit in a display substrate in some embodiments according to the present disclosure.
Figure 17B:
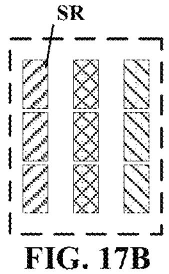
FIG. 17B illustrates subpixel regions in the respective unit depicted in FIG. 17A.
Figure 17C:
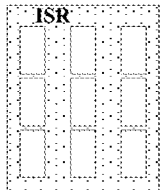
FIG. 17C illustrates an inter-subpixel region in the respective unit depicted in FIG. 17A.
Figure 17D:
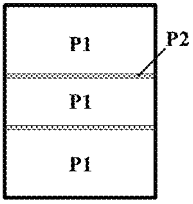
FIG. 17D illustrates an anode material layer in the respective unit depicted in FIG. 17A.
Figure 17E:
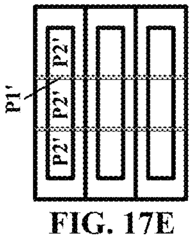
FIG. 17E illustrates a functional material layer in the respective unit depicted in FIG. 17A.

FIG. 17A illustrates the structure of a respective unit in a display substrate in some embodiments according to the present disclosure. FIG. 17B illustrates subpixel regions in the respective unit depicted in FIG. 17A. FIG. 17C illustrates an inter-subpixel region in the respective unit depicted in FIG. 17A. FIG. 17D illustrates an anode material layer in the respective unit depicted in FIG. 17A. FIG. 17E illustrates a functional material layer in the respective unit depicted in FIG. 17A. Referring to FIG. 17A to FIG. 17E, the anode material layer in the respective unit includes two rows of second portions. The functional material layer in the respective unit includes two rows of first portions.

Figure 18A:
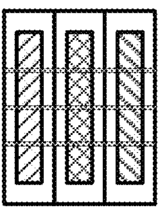
FIG. 18A illustrates the structure of a respective unit in a display substrate in some embodiments according to the present disclosure.
Figure 18B:
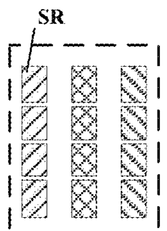
FIG. 18B illustrates subpixel regions in the respective unit depicted in FIG. 18A.
Figure 18C:
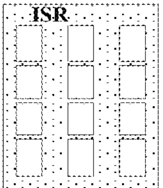
FIG. 18C illustrates an inter-subpixel region in the respective unit depicted in FIG. 18A.
Figure 18D:
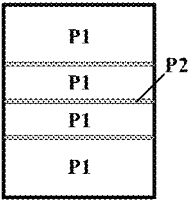
FIG. 18D illustrates an anode material layer in the respective unit depicted in FIG. 18A.
Figure 18E:
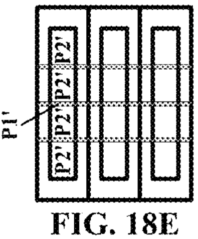
FIG. 18E illustrates a functional material layer in the respective unit depicted in FIG. 18A.

FIG. 18A illustrates the structure of a respective unit in a display substrate in some embodiments according to the present disclosure. FIG. 18B illustrates subpixel regions in the respective unit depicted in FIG. 18A. FIG. 18C illustrates an inter-subpixel region in the respective unit depicted in FIG. 18A. FIG. 18D illustrates an anode material layer in the respective unit depicted in FIG. 18A. FIG. 18E illustrates a functional material layer in the respective unit depicted in FIG. 18A. Referring to FIG. 18A to FIG. 18E, the anode material layer in the respective unit includes three rows of second portions. The functional material layer in the respective unit includes three rows of first portions.

Figure 19A:
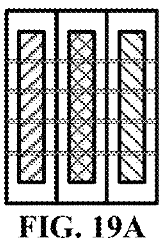
FIG. 19A illustrates the structure of a respective unit in a display substrate in some embodiments according to the present disclosure.
Figure 19B:
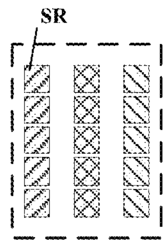
FIG. 19B illustrates subpixel regions in the respective unit depicted in FIG. 19A.
Figure 19C:
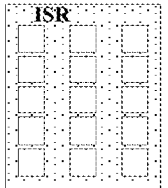
FIG. 19C illustrates an inter-subpixel region in the respective unit depicted in FIG. 19A.
Figure 19D:
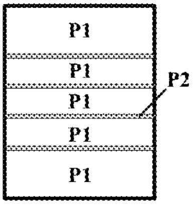
FIG. 19D illustrates an anode material layer in the respective unit depicted in FIG. 19A.
Figure 19E:
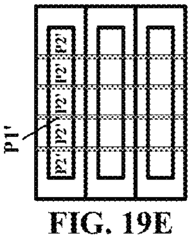
FIG. 19E illustrates a functional material layer in the respective unit depicted in FIG. 19A.
Figure 21D:
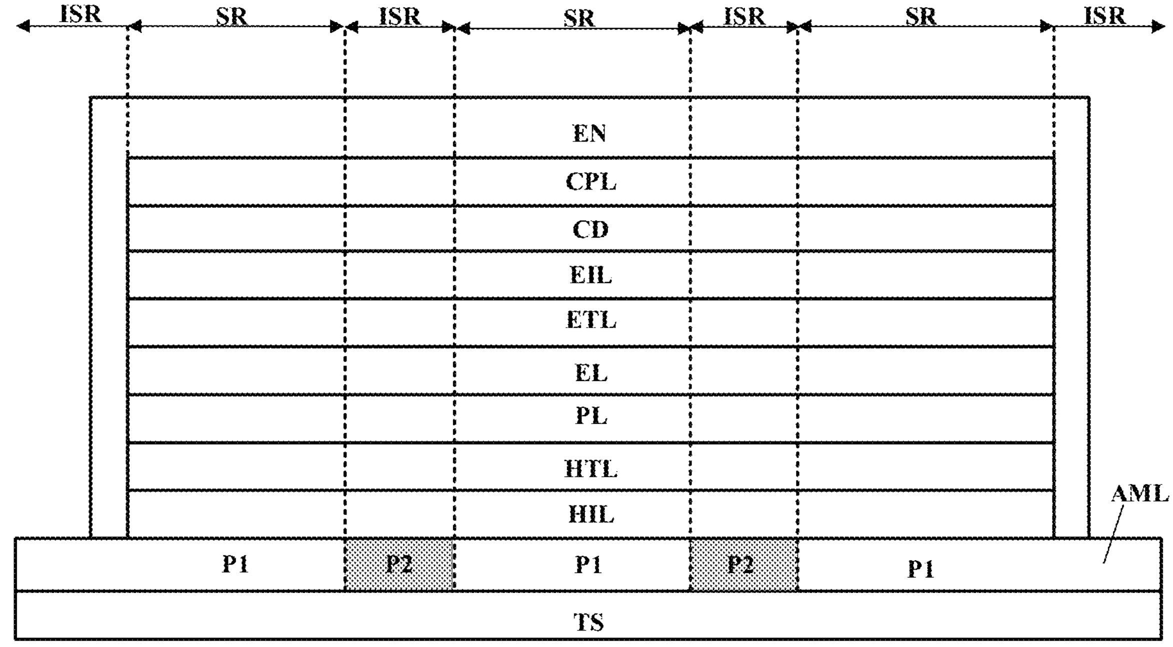
Figure 21E:
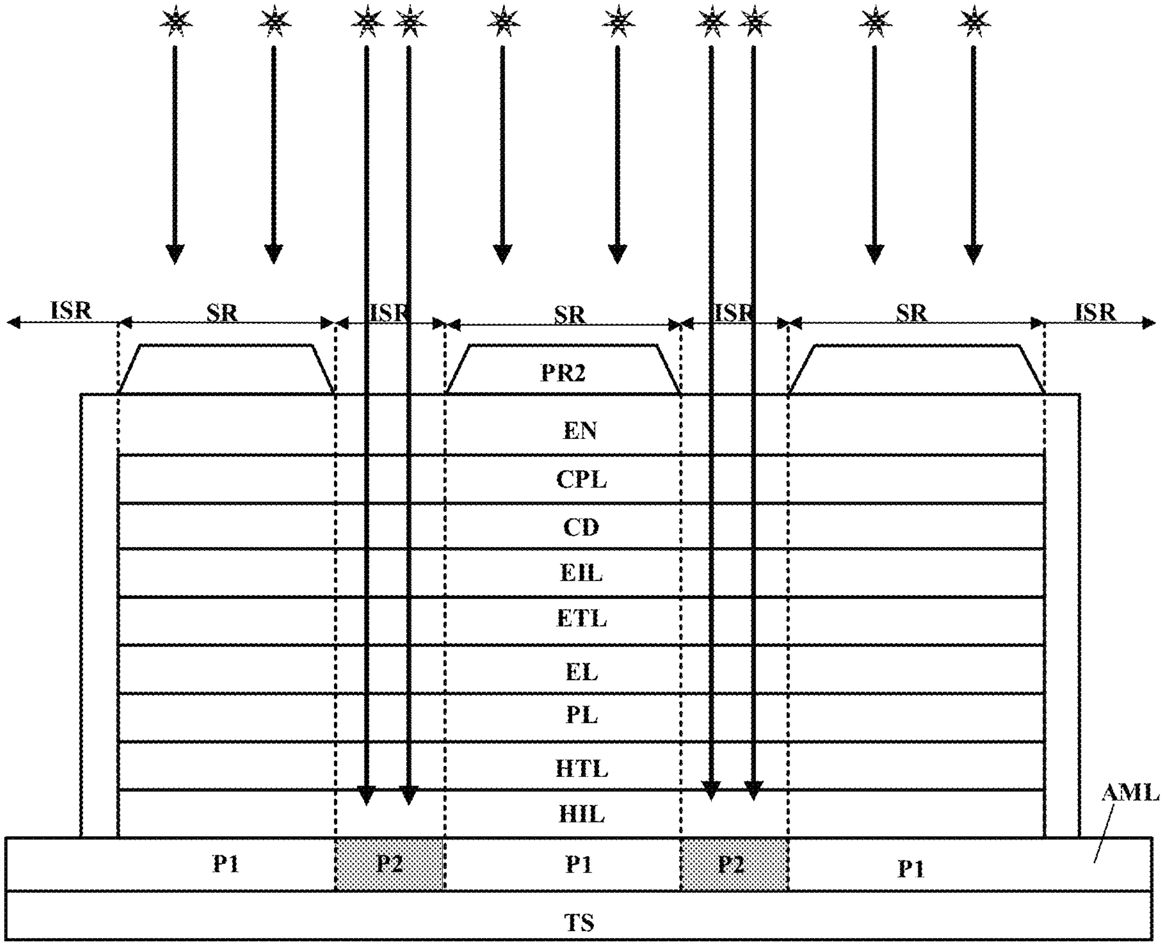
Figure 21F:
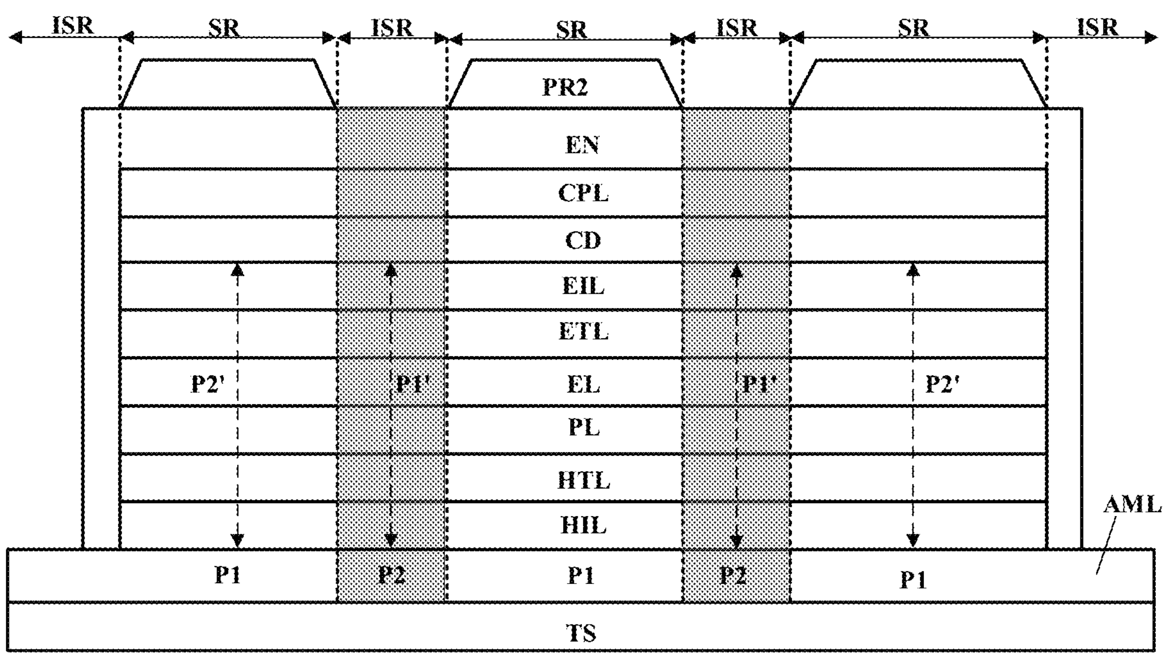
Figure 21G:
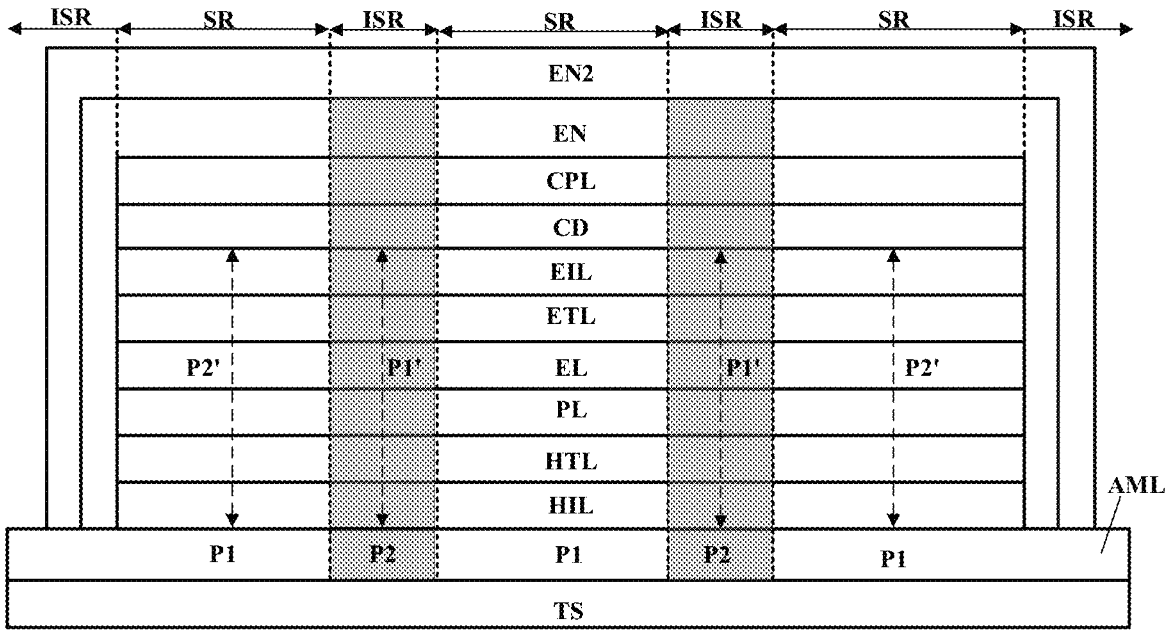

FIG. 19A illustrates the structure of a respective unit in a display substrate in some embodiments according to the present disclosure. FIG. 19B illustrates subpixel regions in the respective unit depicted in FIG. 19A. FIG. 19C illustrates an inter-subpixel region in the respective unit depicted in FIG. 19A. FIG. 19D illustrates an anode material layer in the respective unit depicted in FIG. 19A. FIG. 19E illustrates a functional material layer in the respective unit depicted in FIG. 19A. Referring to FIG. 19A to FIG. 19E, the anode material layer in the respective unit includes four rows of second portions. The functional material layer in the respective unit includes four rows of first portions.

FIG. 20A illustrates the structure of a respective unit in a display substrate in some embodiments according to the present disclosure. FIG. 20B illustrates subpixel regions in the respective unit depicted in FIG. 20A. FIG. 20C illustrates an inter-subpixel region in the respective unit depicted in FIG. 20A. FIG. 20D illustrates an anode material layer in the respective unit depicted in FIG. 20A. FIG. 20E illustrates a functional material layer in the respective unit depicted in FIG. 20A. Referring to FIG. 20A to FIG. 20E, the anode material layer in the respective unit includes four rows and three columns of second portions. The functional material layer in the respective unit includes four rows and three columns of first portions.

Figure 14D:
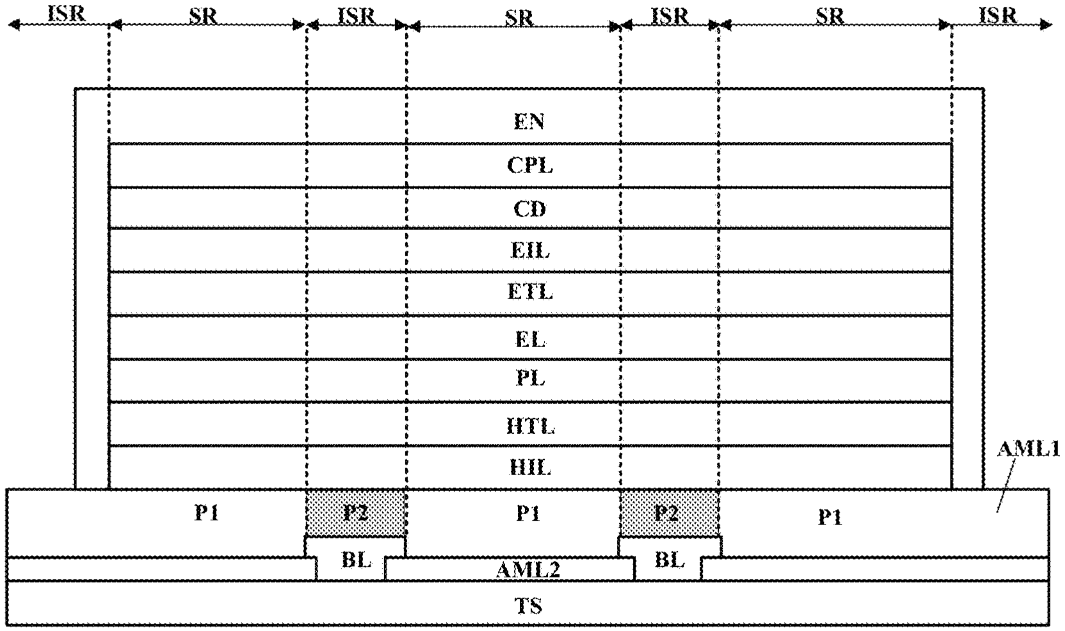

Referring to FIG. 14D, subsequent to forming the first anode material layer AML1 and the second anode material layer AML2, a plurality of functional material layers are formed on a side of the first anode material layer AML1 away from the transistor substrate TS, a cathode CD is formed on a side of the plurality of functional material layers away from the first anode material layer AML1, optionally a capping layer CPL is formed on a side of the cathode CD away from the first anode material layer AML1, and an encapsulating layer EN is formed on a side of the cathode CD away from the first anode material layer AML1.

In some embodiments, the plurality of functional material layers includes a light emitting layer EL (e.g., a red light emitting layer, a green light emitting layer, or a blue light emitting layer). Optionally, the plurality of functional material layers includes a hole injection layer HIL on the first anode material layer AML1, a hole transport layer HTL on a side of the hole injection layer HIL away from the first anode material layer AML1, a prime layer PL on a side of the hole transport layer HTL away from the first anode material layer AML1, a light emitting layer EL on a side of the prime layer PL away from the first anode material layer AML1, an electron transport layer ETL on a side of the light emitting layer EL away from the first anode material layer AML1, and an electron injection layer EIL on a side of the electron transport layer ETL away from the first anode material layer AML1.

Figure 14E:
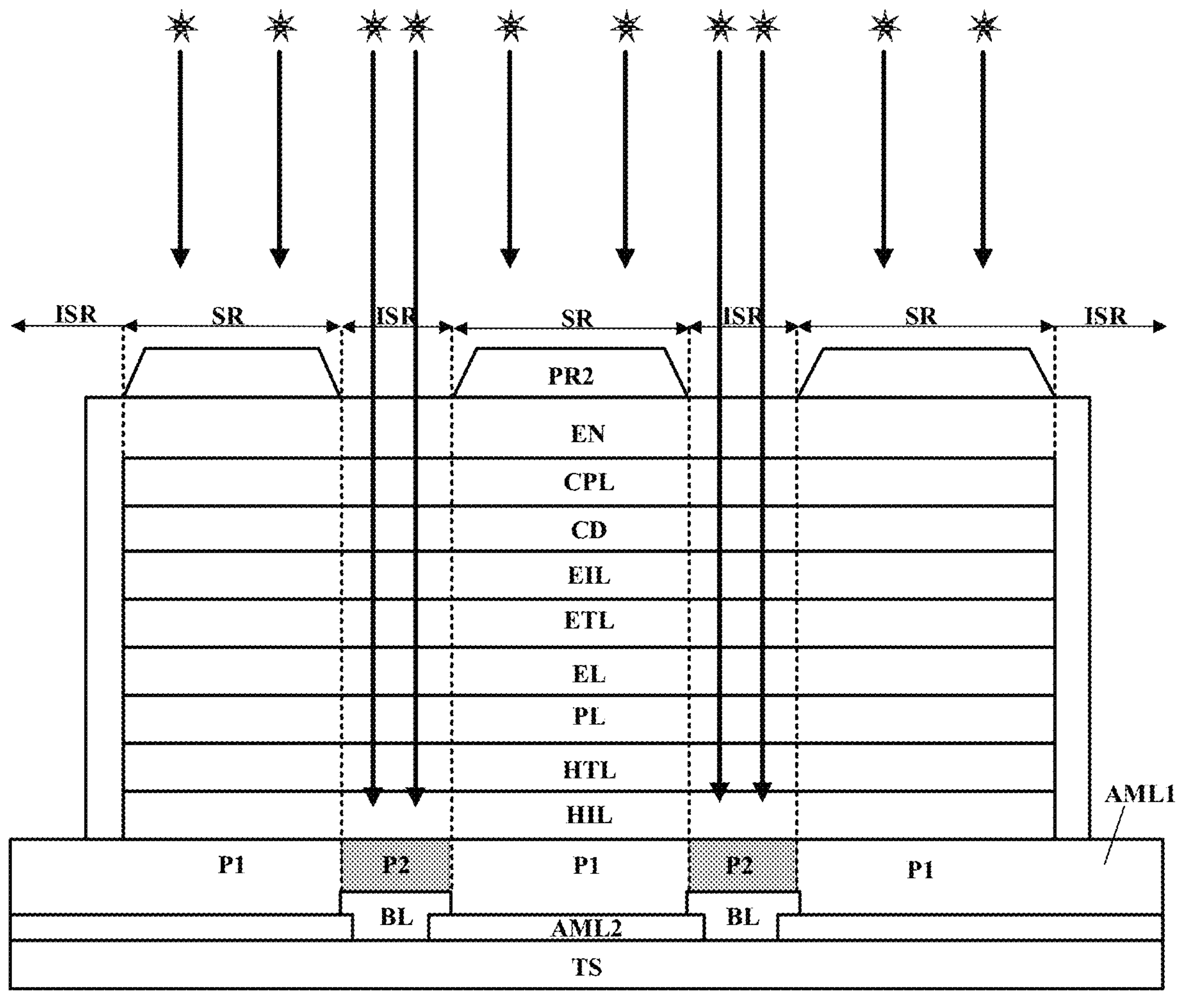

Referring to FIG. 14E, a second protection layer PR2 is formed on a side of the encapsulating layer EN away from the first anode material layer AML1. The second protection layer PR2 is formed in the subpixel regions SR, and is absent in the inter-subpixel region ISR. In one example, the second protection layer PR2 includes a photoresist material. Doping of an impurity, e.g., by ion implantation, is performed. In regions not covered by the second protection layer PR2, the plurality of functional material layers are subject to the doping from ion implantation.

Figure 14F:
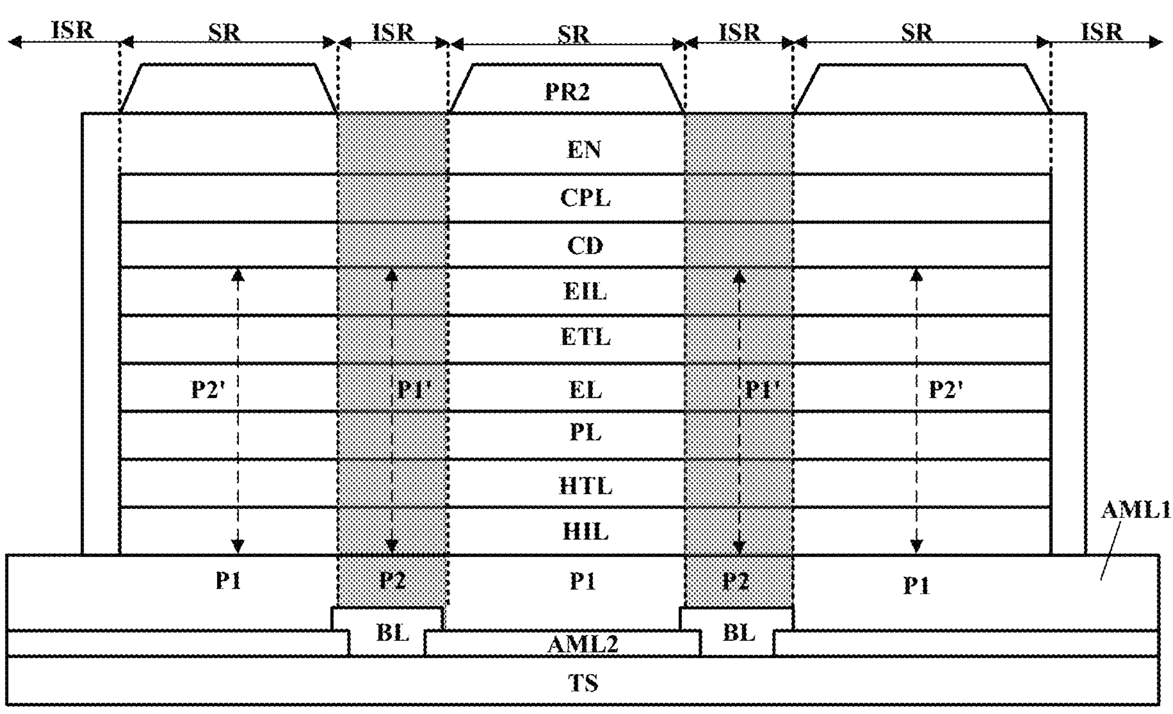

Referring to FIG. 14F, subsequent to the doping, a first portion P1' of the plurality of functional material layers is formed in the inter-subpixel region ISR, and a second portion P2' of the plurality of functional material layers is formed in the subpixel regions SR. The first portion P1' of the plurality of functional material layers is subject to the impurity doping, the second portion P2' of the plurality of functional material layers is not subject to the impurity doping.

In some embodiments, the first portion P1' of the plurality of functional material layers includes an impurity doped by the ion implantation. In some embodiments, the first portion P1' and the second portion P2' of each of the plurality of functional material layers include at least one functional material in common. In some embodiments, a weight percentage of the impurity in the first portion P1' is higher than a weight percentage of the impurity in the second portion P2'. Optionally, the impurity is absent in the second portion P2'. In some embodiments, a weight ratio of the impurity to the at least one functional material in common in the first portion P1' is higher than a weight ratio of the impurity to the at least one functional material in common in the second portion P2'. Optionally, the weight ratio of the impurity to the at least one functional material in common in the second portion P2' in at least one of a hole transport layer HTL, a hole injection layer HIL, an electron transport layer ETL, or an electron injection layer EIL is substantially zero (e.g., less than 0.001%, less than 0.0009%, less than 0.0008%, less than 0.0007%, less than 0.0006%, than 0.0005%, less than 0.0004%, less than 0.0003%, less than 0.0002%, or less than 0.0001%).

Examples of the functional materials in common include any of a light emitting material, a hole transport material, a hole injection material, an electron transport material, an electron injection material, a charge generation material, a hole barrier material, and an electron barrier material.

Examples of impurities include, but are not limited to, boron, fluorine, argon, phosphorus, hydrogen, helium, neon, nitrogen, arsenic, antimony, aluminum, magnesium, and silicon, or any combination thereof. Additional examples of impurities include gallium, indium, carbon, tin, silicon, germanium, krypton, xenon, chlorine, titanium, chromium, nickel, zinc, gallium, germanium, yttrium, zirconium, niobium, molybdenum, lanthanum, cerium, neodymium, hafnium, tantalum, and tungsten.

In some embodiments, the first portion P1' of the plurality of functional material layers is subject to deterioration and/or decomposition by the ion implantation process. As a result, the first portion P1' of the plurality of functional material layers is not capable of emitting light. Moreover, the first portion P1' of the plurality of functional material layers functions as a barrier for reducing crosstalk current between adjacent subpixels. As discussed above, the crosstalk current between adjacent subpixels is further reduced by the second portion P2 of the first anode material layer AML1. A combination of the first portion P1' of the plurality of functional material layers and the second portion P2 of the first anode material layer AML1 significantly reduced crosstalk current between adjacent subpixels.

Figure 14G:
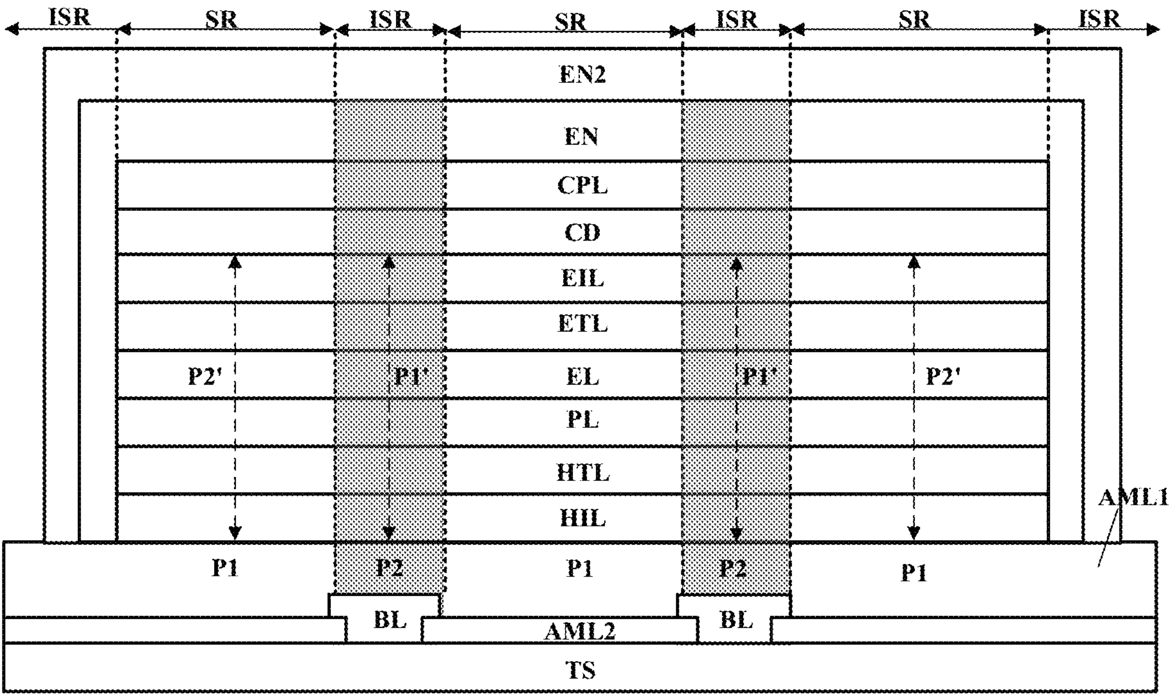

Referring to FIG. 14G, subsequent to the ion implantation, the second protection layer PR2 is removed, e.g., by ashing. A second encapsulating layer EN2 is formed on a side of the encapsulating layer EN away from the first anode material layer AML1, encapsulating the plurality of functional material layers. The inventors of the present disclosure discover that individual subpixels of the display substrate can be achieved by ion implantation, accurately and precisely defining light emission regions (e.g., the subpixel regions SR) and non-emitting regions (e.g., the inter-subpixel region ISR). Crosstalk current between adjacent subpixels can also be effectively suppressed, achieving ultra-high resolution display.

In one example, the first anode material layer AML1 comprises indium gallium tin oxide.

In another example, the first anode material layer AML1 comprises indium zinc oxide.

FIG. 21A to FIG. 21G illustrate a process of doping an anode material layer in some embodiments according to the present disclosure. The process and the display substrate depicted in FIG. 21A to FIG. 21G differs from those depicted in FIG. 14A to FIG. 14G in that, in the process and the display substrate depicted in FIG. 21A to FIG. 21G, only one initial anode material layer (an initial anode material layer IAML in FIG. 21A) is used, whereas two initial anode material layers (a first initial anode material layer IAML1 and a second initial anode material layer AML2 depicted in FIG. 14A) are used in the process and the display substrate depicted in FIG. 14A to FIG. 14G. Ion implantation is performed on the initial anode material layer IAML to form an anode material layer AML having a first portion P1 and a second portion P2. The first portion P1 of the anode material layer AML is subject to the impurity doping, the second portion P2 of the anode material layer AML is not subject to the impurity doping.

In some embodiments, the anode material layer AML includes multiple sub-layers. In one example, the anode material layer AML includes a first sub-layer comprising indium tin oxide, a second sub-layer comprising silver on the first sub-layer, and a third sub-layer comprising indium tin oxide on a side of the second sub-layer away from the first sub-layer. The third sub-layer is in direct contact with the plurality of functional material layers. In this case, at least the second sub-layer is patterned to form a plurality of blocks spaced apart from each other, each block corresponding to a subpixel. In one example, ion implantation is performed on the indium tin oxide material in the anode material layer AML. As a result of the ion implantation, the first portion P1 of the anode material layer AML has a higher conductivity than a conductivity of the second portion P2 of the anode material layer AML. Optionally, the first portion P1 of the anode material layer AML has a higher work function than a work function of the second portion P2 of the anode material layer AML. Optionally, a difference between a highest occupied molecular orbital level of the second portion P2 of the anode material layer AML and a highest occupied molecular orbital level of the functional material layer in direct contact with the second portion P2 is greater than a difference between a highest occupied molecular orbital level of the first portion P1 of the anode material layer AML and a highest occupied molecular orbital level of the functional material layer in direct contact with the first portion P1.

The process described in the present disclosure can be applied to display substrates of various appropriate formats. For example, the display substrate in some embodiments is a display substrate comprising a light emitting layer of a single color (e.g., the display substrate depicted in FIG. 14G and FIG. 21G). In another example, the display substrate in some embodiments is a full-color display substrate that includes subpixels of different colors such as a red subpixel, a green subpixel, and a blue subpixel. The full-color display substrate may be fabricated using a process similar to that depicted in FIG. 14A to FIG. 14G.

Figure 22:
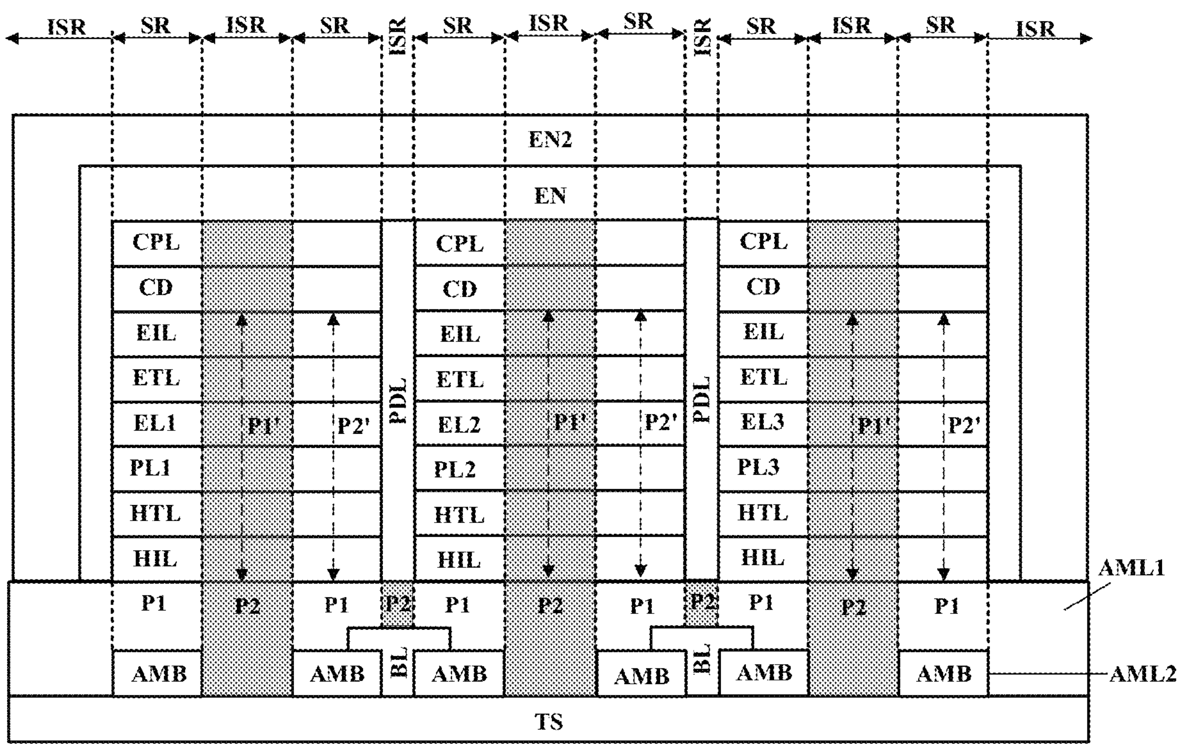
FIG. 22 illustrates the structure of a portion of a display substrate in some embodiments according to the present disclosure.

FIG. 22 illustrates the structure of a portion of a display substrate in some embodiments according to the present disclosure. Referring to FIG. 22, the display substrate in some embodiments includes a transistor substrate TS, a second anode material layer AML2 on the transistor substrate TS, and a first anode material layer AML1 on a side of the second anode material layer AML2 away from the transistor substrate TS. In some embodiments, the first anode material layer AML1 extends at least partially across multiple subpixels in the display substrate. In some embodiments, the first anode material layer AML1 includes a first portion P1 doped with an impurity and a second portion P2 that is not subject to a doping of the impurity. The first portion P1 is in the impurity region and at least partially in a respective subpixel region SR, and the second portion P2 is at least partially in the inter-subpixel region ISR.

In some embodiments, the first portion P1 and the second portion P2 include at least one material in common. In some embodiments, a weight percentage of the impurity in the first portion P1 is higher than a weight percentage of the impurity in the second portion P2. Optionally, the impurity is absent in the second portion P2. In some embodiments, a weight ratio of the impurity to the at least one material in common in the first portion P1 is higher than a weight ratio of the impurity to the at least one material in common in the second portion P2. Optionally, the weight ratio of the impurity to the at least one material in common in the second portion P2 is substantially zero (e.g., less than 0.001%, less than 0.0009%, less than 0.0008%, less than 0.0007%, less than 0.0006%, than 0.0005%, less than 0.0004%, less than 0.0003%, less than 0.0002%, or less than 0.0001%).

In some embodiments, the first portion P1 and the second portion P2 of the first anode material layer AML1 include a semiconductor material in common. Optionally, the semiconductor material in common is a metal oxide material in common or a metal oxynitride material in common.

In some embodiments, the first portion P1 of the first anode material layer AML1 has a higher conductivity than a conductivity of the second portion P2 of the first anode material layer AML1. In some embodiments, the first portion P1 of the first anode material layer AML1 has a higher work function than a work function of the second portion P2 of the first anode material layer AML1. In some embodiments, a difference between a highest occupied molecular orbital level of the second portion P2 of the first anode material layer AML1 and a highest occupied molecular orbital level of the functional material layer in direct contact with the second portion P2 is greater than a difference between a highest occupied molecular orbital level of the first portion P1 of the first anode material layer AML1 and a highest occupied molecular orbital level of the functional material layer in direct contact with the first portion P1.

In some embodiments, the display substrate further includes a plurality of first functional material layers. In some embodiments, the plurality of first functional material layers extend at least partially across multiple subpixels (e.g., multiple subpixels of a first color) in the display substrate. In some embodiments, the plurality of first functional material layers include a hole injection layer HIL on the first anode material layer AML1, a hole transport layer HTL on a side of the hole injection layer HIL away from the first anode material layer AML1, a first prime layer PL1 on a side of the hole transport layer HTL away from the first anode material layer AML1, a first light emitting layer EL1 on a side of the first prime layer PL1 away from the first anode material layer AML1, an electron transport layer ETL on a side of the first light emitting layer EL1 away from the first anode material layer AML1, and an electron injection layer EIL on a side of the electron transport layer ETL away from the first anode material layer AML1.

In some embodiments, the plurality of first functional material layers include a first portion P1' in the inter-subpixel region ISR, and a second portion P2' in the subpixel regions SR. The first portion P1' of the plurality of first functional material layers is subject to the impurity doping, the second portion P2' of the plurality of first functional material layers is not subject to the impurity doping. In some embodiments, the first portion P1' of the plurality of first functional material layers is not capable of emitting light. Moreover, the first portion P1' of the plurality of first functional material layers functions as a barrier for reducing crosstalk current between adjacent subpixels (e.g., adjacent subpixels of a first color).

In some embodiments, the first portion P1' of the plurality of first functional material layers includes an impurity doped by the ion implantation. In some embodiments, the first portion P1' and the second portion P2' of each of the plurality of first functional material layers include at least one functional material in common. In some embodiments, a weight percentage of the impurity in the first portion P1' is higher than a weight percentage of the impurity in the second portion P2'. Optionally, the impurity is absent in the second portion P2'. In some embodiments, a weight ratio of the impurity to the at least one functional material in common in the first portion P1' is higher than a weight ratio of the impurity to the at least one functional material in common in the second portion P2'. Optionally, the weight ratio of the impurity to the at least one functional material in common in the second portion P2' in at least one of a hole transport layer HTL, a hole injection layer HIL, an electron transport layer ETL, or an electron injection layer EIL is substantially zero (e.g., less than 0.001%, less than 0.0009%, less than 0.0008%, less than 0.0007%, less than 0.0006%, than 0.0005%, less than 0.0004%, less than 0.0003%, less than 0.0002%, or less than 0.0001%).

In some embodiments, the display substrate further includes a plurality of second functional material layers. In some embodiments, the plurality of second functional material layers extend at least partially across multiple subpixels (e.g., multiple subpixels of a second color) in the display substrate. In some embodiments, the plurality of second functional material layers include a hole injection layer HIL on the first anode material layer AML1, a hole transport layer HTL on a side of the hole injection layer HIL away from the first anode material layer AML1, a second prime layer PL2 on a side of the hole transport layer HTL away from the first anode material layer AML1, a second light emitting layer EL2 on a side of the second prime layer PL2 away from the first anode material layer AML1, an electron transport layer ETL on a side of the second light emitting layer EL2 away from the first anode material layer AML1, and an electron injection layer EIL on a side of the electron transport layer ETL away from the first anode material layer AML1.

In some embodiments, the plurality of second functional material layers include a first portion P1' in the inter-subpixel region ISR, and a second portion P2' in the subpixel regions SR. The first portion P1' of the plurality of second functional material layers is subject to the impurity doping, the second portion P2' of the plurality of second functional material layers is not subject to the impurity doping. In some embodiments, the first portion P1' of the plurality of second functional material layers is not capable of emitting light. Moreover, the first portion P1' of the plurality of second functional material layers functions as a barrier for reducing crosstalk current between adjacent subpixels (e.g., adjacent subpixels of a second color).

In some embodiments, the first portion P1' of the plurality of second functional material layers includes an impurity doped by the ion implantation. In some embodiments, the first portion P1' and the second portion P2' of each of the plurality of second functional material layers include at least one functional material in common. In some embodiments, a weight percentage of the impurity in the first portion P1' is higher than a weight percentage of the impurity in the second portion P2'. Optionally, the impurity is absent in the second portion P2'. In some embodiments, a weight ratio of the impurity to the at least one functional material in common in the first portion P1' is higher than a weight ratio of the impurity to the at least one functional material in common in the second portion P2'. Optionally, the weight ratio of the impurity to the at least one functional material in common in the second portion P2' in at least one of a hole transport layer HTL, a hole injection layer HIL, an electron transport layer ETL, or an electron injection layer EIL is substantially zero (e.g., less than 0.001%, less than 0.0009%, less than 0.0008%, less than 0.0007%, less than 0.0006%, than 0.0005%, less than 0.0004%, less than 0.0003%, less than 0.0002%, or less than 0.0001%).

In some embodiments, the display substrate further includes a plurality of third functional material layers. In some embodiments, the plurality of third functional material layers extend at least partially across multiple subpixels (e.g., multiple subpixels of a third color) in the display substrate. In some embodiments, the plurality of third functional material layers include a hole injection layer HIL on the first anode material layer AML1, a hole transport layer HTL on a side of the hole injection layer HIL away from the first anode material layer AML1, a third prime layer PL3 on a side of the hole transport layer HTL away from the first anode material layer AML1, a third light emitting layer EL3 on a side of the third prime layer PL3 away from the first anode material layer AML1, an electron transport layer ETL on a side of the third light emitting layer EL3 away from the first anode material layer AML1, and an electron injection layer EIL on a side of the electron transport layer ETL away from the first anode material layer AML1.

In some embodiments, the plurality of third functional material layers include a first portion P1' in the inter-subpixel region ISR, and a second portion P2' in the subpixel regions SR. The first portion P1' of the plurality of third functional material layers is subject to the impurity doping, the second portion P2' of the plurality of third functional material layers is not subject to the impurity doping. In some embodiments, the first portion P1' of the plurality of third functional material layers is not capable of emitting light. Moreover, the first portion P1' of the plurality of third functional material layers functions as a barrier for reducing crosstalk current between adjacent subpixels (e.g., adjacent subpixels of a third color).

In some embodiments, the first portion P1' of the plurality of third functional material layers includes an impurity doped by the ion implantation. In some embodiments, the first portion P1' and the second portion P2' of each of the plurality of third functional material layers include at least one functional material in common. In some embodiments, a weight percentage of the impurity in the first portion P1' is higher than a weight percentage of the impurity in the second portion P2'. Optionally, the impurity is absent in the second portion P2'. In some embodiments, a weight ratio of the impurity to the at least one functional material in common in the first portion P1' is higher than a weight ratio of the impurity to the at least one functional material in common in the second portion P2'. Optionally, the weight ratio of the impurity to the at least one functional material in common in the second portion P2' in at least one of a hole transport layer HTL, a hole injection layer HIL, an electron transport layer ETL, or an electron injection layer EIL is substantially zero (e.g., less than 0.001%, less than 0.0009%, less than 0.0008%, less than 0.0007%, less than 0.0006%, than 0.0005%, less than 0.0004%, less than 0.0003%, less than 0.0002%, or less than 0.0001%).

Referring to FIG. 22, the display substrate in some embodiments further includes a pixel definition layer PDL and a plurality of apertures extending through the pixel definition layer PDL. In some embodiments, the plurality of first functional material layers are in a first respective aperture of the plurality of apertures, the plurality of second functional material layers are in a second respective aperture of the plurality of apertures, and the plurality of third functional material layers are in a third respective aperture of the plurality of apertures.

In some embodiments, an orthographic projection of the second portion P2 of the first anode material layer AML1 on a base substrate at least partially overlaps with an orthographic projection of the first portion P1' of the plurality of first functional material layers on the base substrate. In some embodiments, an orthographic projection of the first portion P1 of the first anode material layer AML1 on a base substrate at least partially overlaps with an orthographic projection of the second portion P2' of the plurality of first functional material layers on the base substrate.

In some embodiments, an orthographic projection of the second portion P2 of the first anode material layer AML1 on a base substrate at least partially overlaps with an orthographic projection of the first portion P1' of the plurality of second functional material layers on the base substrate. In some embodiments, an orthographic projection of the first portion P1 of the first anode material layer AML1 on a base substrate at least partially overlaps with an orthographic projection of the second portion P2' of the plurality of second functional material layers on the base substrate.

In some embodiments, an orthographic projection of the second portion P2 of the first anode material layer AML1 on a base substrate at least partially overlaps with an orthographic projection of the first portion P1' of the plurality of third functional material layers on the base substrate. In some embodiments, an orthographic projection of the first portion P1 of the first anode material layer AML1 on a base substrate at least partially overlaps with an orthographic projection of the second portion P2' of the plurality of third functional material layers on the base substrate.

In some embodiments, an orthographic projection of the pixel definition layer PDL on a base substrate at least partially overlaps with an orthographic projection of second portion P2 of the first anode material layer AML1 on the base substrate.

In the display substrate depicted in FIG. 22, the pixel definition layer PDL is formed using an insulating material.

In some embodiments, the display substrate further includes a bank layer BL on a side of the second anode material layer AML2 away from the transistor substrate TS, and on a side of the first anode material layer AML1 closer to the transistor substrate TS. In some embodiments, the second anode material layer AML2 includes a plurality of anode material blocks AMB spaced apart from each other. A respective anode material block of the plurality of anode material blocks AMB is at least partially in a respective subpixel region SR. Optionally, the respective anode material block includes at least a metallic sub-layer (e.g., a silver sub-layer) of the second anode material layer AML2. Optionally, the respective anode material block includes at least a metallic sub-layer (e.g., a silver sub-layer) and at least a non-metallic sub-layer (e.g., an indium tin oxide sub-layer) of the second anode material layer AML2. Optionally, the respective anode material block includes all sub-layers of the second anode material layer AML2.

In some embodiments, the bank layer BL is at least partially in a sub-region of the inter-subpixel region ISR where the pixel definition layer PDL is present, and is absent in a sub-region of the inter-subpixel region ISR where the pixel definition layer PDL is absent. Optionally, an orthographic projection of the bank layer BL on the transistor substrate TS at least partially overlaps with an orthographic projection of the pixel definition layer PDL on the transistor substrate TS. In some embodiments, the pixel definition layer PDL is present in a sub-region of the inter-subpixel region ISR between two adjacent light emitting layers of different colors, and is absent in a sub-region of the inter-subpixel region ISR between two adjacent light emitting layers of a same color. In some embodiments, the bank layer BL is present in a sub-region of the inter-subpixel region ISR between two adjacent light emitting layers of different colors, and is absent in a sub-region of the inter-subpixel region ISR between two adjacent light emitting layers of a same color.

In an alternative embodiment, the pixel definition layer PDL is present throughout the inter-subpixel region ISR. For example, the pixel definition layer PDL is present in a sub-region of the inter-subpixel region ISR between two adjacent light emitting layers of different colors, and is also present in a sub-region of the inter-subpixel region ISR between two adjacent light emitting layers of a same color.

In an alternative embodiment, the bank layer BL is present throughout the inter-subpixel region ISR. For example, the bank layer BL is present in a sub-region of the inter-subpixel region ISR between two adjacent light emitting layers of different colors, and is also present in a sub-region of the inter-subpixel region ISR between two adjacent light emitting layers of a same color.

Figure 23:
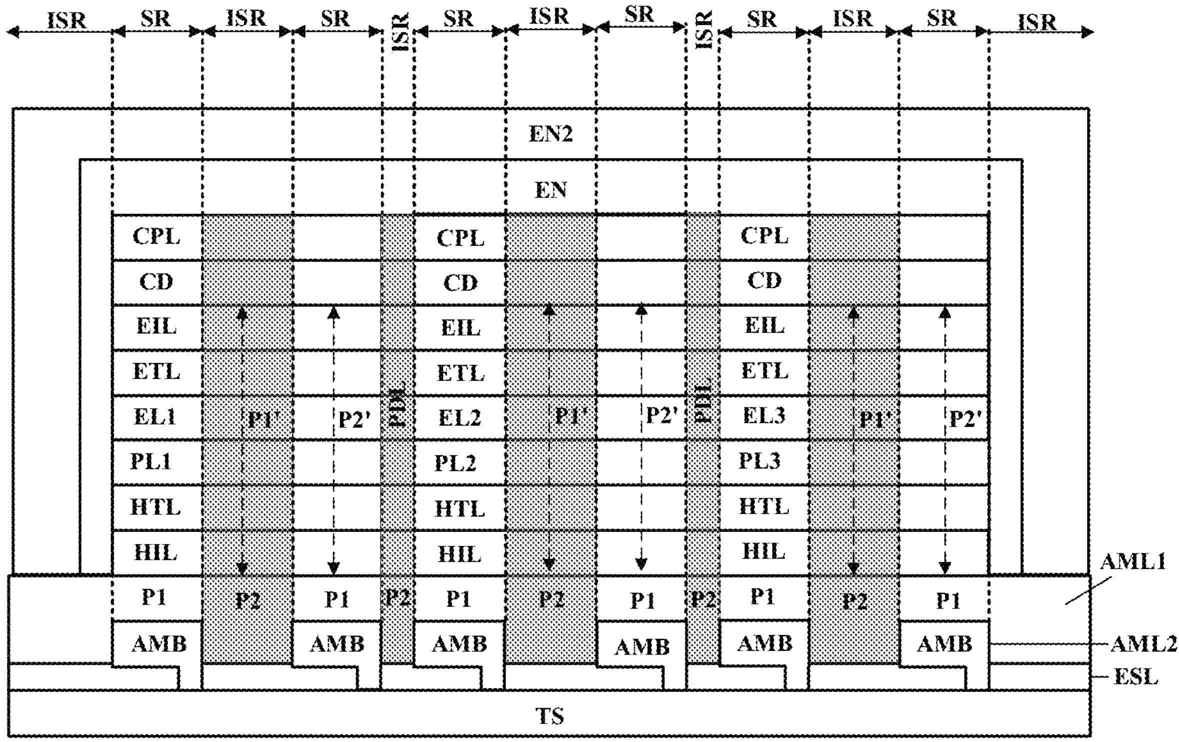
FIG. 23 illustrates the structure of a portion of a display substrate in some embodiments according to the present disclosure.

In some embodiments, the pixel definition layer PDL may be formed using functional materials doped with impurities. FIG. 23 illustrates the structure of a portion of a display substrate in some embodiments according to the present disclosure. Referring to FIG. 23, the display substrate includes a pixel definition layer PDL, the pixel definition layer PDL comprising a plurality of inter-pixel functional material layers. In one example, the plurality of inter-pixel functional material layers are the same as the plurality of first functional material layers. In another example, the plurality of inter-pixel functional material layers are the same as the plurality of second functional material layers. In another example, the plurality of inter-pixel functional material layers are the same as the plurality of third functional material layers. The plurality of inter-pixel functional material layers in the pixel definition layer PDL are doped with impurities. The impurity doping may be performed using a same process as the impurity doping of the first portion P1'. The plurality of inter-pixel functional material layers in the pixel definition layer PDL are not capable of emitting light, and are not conductive. The crosstalk current is suppressed by the pixel definition layer PDL.

In some embodiments, referring to FIG. 23, the second anode material layer AML2 includes a plurality of anode material blocks AMB spaced apart from each other. A respective anode material block of the plurality of anode material blocks AMB is at least partially in a respective subpixel region SR. Optionally, the respective anode material block includes at least a metallic sub-layer (e.g., a silver sub-layer) of the second anode material layer AML2. Optionally, the respective anode material block includes at least a metallic sub-layer (e.g., a silver sub-layer) and at least a non-metallic sub-layer (e.g., an indium tin oxide sub-layer) of the second anode material layer AML2. Optionally, the respective anode material block includes all sub-layers of the second anode material layer AML2.

In some embodiments, when the second anode material layer AML2 includes a metallic material, the display substrate may further include an etch stop layer ESL on a side of the second anode material layer AML2 closer to the transistor substrate TS. When dry etching is performed to form the second anode material layer AML2, the etch stop layer can effectively prevent over-etching on an underlying planarization layer.

In one example, the first anode material layer AML1 comprises indium gallium tin oxide.

In another example, the first anode material layer AML1 comprises indium zinc oxide.

Figure 24:
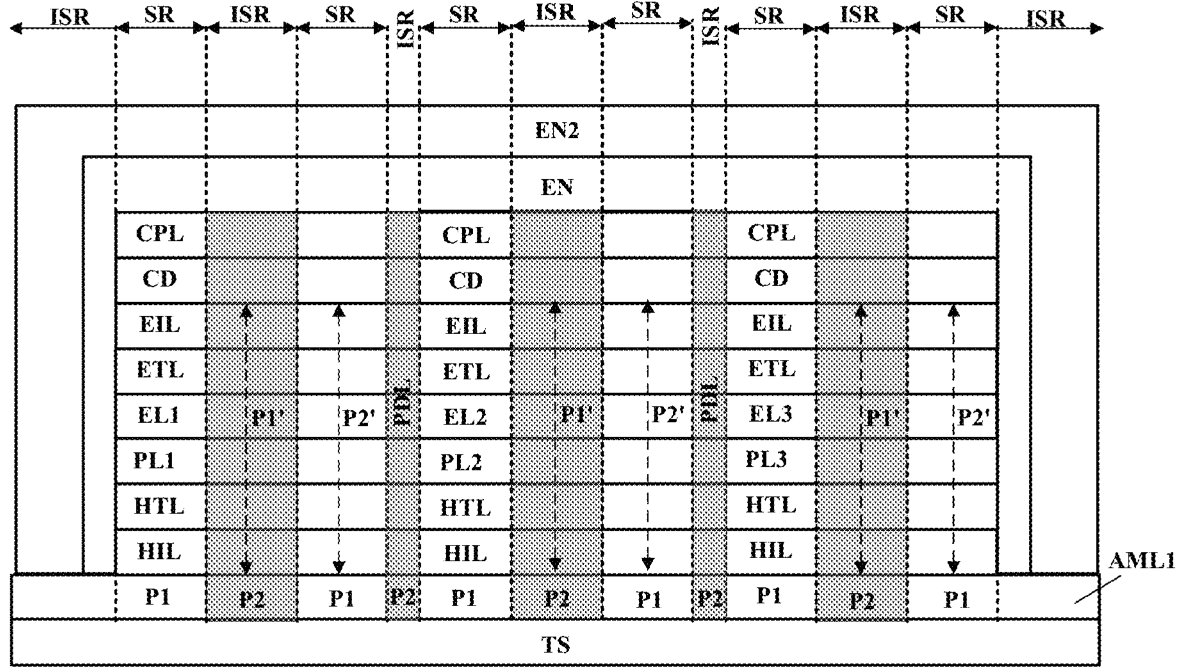
FIG. 24 illustrates the structure of a portion of a display substrate in some embodiments according to the present disclosure.

FIG. 24 illustrates the structure of a portion of a display substrate in some embodiments according to the present disclosure. The display substrate depicted in FIG. 24 differs from the display substrate depicted in FIG. 22 in that the display substrate depicted in FIG. 24 include only one anode material layer whereas the display substrate depicted in FIG. 23 includes a first anode material layer AML1 and a second anode material layer AML2.

In some embodiments, the anode material layer AML includes multiple sub-layers. In one example, the anode material layer AML includes a first sub-layer comprising indium tin oxide, a second sub-layer comprising silver on the first sub-layer, and a third sub-layer comprising indium tin oxide on a side of the second sub-layer away from the first sub-layer. The third sub-layer is in direct contact with the plurality of functional material layers. In one example, ion implantation is performed on the indium tin oxide material in the anode material layer AML. As a result of the ion implantation, the first portion P1 of the anode material layer AML has a higher conductivity than a conductivity of the second portion P2 of the anode material layer AML. Optionally, the first portion P1 of the anode material layer AML has a higher work function than a work function of the second portion P2 of the anode material layer AML. Optionally, a difference between a highest occupied molecular orbital level of the second portion P2 of the anode material layer AML and a highest occupied molecular orbital level of the functional material layer in direct contact with the second portion P2 is greater than a difference between a highest occupied molecular orbital level of the first portion P1 of the anode material layer AML and a highest occupied molecular orbital level of the functional material layer in direct contact with the first portion P1.

Figure 25:
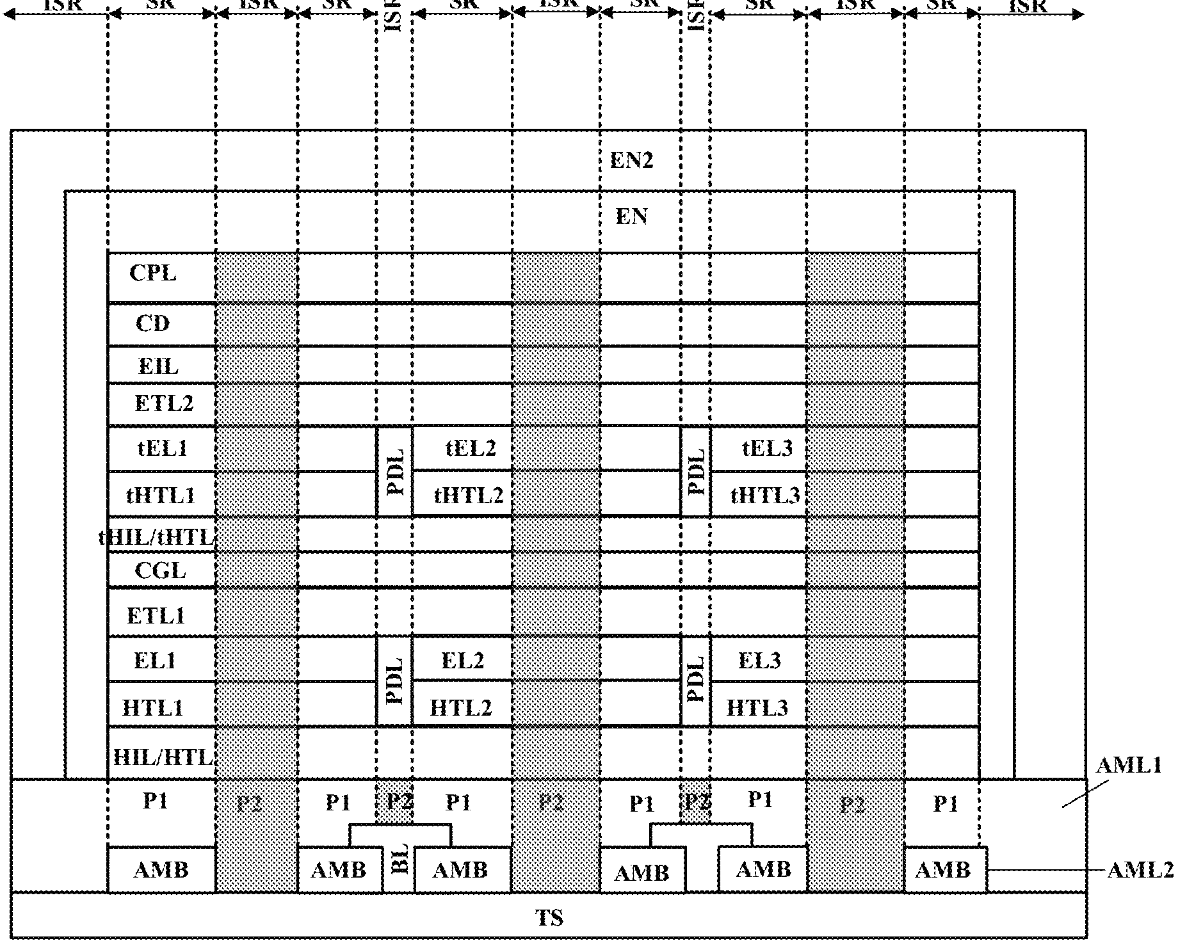
FIG. 25 illustrates the structure of a portion of a display substrate in some embodiments according to the present disclosure.

In some embodiments, the display substrate is tandem light emitting diode display substrate. FIG. 25 illustrates the structure of a portion of a display substrate in some embodiments according to the present disclosure. Referring to FIG. 25, the display substrate in some embodiments includes a transistor substrate TS, a second anode material layer AML2 on the transistor substrate TS, and a first anode material layer AML1 on a side of the second anode material layer AML2 away from the transistor substrate TS. In some embodiments, the first anode material layer AML1 extends at least partially across multiple subpixels in the display substrate. In some embodiments, the first anode material layer AML1 includes a first portion P1 doped with an impurity and a second portion P2 that is not subject to a doping of the impurity. The first portion P1 is in the impurity region and at least partially in a respective subpixel region SR, and the second portion P2 is at least partially in the inter-subpixel region ISR.

In some embodiments, the display substrate further includes a plurality of first functional material layers. In some embodiments, the plurality of first functional material layers extend at least partially across multiple subpixels (e.g., multiple subpixels of a first color) in the display substrate. In some embodiments, the plurality of first functional material layers include a hole injection layer HIL and a hole transport layer HTL on the first anode material layer AML1, a first hole transport layer HTL1 on a side of the hole injection layer HIL and the hole transport layer HTL away from the first anode material layer AML1, a first light emitting layer EL1 on a side of the first hole transport layer HTL1 away from the first anode material layer AML1, a first electron transport layer ETL1 on a side of the first light emitting layer EL1 away from the first anode material layer AML1, a charge generating layer CGL on a side of the first electron transport layer ETL1 away from the first anode material layer AML1, a tandem hole injection layer tHIL and a tandem hole transport layer tHTL on a side of the charge generating layer CGL away from the first anode material layer AML1, a tandem first hole transport layer tHTL1 on a side of the tandem hole injection layer tHIL and the tandem hole transport layer tHTL away from the first anode material layer AML1, a tandem first light emitting layer tEL1 on a side of the tandem first hole transport layer tHTL1 away from the first anode material layer AML1, a second electron transport layer ETL2 on a side of the tandem first light emitting layer tEL1 away from the first anode material layer AML1, and an electron injection layer EIL on a side of the second electron transport layer ETL2 away from the first anode material layer AML1.

Optionally, the hole injection layer HIL, the hole transport layer HTL, the first electron transport layer ETL1, the charge generating layer CGL, the tandem hole injection layer tHIL, the tandem hole transport layer tHTL, the second electron transport layer ETL2, the electron injection layer EIL are common layer extending throughout subpixels of different colors.

In some embodiments, the plurality of first functional material layers include a first portion P1' in the inter-subpixel region ISR, and a second portion P2' in the subpixel regions SR. The first portion P1' of the plurality of first functional material layers is subject to the impurity doping, the second portion P2' of the plurality of first functional material layers is not subject to the impurity doping. In some embodiments, the first portion P1' of the plurality of first functional material layers is not capable of emitting light. Moreover, the first portion P1' of the plurality of first functional material layers functions as a barrier for reducing crosstalk current between adjacent subpixels (e.g., adjacent subpixels of a first color).

In some embodiments, the first portion P1' of the plurality of first functional material layers includes an impurity doped by the ion implantation. In some embodiments, the first portion P1' and the second portion P2' of each of the plurality of first functional material layers include at least one functional material in common. In some embodiments, a weight percentage of the impurity in the first portion P1' is higher than a weight percentage of the impurity in the second portion P2'. Optionally, the impurity is absent in the second portion P2'. In some embodiments, a weight ratio of the impurity to the at least one functional material in common in the first portion P1' is higher than a weight ratio of the impurity to the at least one functional material in common in the second portion P2'. Optionally, the weight ratio of the impurity to the at least one functional material in common in the second portion P2' in at least one of a hole transport layer HTL, a hole injection layer HIL, an electron transport layer ETL, or an electron injection layer EIL is substantially zero (e.g., less than 0.001%, less than 0.0009%, less than 0.0008%, less than 0.0007%, less than 0.0006%, than 0.0005%, less than 0.0004%, less than 0.0003%, less than 0.0002%, or less than 0.0001%).

In some embodiments, the display substrate further includes a plurality of second functional material layers. In some embodiments, the plurality of second functional material layers extend at least partially across multiple subpixels (e.g., multiple subpixels of a first color) in the display substrate. In some embodiments, the plurality of second functional material layers include a hole injection layer HIL and a hole transport layer HTL on the first anode material layer AML1, a second hole transport layer HTL2 on a side of the hole injection layer HIL and the hole transport layer HTL away from the first anode material layer AML1, a second light emitting layer EL2 on a side of the second hole transport layer HTL2 away from the first anode material layer AML1, a first electron transport layer ETL1 on a side of the second light emitting layer EL2 away from the first anode material layer AML1, a charge generating layer CGL on a side of the first electron transport layer ETL1 away from the first anode material layer AML1, a tandem hole injection layer tHIL and a tandem hole transport layer tHTL on a side of the charge generating layer CGL away from the first anode material layer AML1, a tandem second hole transport layer tHTL2 on a side of the tandem hole injection layer tHIL and the tandem hole transport layer tHTL away from the first anode material layer AML1, a tandem second light emitting layer tEL2 on a side of the tandem second hole transport layer tHTL2 away from the first anode material layer AML1, a second electron transport layer ETL2 on a side of the tandem second light emitting layer tEL2 away from the first anode material layer AML1, and an electron injection layer EIL on a side of the second electron transport layer ETL2 away from the first anode material layer AML1.

Optionally, the hole injection layer HIL, the hole transport layer HTL, the first electron transport layer ETL1, the charge generating layer CGL, the tandem hole injection layer tHIL, the tandem hole transport layer tHTL, the second electron transport layer ETL2, the electron injection layer EIL are common layer extending throughout subpixels of different colors.

In some embodiments, the plurality of second functional material layers include a first portion P1' in the inter-subpixel region ISR, and a second portion P2' in the subpixel regions SR. The first portion P1' of the plurality of second functional material layers is subject to the impurity doping, the second portion P2' of the plurality of second functional material layers is not subject to the impurity doping. In some embodiments, the first portion P1' of the plurality of second functional material layers is not capable of emitting light. Moreover, the first portion P1' of the plurality of second functional material layers functions as a barrier for reducing crosstalk current between adjacent subpixels (e.g., adjacent subpixels of a second color).

In some embodiments, the first portion P1' of the plurality of second functional material layers includes an impurity doped by the ion implantation. In some embodiments, the first portion P1' and the second portion P2' of each of the plurality of second functional material layers include at least one functional material in common. In some embodiments, a weight percentage of the impurity in the first portion P1' is higher than a weight percentage of the impurity in the second portion P2'. Optionally, the impurity is absent in the second portion P2'. In some embodiments, a weight ratio of the impurity to the at least one functional material in common in the first portion P1' is higher than a weight ratio of the impurity to the at least one functional material in common in the second portion P2'. Optionally, the weight ratio of the impurity to the at least one functional material in common in the second portion P2' in at least one of a hole transport layer HTL, a hole injection layer HIL, an electron transport layer ETL, or an electron injection layer EIL is substantially zero (e.g., less than 0.001%, less than 0.0009%, less than 0.0008%, less than 0.0007%, less than 0.0006%, than 0.0005%, less than 0.0004%, less than 0.0003%, less than 0.0002%, or less than 0.0001%).

In some embodiments, the display substrate further includes a plurality of third functional material layers. In some embodiments, the plurality of third functional material layers extend at least partially across multiple subpixels (e.g., multiple subpixels of a first color) in the display substrate. In some embodiments, the plurality of third functional material layers include a hole injection layer HIL and a hole transport layer HTL on the first anode material layer AML1, a third hole transport layer HTL3 on a side of the hole injection layer HIL and the hole transport layer HTL away from the first anode material layer AML1, a third light emitting layer EL3 on a side of the third hole transport layer HTL3 away from the first anode material layer AML1, a first electron transport layer ETL1 on a side of the third light emitting layer EL3 away from the first anode material layer AML1, a charge generating layer CGL on a side of the first electron transport layer ETL1 away from the first anode material layer AML1, a tandem hole injection layer tHIL and a tandem hole transport layer tHTL on a side of the charge generating layer CGL away from the first anode material layer AML1, a tandem third hole transport layer tHTL3 on a side of the tandem hole injection layer tHIL and the tandem hole transport layer tHTL away from the first anode material layer AML1, a tandem third light emitting layer tEL3 on a side of the tandem third hole transport layer tHTL3 away from the first anode material layer AML1, a second electron transport layer ETL2 on a side of the tandem third light emitting layer tEL3 away from the first anode material layer AML1, and an electron injection layer EIL on a side of the second electron transport layer ETL2 away from the first anode material layer AML1.

Optionally, the hole injection layer HIL, the hole transport layer HTL, the first electron transport layer ETL1, the charge generating layer CGL, the tandem hole injection layer tHIL, the tandem hole transport layer tHTL, the second electron transport layer ETL2, the electron injection layer EIL are common layer extending throughout subpixels of different colors.

In some embodiments, the plurality of third functional material layers include a first portion P1' in the inter-subpixel region ISR, and a second portion P2' in the subpixel regions SR. The first portion P1' of the plurality of third functional material layers is subject to the impurity doping, the second portion P2' of the plurality of third functional material layers is not subject to the impurity doping. In some embodiments, the first portion P1' of the plurality of third functional material layers is not capable of emitting light. Moreover, the first portion P1' of the plurality of third functional material layers functions as a barrier for reducing crosstalk current between adjacent subpixels (e.g., adjacent subpixels of a third color).

In some embodiments, the first portion P1' of the plurality of third functional material layers includes an impurity doped by the ion implantation. In some embodiments, the first portion P1' and the second portion P2' of each of the plurality of third functional material layers include at least one functional material in common. In some embodiments, a weight percentage of the impurity in the first portion P1' is higher than a weight percentage of the impurity in the second portion P2'. Optionally, the impurity is absent in the second portion P2'. In some embodiments, a weight ratio of the impurity to the at least one functional material in common in the first portion P1' is higher than a weight ratio of the impurity to the at least one functional material in common in the second portion P2'. Optionally, the weight ratio of the impurity to the at least one functional material in common in the second portion P2' in at least one of a hole transport layer HTL, a hole injection layer HIL, an electron transport layer ETL, or an electron injection layer EIL is substantially zero (e.g., less than 0.001%, less than 0.0009%, less than 0.0008%, less than 0.0007%, less than 0.0006%, than 0.0005%, less than 0.0004%, less than 0.0003%, less than 0.0002%, or less than 0.0001%).

In fabricating the tandem light emitting diode display substrate, the impurity doping of functional material layers may be performed multiple times. For example, a respective impurity doping may be performed after any intermediate functional material layer is formed.

In some embodiments, referring to FIG. 25, the display substrate further includes a bank layer BL on a side of the second anode material layer AML2 away from the transistor substrate TS, and on a side of the first anode material layer AML1 closer to the transistor substrate TS. In some embodiments, the second anode material layer AML2 includes a plurality of anode material blocks AMB spaced apart from each other. A respective anode material block of the plurality of anode material blocks AMB is at least partially in a respective subpixel region SR. Optionally, the respective anode material block includes at least a metallic sub-layer (e.g., a silver sub-layer) of the second anode material layer AML2. Optionally, the respective anode material block includes at least a metallic sub-layer (e.g., a silver sub-layer) and at least a non-metallic sub-layer (e.g., an indium tin oxide sub-layer) of the second anode material layer AML2. Optionally, the respective anode material block includes all sub-layers of the second anode material layer AML2.

In some embodiments, the bank layer BL is at least partially in a sub-region of the inter-subpixel region ISR where the pixel definition layer PDL is present, and is absent in a sub-region of the inter-subpixel region ISR where the pixel definition layer PDL is absent. Optionally, an orthographic projection of the bank layer BL on the transistor substrate TS at least partially overlaps with an orthographic projection of the pixel definition layer PDL on the transistor substrate TS. In some embodiments, the pixel definition layer PDL is present in a sub-region of the inter-subpixel region ISR between two adjacent light emitting layers of different colors, and is absent in a sub-region of the inter-subpixel region ISR between two adjacent light emitting layers of a same color. In some embodiments, the bank layer BL is present in a sub-region of the inter-subpixel region ISR between two adjacent light emitting layers of different colors, and is absent in a sub-region of the inter-subpixel region ISR between two adjacent light emitting layers of a same color.

In an alternative embodiment, the pixel definition layer PDL is present throughout the inter-subpixel region ISR. For example, the pixel definition layer PDL is present in a sub-region of the inter-subpixel region ISR between two adjacent light emitting layers of different colors, and is also present in a sub-region of the inter-subpixel region ISR between two adjacent light emitting layers of a same color.

In an alternative embodiment, the bank layer BL is present throughout the inter-subpixel region ISR. For example, the bank layer BL is present in a sub-region of the inter-subpixel region ISR between two adjacent light emitting layers of different colors, and is also present in a sub-region of the inter-subpixel region ISR between two adjacent light emitting layers of a same color.

Figure 26:
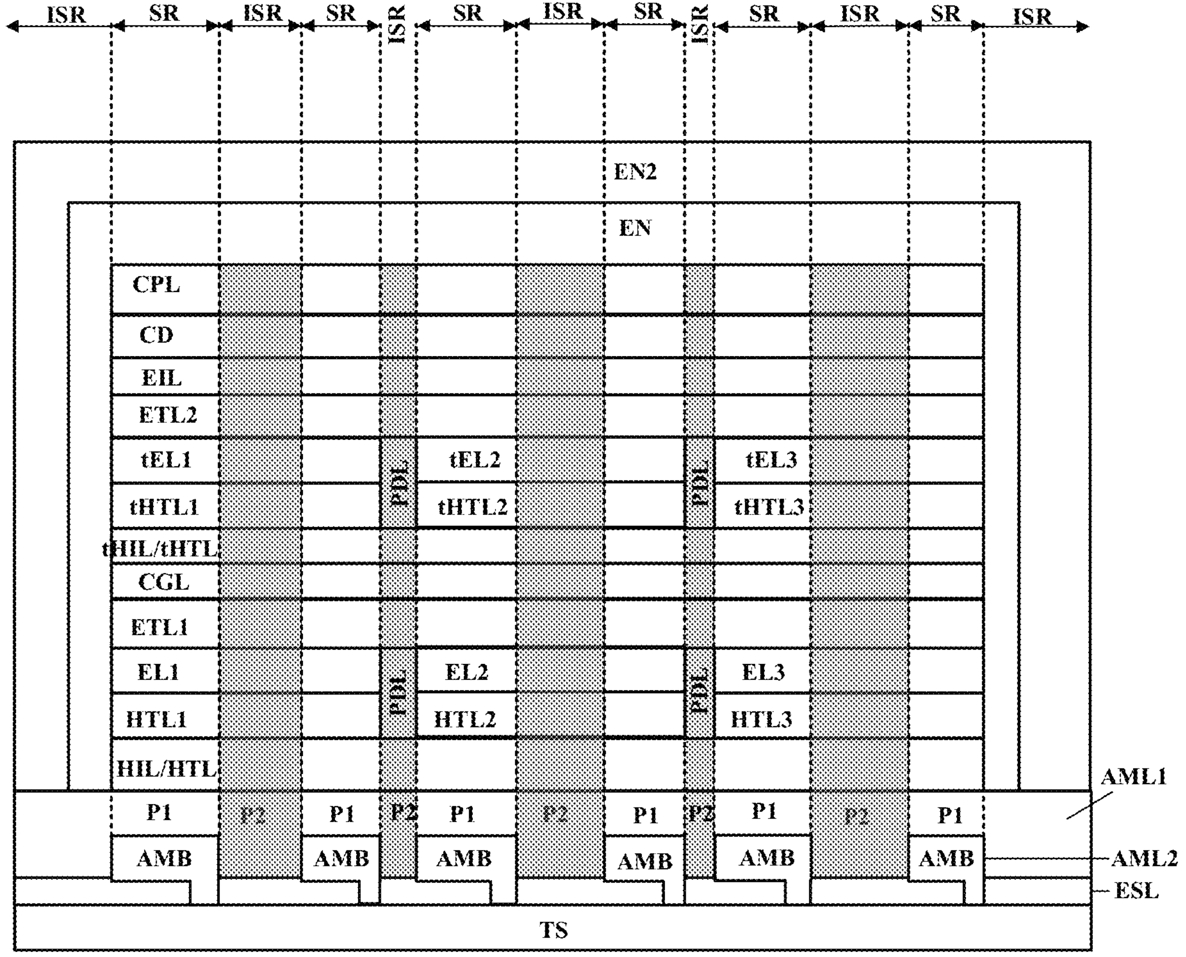
FIG. 26 illustrates the structure of a portion of a display substrate in some embodiments according to the present disclosure.

In some embodiments, the pixel definition layer PDL may be formed using functional materials doped with impurities. FIG. 26 illustrates the structure of a portion of a display substrate in some embodiments according to the present disclosure. Referring to FIG. 26, the display substrate includes a pixel definition layer PDL, the pixel definition layer PDL comprising a plurality of inter-pixel functional material layers. In one example, the plurality of inter-pixel functional material layers are the same as the plurality of first functional material layers. In another example, the plurality of inter-pixel functional material layers are the same as the plurality of second functional material layers. In another example, the plurality of inter-pixel functional material layers are the same as the plurality of third functional material layers. The plurality of inter-pixel functional material layers in the pixel definition layer PDL are doped with impurities. The impurity doping may be performed using a same process as the impurity doping of the first portion P1'. The plurality of inter-pixel functional material layers in the pixel definition layer PDL are not capable of emitting light, and are not conductive. The crosstalk current is suppressed by the pixel definition layer PDL.

In some embodiments, referring to FIG. 26, the second anode material layer AML2 includes a plurality of anode material blocks AMB spaced apart from each other. A respective anode material block of the plurality of anode material blocks AMB is at least partially in a respective subpixel region SR. Optionally, the respective anode material block includes at least a metallic sub-layer (e.g., a silver sub-layer) of the second anode material layer AML2. Optionally, the respective anode material block includes at least a metallic sub-layer (e.g., a silver sub-layer) and at least a non-metallic sub-layer (e.g., an indium tin oxide sub-layer) of the second anode material layer AML2. Optionally, the respective anode material block includes all sub-layers of the second anode material layer AML2.

In some embodiments, when the second anode material layer AML2 is made of a metallic material, the display substrate may further include an etch stop layer ESL on a side of the second anode material layer AML2 closer to the transistor substrate TS. When dry etching is performed to form the second anode material layer AML2, the etch stop layer can effectively prevent over-etching on an underlying planarization layer.

In one example, the first anode material layer AML1 comprises indium gallium tin oxide.

In another example, the first anode material layer AML1 comprises indium zinc oxide.

Figure 27:
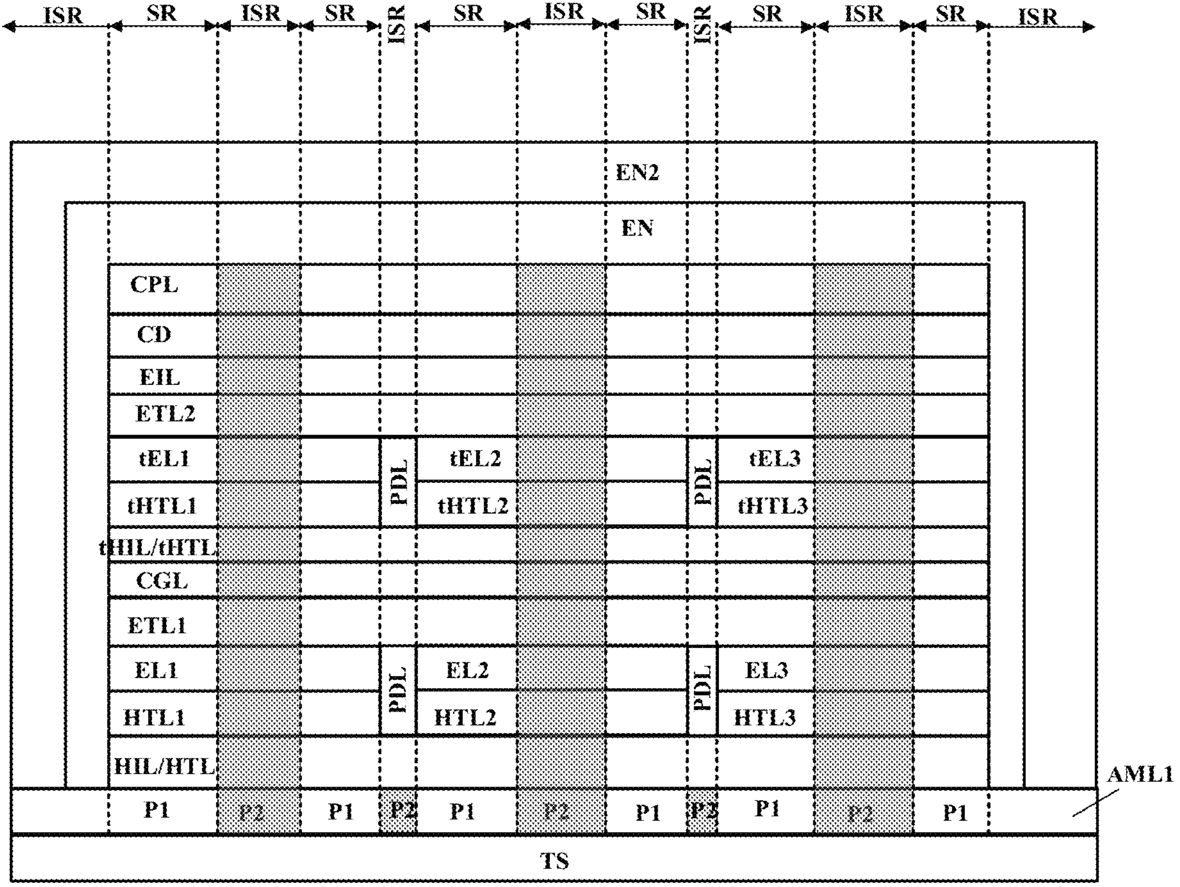
FIG. 27 illustrates the structure of a portion of a display substrate in some embodiments according to the present disclosure.

FIG. 27 illustrates the structure of a portion of a display substrate in some embodiments according to the present disclosure. The display substrate depicted in FIG. 27 differs from the display substrate depicted in FIG. 25 in that the display substrate depicted in FIG. 27 include only one anode material layer whereas the display substrate depicted in FIG. 25 includes a first anode material layer AML1 and a second anode material layer AML2.

In some embodiments, the anode material layer AML includes multiple sub-layers. In one example, the anode material layer AML includes a first sub-layer comprising indium tin oxide, a second sub-layer comprising silver on the first sub-layer, and a third sub-layer comprising indium tin oxide on a side of the second sub-layer away from the first sub-layer. The third sub-layer is in direct contact with the plurality of functional material layers. In one example, ion implantation is performed on the indium tin oxide material in the anode material layer AML. As a result of the ion implantation, the first portion P1 of the anode material layer AML has a higher conductivity than a conductivity of the second portion P2 of the anode material layer AML. Optionally, the first portion P1 of the anode material layer AML has a higher work function than a work function of the second portion P2 of the anode material layer AML. Optionally, a difference between a highest occupied molecular orbital level of the second portion P2 of the anode material layer AML and a highest occupied molecular orbital level of the functional material layer in direct contact with the second portion P2 is greater than a difference between a highest occupied molecular orbital level of the first portion P1 of the anode material layer AML and a highest occupied molecular orbital level of the functional material layer in direct contact with the first portion P1.

Figure 28:
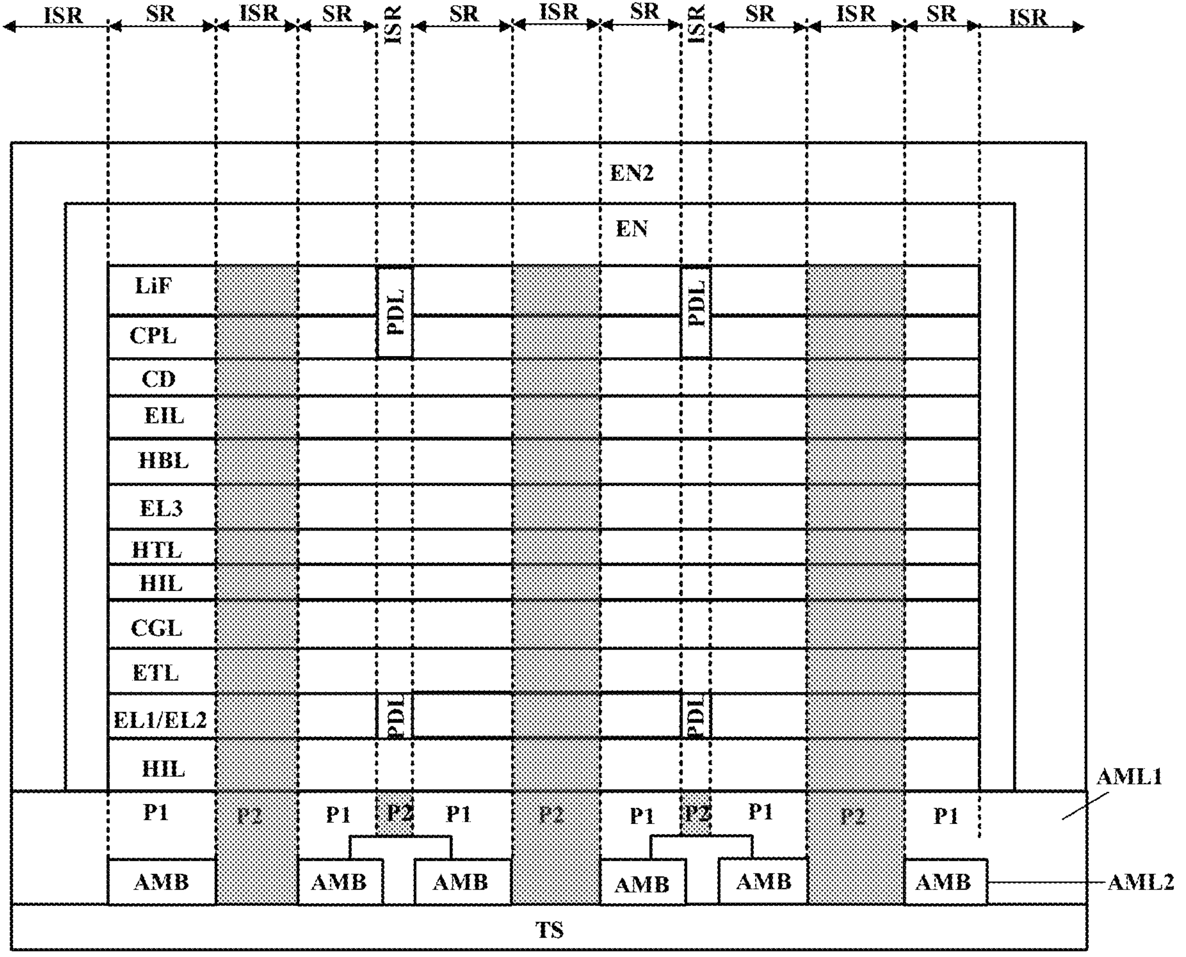
FIG. 28 illustrates the structure of a portion of a display substrate in some embodiments according to the present disclosure.

In some embodiments, the display substrate is tandem light emitting diode display substrate. FIG. 28 illustrates the structure of a portion of a display substrate in some embodiments according to the present disclosure. Referring to FIG. 28, the display substrate in some embodiments includes a transistor substrate TS, a second anode material layer AML2 on the transistor substrate TS, and a first anode material layer AML1 on a side of the second anode material layer AML2 away from the transistor substrate TS. In some embodiments, the first anode material layer AML1 extends at least partially across multiple subpixels in the display substrate. In some embodiments, the first anode material layer AML1 includes a first portion P1 doped with an impurity and a second portion P2 that is not subject to a doping of the impurity. The first portion P1 is in the impurity region and at least partially in a respective subpixel region SR, and the second portion P2 is at least partially in the inter-subpixel region ISR.

In some embodiments, the first portion P1 and the second portion P2 include at least one material in common. In some embodiments, a weight percentage of the impurity in the first portion P1 is higher than a weight percentage of the impurity in the second portion P2. Optionally, the impurity is absent in the second portion P2. In some embodiments, a weight ratio of the impurity to the at least one material in common in the first portion P1 is higher than a weight ratio of the impurity to the at least one material in common in the second portion P2. Optionally, the weight ratio of the impurity to the at least one material in common in the second portion P2 is substantially zero (e.g., less than 0.001%, less than 0.0009%, less than 0.0008%, less than 0.0007%, less than 0.0006%, than 0.0005%, less than 0.0004%, less than 0.0003%, less than 0.0002%, or less than 0.0001%).

In some embodiments, the first portion P1 and the second portion P2 of the first anode material layer AML1 include a semiconductor material in common. Optionally, the semiconductor material in common is a metal oxide material in common or a metal oxynitride material in common.

In some embodiments, the first portion P1 of the first anode material layer AML1 has a higher conductivity than a conductivity of the second portion P2 of the first anode material layer AML1. In some embodiments, the first portion P1 of the first anode material layer AML1 has a higher work function than a work function of the second portion P2 of the first anode material layer AML1. In some embodiments, a difference between a highest occupied molecular orbital level of the second portion P2 of the first anode material layer AML1 and a highest occupied molecular orbital level of the functional material layer in direct contact with the second portion P2 is greater than a difference between a highest occupied molecular orbital level of the first portion P1 of the first anode material layer AML1 and a highest occupied molecular orbital level of the functional material layer in direct contact with the first portion P1.

In some embodiments, the display substrate further includes a plurality of functional material layers. In some embodiments, the plurality of functional material layers extend at least partially across multiple subpixels in the display substrate. In some embodiments, the plurality of functional material layers include a hole injection layer HIL on the first anode material layer AML1, a first light emitting layer EL1 and a second light emitting layer EL2 on a side of the hole injection layer HIL away from the first anode material layer AML1, an electron transport layer ETL on a side of the first light emitting layer EL1 and the second light emitting layer EL2 away from the first anode material layer AML1, a charge generating layer CGL on a side of the electron transport layer ETL away from the first anode material layer AML1, a hole injection layer HIL on a side of the charge generating layer CGL away from the first anode material layer AML1, a hole transport layer HTL on a side of the hole injection layer HIL away from the first anode material layer AML1, a third light emitting layer EL3 on a side of the hole transport layer HTL away from the first anode material layer AML1, a hole barrier layer HBL on a side of the third light emitting layer EL3 away from the first anode material layer AML1, and an electron injection layer on a side of the hole barrier layer HBL away from the first anode material layer AML1. The display substrate in some embodiments further includes a cathode CD on a side of the plurality of functional material layers away from the first anode material layer AML1, a capping layer CPL on a side of the cathode CD away from the first anode material layer AML1, and a lithium fluoride layer LiF on a side of the capping layer CPL away from the first anode material layer AML1.

In some embodiments, the plurality of functional material layers include a first portion P1' in the inter-subpixel region ISR, and a second portion P2' in the subpixel regions SR. The first portion P1' of the plurality of functional material layers is subject to the impurity doping, the second portion P2' of the plurality of functional material layers is not subject to the impurity doping. In some embodiments, the first portion P1' of the plurality of functional material layers is not capable of emitting light. Moreover, the first portion P1' of the plurality of functional material layers functions as a barrier for reducing crosstalk current between adjacent subpixels (e.g., adjacent subpixels of a first color).

In some embodiments, the first portion P1' of the plurality of functional material layers includes an impurity doped by the ion implantation. In some embodiments, the first portion P1' and the second portion P2' of each of the plurality of functional material layers include at least one functional material in common. In some embodiments, a weight percentage of the impurity in the first portion P1' is higher than a weight percentage of the impurity in the second portion P2'. Optionally, the impurity is absent in the second portion P2'. In some embodiments, a weight ratio of the impurity to the at least one functional material in common in the first portion P1' is higher than a weight ratio of the impurity to the at least one functional material in common in the second portion P2'. Optionally, the weight ratio of the impurity to the at least one functional material in common in the second portion P2' in at least one of a hole transport layer HTL, a hole injection layer HIL, an electron transport layer ETL, or an electron injection layer EIL is substantially zero (e.g., less than 0.001%, less than 0.0009%, less than 0.0008%, less than 0.0007%, less than 0.0006%, than 0.0005%, less than 0.0004%, less than 0.0003%, less than 0.0002%, or less than 0.0001%).

In some embodiments, an orthographic projection of the second portion P2 of the first anode material layer AML1 on a base substrate at least partially overlaps with an orthographic projection of the first portion P1' of the plurality of functional material layers on the base substrate. In some embodiments, an orthographic projection of the first portion P1 of the first anode material layer AML1 on a base substrate at least partially overlaps with an orthographic projection of the second portion P2' of the plurality of functional material layers on the base substrate.

In some embodiments, referring to FIG. 28, the display substrate further includes a bank layer BL on a side of the second anode material layer AML2 away from the transistor substrate TS, and on a side of the first anode material layer AML1 closer to the transistor substrate TS. In some embodiments, the second anode material layer AML2 includes a plurality of anode material blocks AMB spaced apart from each other. A respective anode material block of the plurality of anode material blocks AMB is at least partially in a respective subpixel region SR. Optionally, the respective anode material block includes at least a metallic sub-layer (e.g., a silver sub-layer) of the second anode material layer AML2. Optionally, the respective anode material block includes at least a metallic sub-layer (e.g., a silver sub-layer) and at least a non-metallic sub-layer (e.g., an indium tin oxide sub-layer) of the second anode material layer AML2. Optionally, the respective anode material block includes all sub-layers of the second anode material layer AML2.

In some embodiments, the bank layer BL is at least partially in a sub-region of the inter-subpixel region ISR where the pixel definition layer PDL is present, and is absent in a sub-region of the inter-subpixel region ISR where the pixel definition layer PDL is absent. Optionally, an orthographic projection of the bank layer BL on the transistor substrate TS at least partially overlaps with an orthographic projection of the pixel definition layer PDL on the transistor substrate TS. In some embodiments, the pixel definition layer PDL is present in a sub-region of the inter-subpixel region ISR between two adjacent light emitting layers of different colors, and is absent in a sub-region of the inter-subpixel region ISR between two adjacent light emitting layers of a same color. In some embodiments, the bank layer BL is present in a sub-region of the inter-subpixel region ISR between two adjacent light emitting layers of different colors, and is absent in a sub-region of the inter-subpixel region ISR between two adjacent light emitting layers of a same color.

In an alternative embodiment, the pixel definition layer PDL is present throughout the inter-subpixel region ISR. For example, the pixel definition layer PDL is present in a sub-region of the inter-subpixel region ISR between two adjacent light emitting layers of different colors, and is also present in a sub-region of the inter-subpixel region ISR between two adjacent light emitting layers of a same color.

In an alternative embodiment, the bank layer BL is present throughout the inter-subpixel region ISR. For example, the bank layer BL is present in a sub-region of the inter-subpixel region ISR between two adjacent light emitting layers of different colors, and is also present in a sub-region of the inter-subpixel region ISR between two adjacent light emitting layers of a same color.

Figure 29:
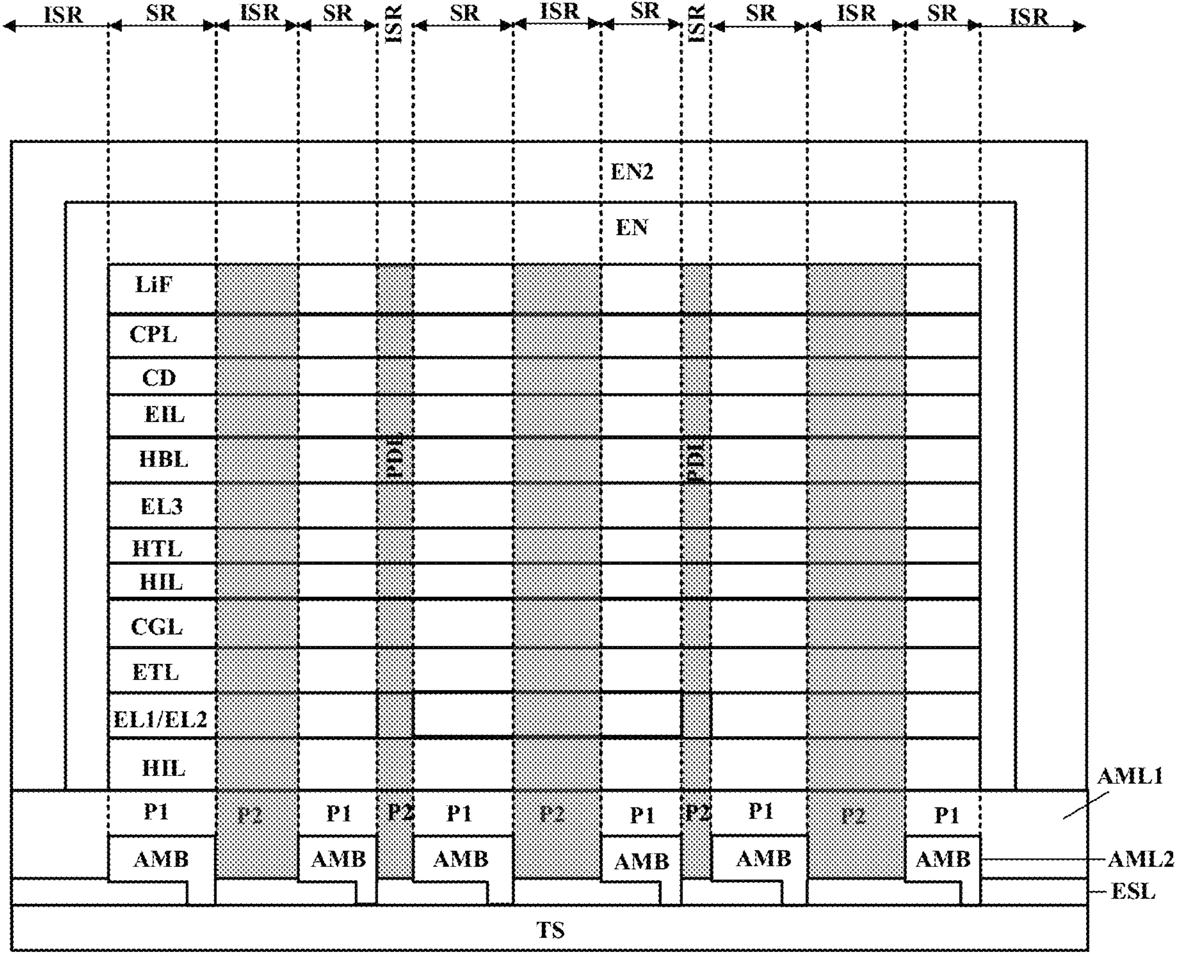
FIG. 29 illustrates the structure of a portion of a display substrate in some embodiments according to the present disclosure.

FIG. 29 illustrates the structure of a portion of a display substrate in some embodiments according to the present disclosure. Referring to FIG. 29, the display substrate includes a pixel definition layer PDL, the pixel definition layer PDL comprising a plurality of inter-pixel functional material layers. In one example, the plurality of inter-pixel functional material layers are the same as the plurality of first functional material layers. In another example, the plurality of inter-pixel functional material layers are the same as the plurality of second functional material layers. In another example, the plurality of inter-pixel functional material layers are the same as the plurality of third functional material layers. The plurality of inter-pixel functional material layers in the pixel definition layer PDL are doped with impurities. The impurity doping may be performed using a same process as the impurity doping of the first portion P1'. The plurality of inter-pixel functional material layers in the pixel definition layer PDL are not capable of emitting light, and are not conductive. The crosstalk current is suppressed by the pixel definition layer PDL.

In some embodiments, referring to FIG. 29, the second anode material layer AML2 includes a plurality of anode material blocks AMB spaced apart from each other. A respective anode material block of the plurality of anode material blocks AMB is at least partially in a respective subpixel region SR. Optionally, the respective anode material block includes at least a metallic sub-layer (e.g., a silver sub-layer) of the second anode material layer AML2. Optionally, the respective anode material block includes at least a metallic sub-layer (e.g., a silver sub-layer) and at least a non-metallic sub-layer (e.g., an indium tin oxide sub-layer) of the second anode material layer AML2. Optionally, the respective anode material block includes all sub-layers of the second anode material layer AML2.

In some embodiments, when the second anode material layer AML2 is made of a metallic material, the display substrate may further include an etch stop layer ESL on a side of the second anode material layer AML2 closer to the transistor substrate TS. When dry etching is performed to form the second anode material layer AML2, the etch stop layer can effectively prevent over-etching on an underlying planarization layer.

In one example, the first anode material layer AML1 comprises indium gallium tin oxide.

In another example, the first anode material layer AML1 comprises indium zinc oxide.

Figure 30:
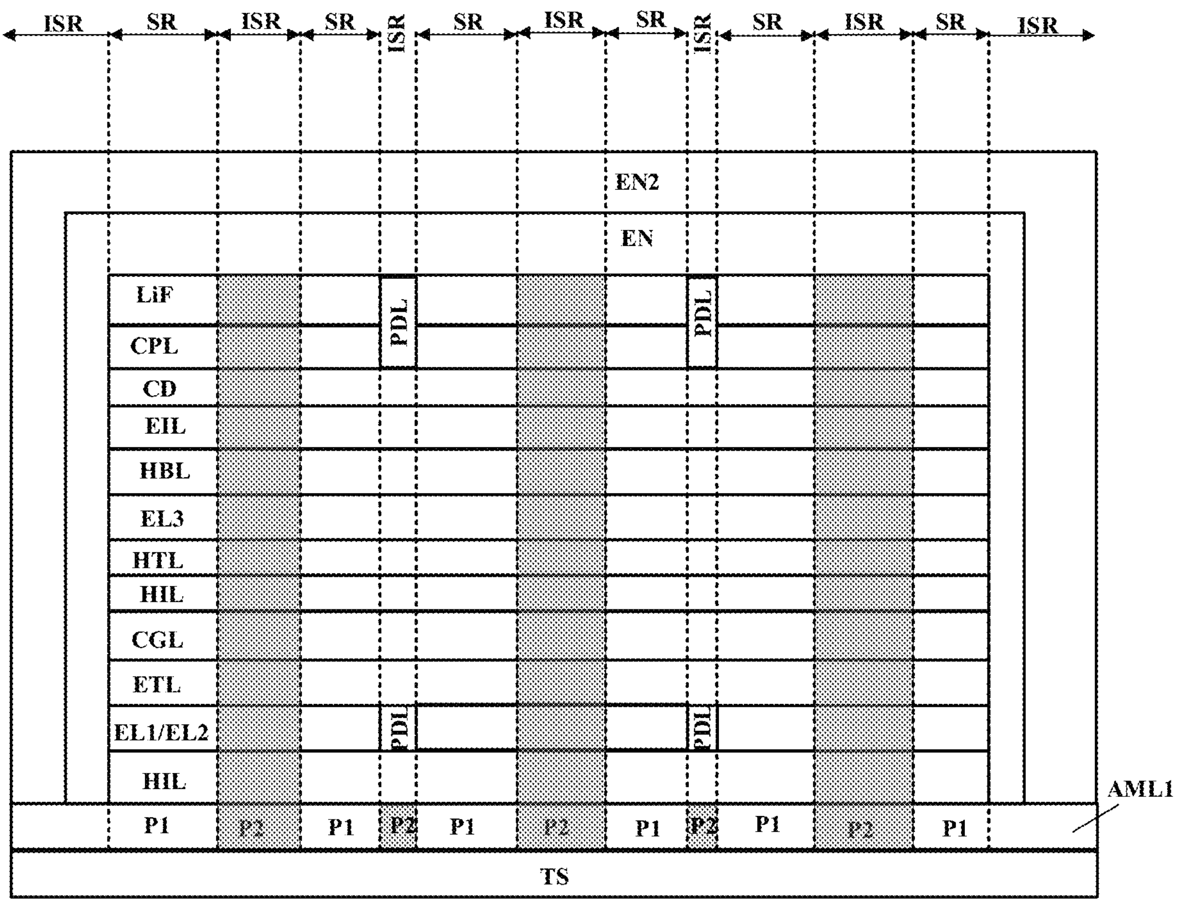
FIG. 30 illustrates the structure of a portion of a display substrate in some embodiments according to the present disclosure.

FIG. 30 illustrates the structure of a portion of a display substrate in some embodiments according to the present disclosure. The display substrate depicted in FIG. 30 differs from the display substrate depicted in FIG. 28 in that the display substrate depicted in FIG. 30 include only one anode material layer whereas the display substrate depicted in FIG. 28 includes a first anode material layer AML1 and a second anode material layer AML2.

In some embodiments, the anode material layer AML includes multiple sub-layers. In one example, the anode material layer AML includes a first sub-layer comprising indium tin oxide, a second sub-layer comprising silver on the first sub-layer, and a third sub-layer comprising indium tin oxide on a side of the second sub-layer away from the first sub-layer. The third sub-layer is in direct contact with the plurality of functional material layers. In one example, ion implantation is performed on the indium tin oxide material in the anode material layer AML. As a result of the ion implantation, the first portion P1 of the anode material layer AML has a higher conductivity than a conductivity of the second portion P2 of the anode material layer AML. Optionally, the first portion P1 of the anode material layer AML has a higher work function than a work function of the second portion P2 of the anode material layer AML. Optionally, a difference between a highest occupied molecular orbital level of the second portion P2 of the anode material layer AML and a highest occupied molecular orbital level of the functional material layer in direct contact with the second portion P2 is greater than a difference between a highest occupied molecular orbital level of the first portion P1 of the anode material layer AML and a highest occupied molecular orbital level of the functional material layer in direct contact with the first portion P1.

Figure 31:
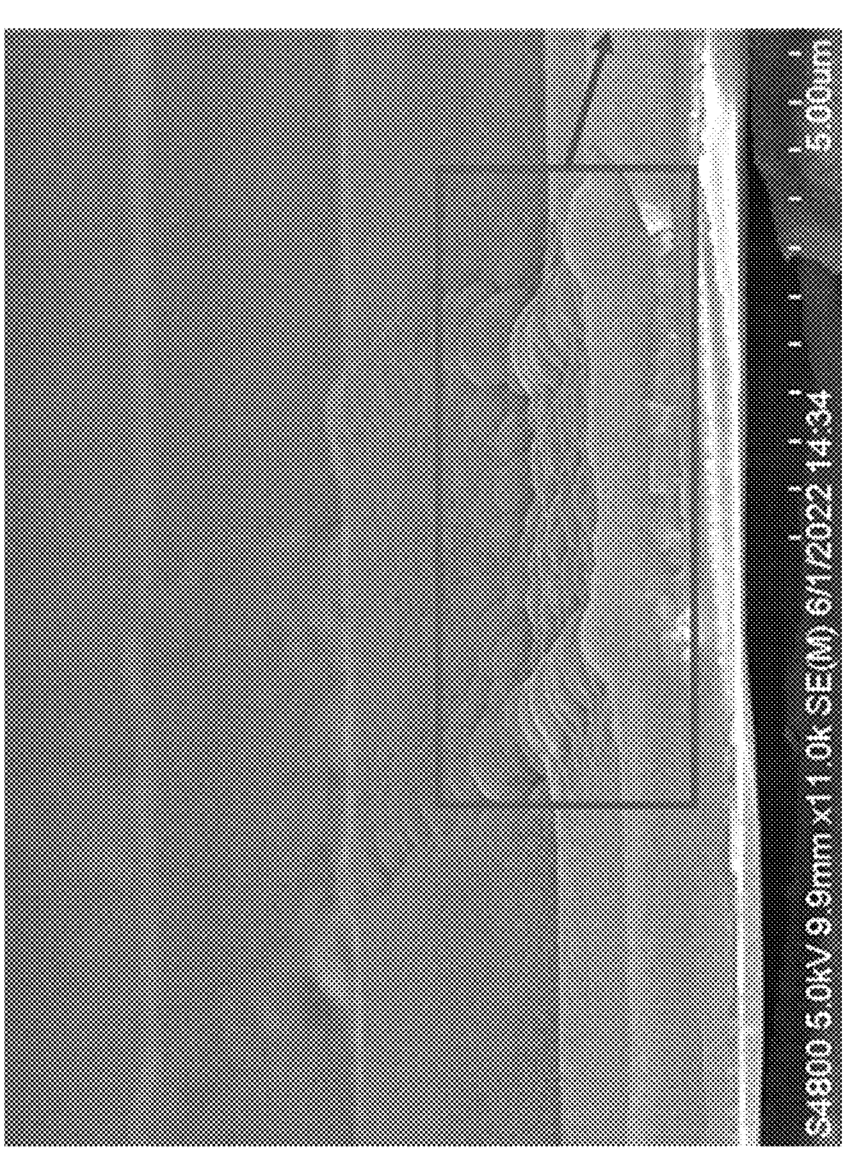
FIG. 31 shows protrusion in the second encapsulating layer due to the presence of the residual photoresist material under the second encapsulating layer.

In the process of doping impurity to the functional material layers, as discussed above, a protection layer PR is used as a mask plate. Typically, the protection layer PR is made of a photoresist material. Subsequent to the impurity doping, the protection layer PR is then removed, e.g., by ashing. The inventors of the present disclosure discover that ashing is often insufficient to remove the photoresist material, resulting in residual photoresist material in the subpixel regions. FIG. 31 shows protrusion in the second encapsulating layer due to the presence of the residual photoresist material under the second encapsulating layer. Moreover, ashing of the photoresist material often results in a relatively dark residual material, adversely affecting light emission efficiency of the display substrate.

The inventors of the present disclosure discover that, surprisingly and unexpectedly, having a light transmissive inorganic protection layer in the impurity doping process can obviate the adverse effects of the photoresist material. Examples of light transmissive inorganic materials suitable for making the light transmissive inorganic protection layer include, but are not limited to, transparent metallic materials, transparent metal oxide materials, transparent metal nitride materials, and transparent metal oxynitride materials.

Figure 32A:
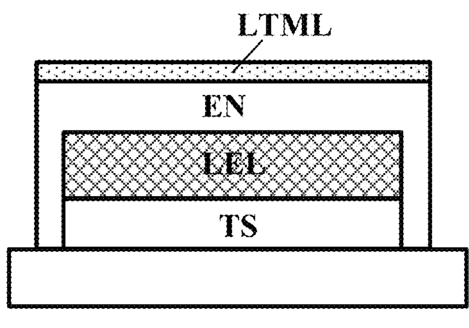
FIG. 32A to FIG. 32F depict a doping process in some embodiments according to the present disclosure.

FIG. 32A to FIG. 32F depict a doping process in some embodiments according to the present disclosure. Referring to FIG. 32A, an intermediate substrate is provided. The intermediate substrate includes a transistor substrate TS, one or more light emitting element layers LEL on the transistor substrate TS, and an encapsulating layer EN encapsulating the one or more light emitting element layers LEL. The one or more light emitting element layers LEL may include one or more of a light emitting material layer, an organic functional layer, and an anode material layer. A light transmissive inorganic material layer LTML is formed on a side of the encapsulating layer EN away from the transistor substrate TS.

Figure 32B:
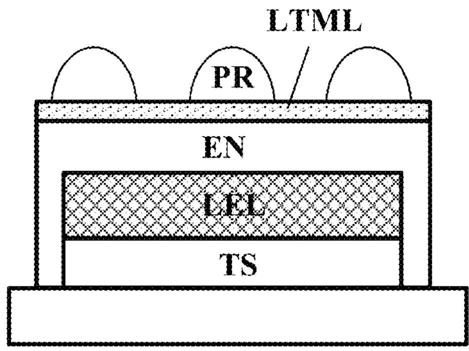

Referring to FIG. 32B, a protection layer PR is formed on the encapsulating layer EN. In one example, the protection layer PR includes a photoresist material.

Figure 32C:
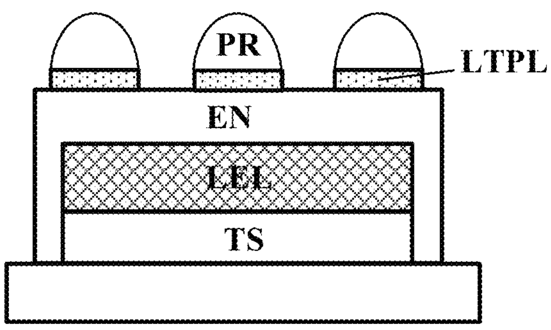

Referring to FIG. 32C, the light transmissive inorganic material layer is patterned using the protection layer PR as a mask plate, thereby forming a light transmissive inorganic protection layer LTPL. The light transmissive inorganic protection layer LTPL spaces apart the protection layer PR from the encapsulating layer EN. In regions covered by the protection layer PR and the light transmissive inorganic protection layer LTPL, the intermediate substrate is not subject to the doping from ion implantation. In regions not covered by the protection layer PR and the light transmissive inorganic protection layer LTPL, the intermediate substrate is subject to the doping from ion implantation.

Figure 32D:
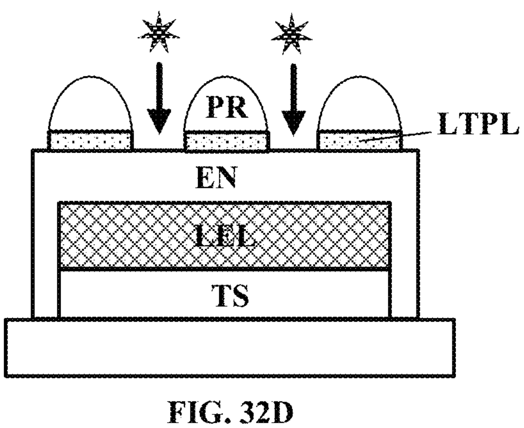

Referring to FIG. 32D, doping of an impurity, e.g., by ion implantation, is performed using the protection layer PR and the light transmissive inorganic protection layer LTPL as a mask plate. In regions not covered by the protection layer PR and the light transmissive inorganic protection layer LTPL, the intermediate substrate is subject to the doping from ion implantation.

Figure 32E:
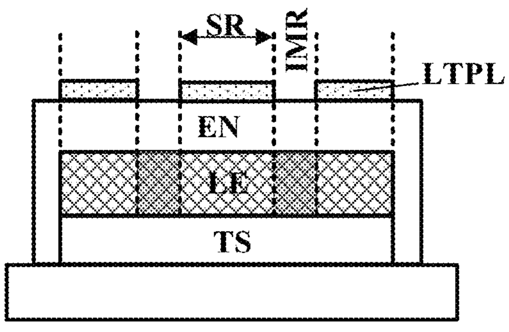

Referring to FIG. 32E, subsequent to the doping, an impurity region IMR and subpixel regions SR are formed in the display substate. The impurity region IMR spaces apart two adjacent subpixel regions. A plurality of light emitting elements LE are thereby formed. The protection layer is removed. The light transmissive inorganic protection layer LTPL remains in the subpixel regions SR.

Figure 32F:
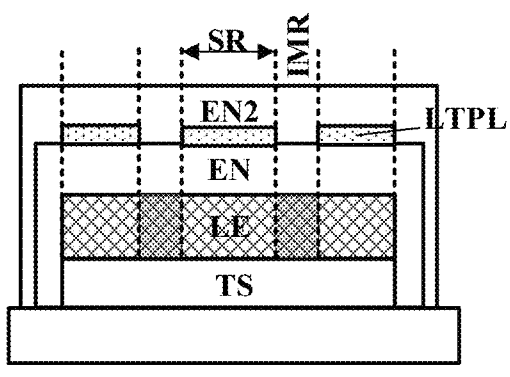

Referring to FIG. 32F, a second encapsulating layer EN2 is formed on a side of the light transmissive inorganic protection layer LTPL and the encapsulating layer EN away from the transistor substrate TS, encapsulating the plurality of light emitting elements LE.

Figure 33A:
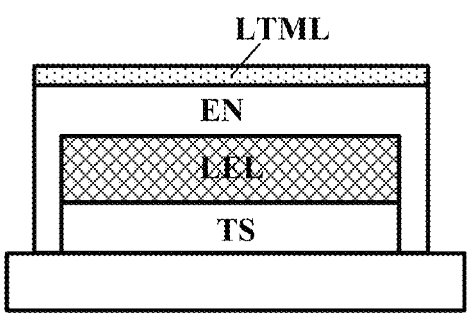
FIG. 33A to FIG. 33G depict a doping process in some embodiments according to the present disclosure.

FIG. 33A to FIG. 33G depict a doping process in some embodiments according to the present disclosure. Referring to FIG. 33A, an intermediate substrate is provided. The intermediate substrate includes a transistor substrate TS, one or more light emitting element layers LEL on the transistor substrate TS, and an encapsulating layer EN encapsulating the one or more light emitting element layers LEL. The one or more light emitting element layers LEL may include one or more of a light emitting material layer, an organic functional layer, and an anode material layer. A light transmissive inorganic material layer LTML is formed on a side of the encapsulating layer EN away from the transistor substrate TS.

Figure 33B:
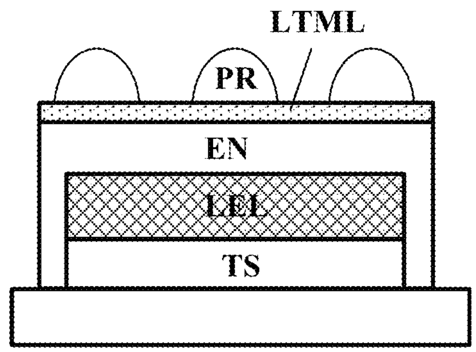

Referring to FIG. 33B, a protection layer PR is formed on the encapsulating layer EN. In one example, the protection layer PR includes a photoresist material.

Figure 33C:
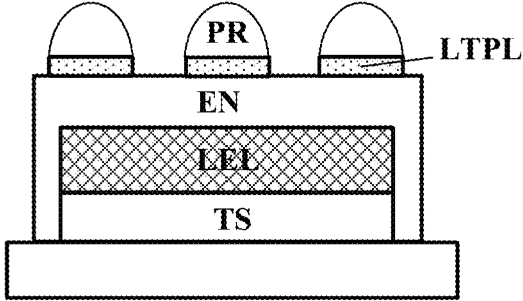

Referring to FIG. 33C, the light transmissive inorganic material layer is patterned using the protection layer PR as a mask plate, thereby forming a light transmissive inorganic protection layer LTPL. The light transmissive inorganic protection layer LTPL spaces apart the protection layer PR from the encapsulating layer EN. In regions covered by the protection layer PR and the light transmissive inorganic protection layer LTPL, the intermediate substrate is not subject to the doping from ion implantation. In regions not covered by the protection layer PR and the light transmissive inorganic protection layer LTPL, the intermediate substrate is subject to the doping from ion implantation.

Figure 33D:
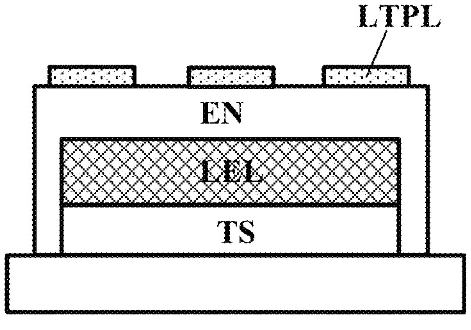

Referring to FIG. 33D, the protection layer is removed.

Figure 33E:
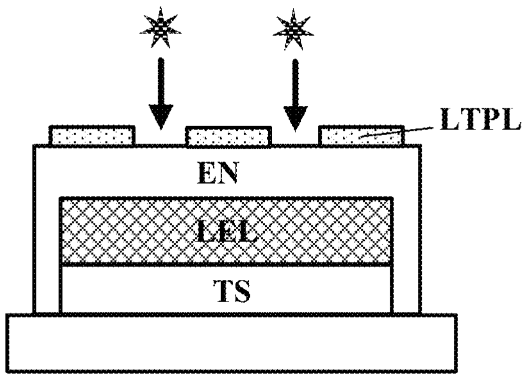

Referring to FIG. 33E, doping of an impurity, e.g., by ion implantation, is performed using the light transmissive inorganic protection layer LTPL as a mask plate. In regions not covered by the light transmissive inorganic protection layer LTPL, the intermediate substrate is subject to the doping from ion implantation.

Figure 33F:
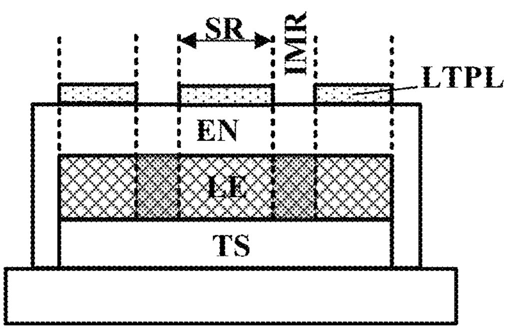

Referring to FIG. 33F, subsequent to the doping, an impurity region IMR and subpixel regions SR are formed in the display substate. The impurity region IMR spaces apart two adjacent subpixel regions. A plurality of light emitting elements LE are thereby formed. The light transmissive inorganic protection layer LTPL is in the subpixel regions SR, and does not extend into the inter-subpixel region ISR.

Figure 33G:
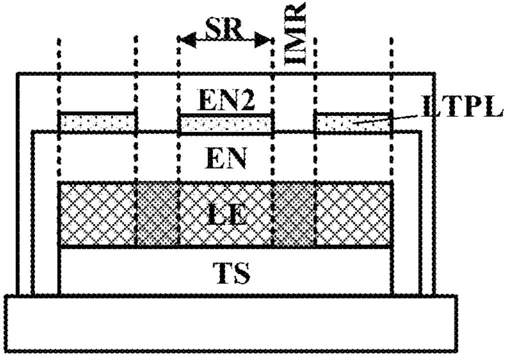

Referring to FIG. 33G, a second encapsulating layer EN2 is formed on a side of the light transmissive inorganic protection layer LTPL and the encapsulating layer EN away from the transistor substrate TS, encapsulating the plurality of light emitting elements LE.

Figure 34:
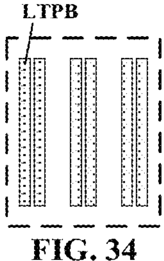
FIG. 34 is a plan view of a display substrate in some embodiments according to the present disclosure.

FIG. 34 is a plan view of a display substrate in some embodiments according to the present disclosure. Referring to FIG. 34, the light transmissive inorganic protection layer in some embodiments includes a plurality of light transmissive inorganic protection blocks LTPB in the subpixel regions.

In another aspect, the present disclosure provides a display apparatus, including the display substrate described herein or fabricated by a method described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc.

In another aspect, the present disclosure provides a method of fabricating a display substrate. In some embodiments, the method includes forming a plurality of initial functional material layers extending at least partially across multiple subpixels; and performing a first impurity doping on the plurality of initial functional material layers to form a plurality of functional material layers comprising a first portion in an inter-subpixel region, and a second portion in subpixel regions. Optionally, the first portion comprises a doped impurity. Optionally, the first portion and the second portion comprise at least one functional material in common. Optionally, a weight percentage of the doped impurity in the first portion is higher than a weight percentage of the doped impurity in the second portion. Optionally, the first portion spaces apart adjacent subpixels. Optionally, the second portion comprises a light emitting layer of a respective subpixel. Optionally, the weight ratio of the doped impurity to the at least one functional material in common in the second portion is substantially zero. Optionally, a weight ratio of the doped impurity to the at least one functional material in common in the first portion is higher than a weight ratio of the doped impurity to the at least one functional material in common in the second portion.

In some embodiments, the method further includes forming an initial anode material layer extending at least partially across multiple subpixels; and performing a second impurity doping on the initial anode material layer to form an anode material layer comprising a first anode portion at least partially in the subpixel regions and a second anode portion at least partially in the inter-subpixel region. Optionally, the first anode portion comprises a doped anode impurity. Optionally, the first anode portion and the second anode portion comprise at least one material in common. Optionally, a weight percentage of the doped anode impurity in the first anode portion is higher than a weight percentage of the doped anode impurity in the second portion. Optionally, a weight ratio of the doped anode impurity to the at least one material in common in the first anode portion is higher than a weight ratio of the doped anode impurity to the at least one material in common in the second anode portion. Optionally, the second anode portion spaces apart adjacent subpixels. Optionally, the first anode portion comprises an anode of the respective subpixel. Optionally, the weight ratio of the doped anode impurity to the at least one material in common in the second anode portion is substantially zero.

In some embodiments, the method further includes forming a pixel definition layer. Optionally, forming the pixel definition layer includes forming a plurality of inter-pixel functional material layers doped with impurities. Optionally, the plurality of inter-pixel functional material layers in the pixel definition layer are incapable of emitting light.

In some embodiments, the method further includes forming a single color light emitting display substrate. Optionally, the method includes performing impurity doping on the plurality of initial functional material layers to form a stacked structure comprising a light emitting layer, a hole transport layer, a hole injection layer, an electron transport layer, and an electron injection layer. Optionally, each of the light emitting layer, the hole transport layer, the hole injection layer, the electron transport layer, and the electron injection layer comprises a portion having the doped impurity.

In some embodiments, the method further includes forming a full-color display substrate. Optionally, the method includes performing impurity doping on the plurality of initial first functional material layers to form a first stacked structure comprising a light emitting layer of a first color, a hole transport layer, a hole injection layer, an electron transport layer, and an electron injection layer; performing impurity doping on the plurality of initial second functional material layers to form a second stacked structure comprising a light emitting layer of a second color, a hole transport layer, a hole injection layer, an electron transport layer, and an electron injection layer; and performing impurity doping on the plurality of initial third functional material layers to form a third stacked structure comprising a light emitting layer of a third color, a hole transport layer, a hole injection layer, an electron transport layer, and an electron injection layer. Optionally, each of the light emitting layer of the first color, the hole transport layer, the hole injection layer, the electron transport layer, and the electron injection layer comprises a portion having the doped impurity. Optionally, each of the light emitting layer of the second color, the hole transport layer, the hole injection layer, the electron transport layer, and the electron injection layer comprises a portion having the doped impurity. Optionally, each of the light emitting layer of the third color, the hole transport layer, the hole injection layer, the electron transport layer, and the electron injection layer comprises a portion having the doped impurity.

In some embodiments, the method further includes forming a tandem light emitting display substrate. Optionally, the method includes performing impurity doping on the plurality of initial first functional material layers to form a stacked structure comprising a first light emitting layer and a second light emitting layer of a same color. Optionally, each of the first light emitting layer and the second light emitting layer comprises a portion having the doped impurity.

In some embodiments, the method further includes forming a white light emitting display substrate. Optionally, the method includes performing impurity doping on the plurality of initial first functional material layers to form a stacked structure comprising a light emitting layer of a first color, a light emitting layer of a second color, and a light emitting layer of a third color. Optionally, each of the light emitting layer of the first color, the light emitting layer of a second color, and the light emitting layer of the third color comprises a portion having the doped impurity.

In some embodiments, the method further includes, prior to performing the first impurity doping, forming an encapsulating layer on a side of the plurality of initial functional material layers away from a base substrate, encapsulating the plurality of initial functional material layers; and forming a light transmissive inorganic protection layer on a side of the encapsulating layer away from the base substrate. Optionally, forming the light transmissive inorganic protection layer comprises forming a plurality of light transmissive inorganic protection blocks. Optionally, a respective light transmissive inorganic protection block of the plurality of light transmissive inorganic protection blocks is in a respective subpixel region. Optionally, the first impurity doping is performed using the plurality of light transmissive inorganic protection blocks as a mask plate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising a plurality of functional material layers extending at least partially across multiple subpixels;

wherein the plurality of functional material layers comprise a first portion in an inter-subpixel region, and a second portion in subpixel regions;

the first portion comprises a doped impurity;

the first portion and the second portion comprise at least one functional material in common;

a weight percentage of the doped impurity in the first portion is higher than a weight percentage of the doped impurity in the second portion;

the first portion is between adjacent subpixels; and the second portion comprises a light emitting layer of a respective subpixel.

2. The display substrate of claim 1, wherein a weight ratio of the doped impurity to the at least one functional material in common in the first portion is higher than a weight ratio of the doped impurity to the at least one functional material in common in the second portion.

3. The display substrate of claim 1, wherein a weight ratio of the doped impurity to the at least one functional material in common in the second portion in at least one of a hole transport layer, a hole injection layer, an electron transport layer, or an electron injection layer is substantially zero.

4. The display substrate of claim 1, further comprising an anode material layer extending at least partially across multiple subpixels;

the anode material layer comprises a first anode portion at least partially in the subpixel regions and a second anode portion at least partially in the inter-subpixel region;

the first anode portion comprises a doped anode impurity;

the first anode portion and the second anode portion comprise at least one material in common;

a weight percentage of the doped anode impurity in the first anode portion is higher than a weight percentage of the doped anode impurity in the second portion;

a weight ratio of the doped anode impurity to the at least one material in common in the first anode portion is higher than a weight ratio of the doped anode impurity to the at least one material in common in the second anode portion;

the second anode portion is between adjacent subpixels; and the first anode portion comprises an anode of the respective subpixel.

5. The display substrate of claim 4, wherein the weight ratio of the doped anode impurity to the at least one material in common in the second anode portion is substantially zero.

6. The display substrate of claim 4, wherein the first anode portion and the second anode portion comprise at least a semiconductor material in common;

the first anode portion has a higher conductivity than a conductivity of the second anode portion; and a difference between a highest occupied molecular orbital level of the second anode portion and a highest occupied molecular orbital level of a functional material layer in direct contact with the second anode portion is greater than a difference between a highest occupied molecular orbital level of the first anode portion and a highest occupied molecular orbital level of the functional material layer in direct contact with the first anode portion.

7. The display substrate of claim 4, wherein the first anode portion and the second anode portion comprise at least a metal oxide material in common.

8. The display substrate of claim 4, wherein an orthographic projection of the second anode portion on a base substrate at least partially overlaps with an orthographic projection of the first portion on the base substrate; and an orthographic projection of the first anode portion on the base substrate at least partially overlaps with an orthographic projection of the second portion on the base substrate.

9. The display substrate of claim 4, wherein the doped impurity or the doped anode impurity comprises at least one of boron, fluorine, argon, phosphorus, hydrogen, helium, neon, nitrogen, arsenic, antimony, aluminum, magnesium, or silicon.

10. The display substrate of claim 1, further comprising a pixel definition layer;

wherein the pixel definition layer comprises a plurality of inter-pixel functional material layers doped with impurities; and the plurality of inter-pixel functional material layers in the pixel definition layer are incapable of emitting light.

11. The display substrate of claim 1, wherein the plurality of functional material layers comprises a stacked structure comprising a light emitting layer, a hole transport layer, a hole injection layer, an electron transport layer, and an electron injection layer; and each of the light emitting layer, the hole transport layer, the hole injection layer, the electron transport layer, and the electron injection layer comprises a portion having the doped impurity.

12. The display substrate of claim 1, comprising a plurality of first functional material layers extending at least partially across multiple subpixels of a first color, a plurality of second functional material layers extending at least partially across multiple subpixels of a second color, and a plurality of third functional material layers extending at least partially across multiple subpixels of a third color;

wherein the plurality of first functional material layers comprises a first stacked structure comprising a light emitting layer of a first color, a hole transport layer, a hole injection layer, an electron transport layer, and an electron injection layer;

each of the light emitting layer of the first color, the hole transport layer, the hole injection layer, the electron transport layer, and the electron injection layer comprises a portion having the doped impurity;

the plurality of second functional material layers comprises a second stacked structure comprising a light emitting layer of a second color, a hole transport layer, a hole injection layer, an electron transport layer, and an electron injection layer;

each of the light emitting layer of the second color, the hole transport layer, the hole injection layer, the electron transport layer, and the electron injection layer comprises a portion having the doped impurity;

the plurality of second functional material layers comprises a third stacked structure comprising a light emitting layer of a third color, a hole transport layer, a hole injection layer, an electron transport layer, and an electron injection layer; and each of the light emitting layer of the third color, the hole transport layer, the hole injection layer, the electron transport layer, and the electron injection layer comprises a portion having the doped impurity.

13. The display substrate of claim 1, wherein the display substrate is a light emitting display substrate;

the plurality of functional material layers comprises a stacked structure comprising a first light emitting layer and a second light emitting layer of a same color; and each of the first light emitting layer and the second light emitting layer comprises a portion having the doped impurity.

14. The display substrate of claim 1, wherein the display substrate is a white light emitting display substrate;

the plurality of functional material layers comprises a stacked structure comprising a light emitting layer of a first color, a light emitting layer of a second color, and a light emitting layer of a third color; and each of the light emitting layer of the first color, the light emitting layer of the second color, and the light emitting layer of the third color comprises a portion having the doped impurity.

15. The display substrate of claim 4, further comprising a second anode material layer on a side of the anode material layer away from the plurality of functional material layers;

wherein the second anode material layer comprise at least a metallic material.

16. The display substrate of claim 1, further comprising:

an encapsulating layer on a side of the plurality of functional material layers away from a base substrate, encapsulating the plurality of functional material layers; and a light transmissive inorganic protection layer on a side of the encapsulating layer away from the base substrate;

wherein the light transmissive inorganic protection layer comprises a plurality of light transmissive inorganic protection blocks; and a respective light transmissive inorganic protection block of the plurality of light transmissive inorganic protection blocks is in a respective subpixel region.

17. A display apparatus, comprising the display substrate of claim 1, and one or more integrated circuits connected to the display substrate.

* * * * *